United States Patent
Kobayashi et al.

[11] Patent Number: 5,822,210
[45] Date of Patent: Oct. 13, 1998

[54] MANUFACTURING MANAGEMENT SYSTEM HAVING SMT LINE

[75] Inventors: Masakazu Kobayashi, Kawasaki, Japan; Shozo Suzuki, Richardson, Tex.; Yoshikuni Kurita, Oyama, Japan

[73] Assignee: Fujitsu Limited, Kanagawa, Japan

[21] Appl. No.: 815,635

[22] Filed: Mar. 13, 1997

[30] Foreign Application Priority Data

Jul. 17, 1996 [JP] Japan .................................. 8-187108

[51] Int. Cl.⁶ .................................................. G06F 19/00
[52] U.S. Cl. ............................... 364/468.28; 364/468.03
[58] Field of Search ............... 364/400, 468.01–468.03, 364/468.05, 468.06, 468.13, 468.14, 468.15–468.17, 468.21, 468.22, 468.28, 488–491; 29/701, 739–741

[56] References Cited

U.S. PATENT DOCUMENTS

| | | | |
|---|---|---|---|
| 5,089,970 | 2/1992 | Lee et al. .............................. | 364/468.02 |
| 5,272,641 | 12/1993 | Ford et al. .......................... | 364/468.03 |
| 5,325,305 | 6/1994 | Rezaei ................................ | 364/468.21 |
| 5,495,417 | 2/1996 | Fuduka et al. ..................... | 364/468.28 |

FOREIGN PATENT DOCUMENTS

| | | |
|---|---|---|
| 4-348853 | 12/1992 | Japan . |
| 6-1412 | 1/1994 | Japan . |
| 7-256532 | 10/1995 | Japan . |

*Primary Examiner*—Reba I. Elmore
*Assistant Examiner*—Steven R. Garland
*Attorney, Agent, or Firm*—Helfgott & Karas, P C.

[57] ABSTRACT

Disclosed is a manufacturing management system for controlling an SMT line to manufacture printed circuit boards the manufacture of which has been designated. A source data management file created by CAD data for a printed circuit board, an inventory parts management file, a cartridge management file and an SMT line information file which includes manufacturing conditions of the SMT manufacturing equipment and equipment arrangement are registered in a database. An SMT set-up support unit creates a set-up instruction manual, which specifies set-up for manufacturing printed circuit boards on the SMT line, by referring to the various files that have been stored in the database. Further, a mounting data creating unit creates mounting data, which are for allowing the mounting machine to mount parts on printed circuit boards, using part setting position addresses of the mounting machine contained in set-up information and part mounting position coordinates contained in the source data management file.

25 Claims, 33 Drawing Sheets

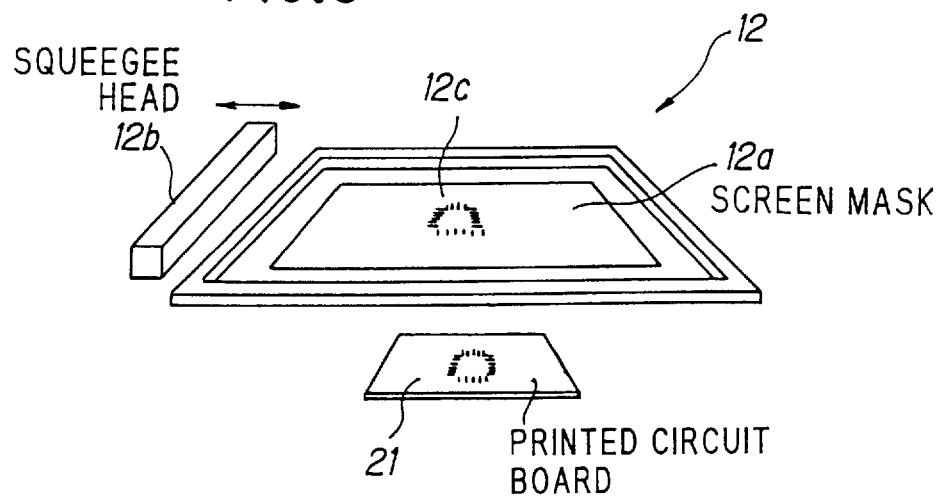
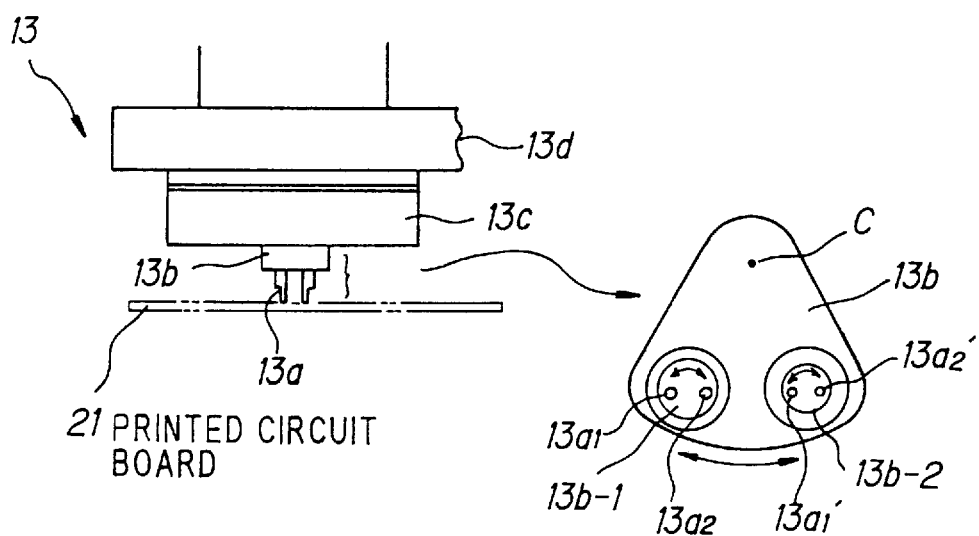

FIG.11

| | |
|---|---|
| SMT LINE INFORMATION FILE | ~111 |
| SMT LINE SET-UP CONDITION LIST FILE | ~112 |
| CARTRIDGE ADJACENCY CONDITION FILE CLASSIFIED BY EQUIPMENT | ~113 |
| SMD DIAGRAM NUMBER MANAGEMENT FILE | ~101 |
| INVENTORY PARTS MANAGEMENT FILE | ~102 |
| PD MANAGEMENT FILE | ~103 |
| CARTRIDGE MANAGEMENT FILE | ~104 |
| UNIT DIAGRAM NUMBER MANAGEMENT FILE | ~105 |
| SOURCE DATA MANAGEMENT FILE | ~106 |
| SMD LIST FILE CLASSIFIED BY UNIT DIAGRAM NUMBER | ~107 |
| ORDER MANAGEMENT FILE | ~108 |

FIG. 15

SMD LIST CLASSIFIED BY UNIT DIAGRAM NUMBER

UNIT DIAGRAM NUMBER  H16B-2505-J100 01A  LN  SMALL TYPE 1  ODD TYPE 1  TRAY 1  MANUAL MOUNTING
NUMBER OF PARTS 218  NUMBER OF PARTS 8  NUMBER OF PARTS 4  NUMBER OF PARTS 1
NUMBER OF TYPES 38  NUMBER OF TYPES 4  NUMBER OF TYPES 4  NUMBER OF TYPES 1
NUMBER OF CH 44  NUMBER OF CH 8  NUMBER OF CH 4  NUMBER OF CH 1

| NO. | SMD DIAGRAM NUMBER | NICKNAME | MOUNTING SIDE | NUMBER USED | CARTRIDGE TYPE | NUMBER OF CH | MOUNTING MACHINE DEMARCATION | TABLE SPEED | INDEXING SPEED | NOZZLE DIAMETER |
|---|---|---|---|---|---|---|---|---|---|---|
| 1 | TAA33-1C1102JX | 2125-RD-1102JX | LN | 20 | CD-0804-N178 | 1 | SMALL1 | 100 | 100 | 1.3 |
| 2 | TAA44-5C3302JT | 3216-CE-3302JT | LN | 15 | CE-0804-N178 | 1 | SMALL1,SMALL2 | 100 | 100 | 1.3 |
| 3 | TA46001-6065 | TE014-SE-TIALS158 | LN | 10 | CE-1612-N330 | 2 | SMALL2,MANUAL | 100 | 90 | 3.7 |
| : | TA46056-7008 | FJ208-HT-MB100374 | LN | 4 | T-1009-X0005 | 1 | ODD1 | 30 | 30 | 20.0 |
| n | TA47009-1002 | NS044-PB-23001 | LN | 1 | | | MANUAL | | | |

| SERIAL NUMBER | UNIT DIAGRAM NUMBER | NUMBER OF MANU- FACTURES | DATE OF DELIVERY | NUMBER OF SMALL MOUNTINGS/NUM- BER OF TYPES | NUMBER OF ODD MOUNTINGS/NUM- BER OF TYPES | NUMBER OF TRAY MOUNTINGS/NUM- BER OF TYPES | NUMBER OF MANUAL MOUNTINGS/NUM- BER OF TYPES | GROUP ID |
|---|---|---|---|---|---|---|---|---|
| DS5467HG | H16B-2505-J100 01A LN | 50 | 3/1 | 10900/44 | 400/8 | 4/4 | 1/1 | A0007 |
| DS5467HG | H16B-1001-J220 04D LN | 25 | 3/1 | 8200/66 | 50/4 | 3/3 | 0/0 | A0007 |
| DS5467HG | H16B-1608-K020 02B LN | 25 | 3/2 | 4750/24 | 125/6 | 10/8 | 5/1 | A0007 |
| ⋮ | ⋮ | ⋮ | ⋮ | ⋮ | ⋮ | ⋮ | ⋮ | ⋮ |

| EXTERNAL SET- UP STARTING DATE AND TIME | EXTERNAL SET- UP COMPLETION DATE AND TIME | TIME REQ- UIRED FOR EXTERNAL SET-UP | INTERNAL SET- UP STARTING DATE AND TIME | INTERNAL SET- UP COMPLETION DATE AND TIME | TIME REQ- UIRED FOR INTERNAL SET-UP | MOUNTING STARTING DATE AND TIME | MOUNTING COMPLETION DATE AND TIME | TIME REQUIRED FOR MOUNTING |
|---|---|---|---|---|---|---|---|---|
| 95.10.12 08:20:30 | 95.10.12 09:20:30 | 01:00:00 | 95.10.12 09:30:00 | 95.10.12 09:45:00 | 00:15:00 | 95.10.12 09:45:00 | 95.10.12 11:15:00 | 01:30:00 |
| ⋮ | ⋮ | ⋮ | ⋮ | ⋮ | ⋮ | ⋮ | ⋮ | ⋮ |

FIG.19

| PART | CARTRIDGE TYPE |
|---|---|
| TAPE PART | C E - 0 8 0 4 - N 1 7 8<br>C↕ E↕ HYPHEN 08↕ 04↕ HYPHEN N↕ 178↕<br>— REEL DIAMETER (mm)<br>— N:STANDARD CARTRIDGE,OTHERWISE NON-STANDARD CARTRIDGE<br>— TAPE PITCH (mm)<br>— TAPE WIDTH (mm)<br>— TAPE TYPE E:EMBOSSED,D;PAPER,J;ADHESIVE PAPER<br>— CARTRIDGE TAPE C:FOR SMALL PARTS MOUNTING, I:FOR ODD PARTS MOUNTING |
| STICK PART | S F - 1 6 X X X X X X<br>SF↕ HYPHEN 16↕ XXXXXX↕<br>— STICK FEEDER NUMBER OR STICK FEEDER NAME<br>— VALUE OBTAINED BY CALCULATING, IN TERMS OF TAPE WIDTH,NUMBER OF CHANNELS OCCUPIED IN ODD PARTS MOUNTING MACHINE<br>— SF FIXED (STICKER FEEDER ABBREVIATION) |
| TRAY PART | T - X X X X X X X X X<br>T↕ HYPHEN XXXXXXXXX↕<br>— TRAY DIAGRAM NUMBER OR TRAY NAME<br>— T FIXED (TRAY ABBREVIATION) |

FIG. 20

| LINE ARRANGEMENT | SCREEN PRINTER | BONDING AGENT COATING MACHINE | SMALL PARTS MOUNTING MACHINE | ODD PARTS MOUNTING MACHINE | REFLOW OVEN |
|---|---|---|---|---|---|
| ABBREVIATION | S 1 | G 1 | M 1 | I 1 | R 1 |
| DETAILS OF MANUFACTURING CONDITIONS | PRINTING CONDITIONS (1) SQUEEGEE SPEED 25mm PRINTING PRESSURE 2kg GAP 0.2mm PLATE SEPARATION 0.5mm MASK CLEANING EVERY 10 BOARDS | NOZZLE COMBINATION (1) HEAD 1  0.2W HEAD 2  0.3W HEAD 3  0.5S COATING PRESSURE 100% | NOZZLE COMBINATION (1) NOZZLE 1  0.7mm NOZZLE 2  1.3mm NOZZLE 3  2.5mm | NOZZLE COMBINATION (1) NOZZLE 1  3.5 NOZZLE 2  5.0mm NOZZLE 3  10.0mm NOZZLE 4  20.0mm NOZZLE 5  30.0mm | REFLOW CONDITIONS (1) PH1 TEMPERATURE 180° PH2 TEMPERATURE 150° PH3 TEMPERATURE 170° REFLOW TEMPERATURE 250° CONVEYOR SPEED 15mm |
| | PRINTING CONDITIONS (2) SQUEEGEE SPEED 15mm PRINTING PRESSURE 1.0kg GAP 0.1mm PLATE SEPARATION 0.2mm MASK CLEANING EVERY 5 BOARDS | NOZZLE COMBINATION (2) HEAD 1  0.3W HEAD 2  0.5S HEAD 3  1.0S COATING PRESSURE 90% | NOZZLE COMBINATION (2) NOZZLE 1  1.0mm NOZZLE 2  2.5mm NOZZLE 3  3.7mm | NOZZLE COMBINATION (2) NOZZLE 1  2.5mm NOZZLE 2  3.5mm NOZZLE 3  7.0mm NOZZLE 4  15.0mm NOZZLE 5  20.0mm | REFLOW CONDITIONS (2) PH1 TEMPERATURE 180° PH2 TEMPERATURE 150° PH3 TEMPERATURE 170° REFLOW TEMPERATURE 250° CONVEYOR SPEED 15mm |
| | PRINTING CONDITIONS (3) ⋮ | NOZZLE COMBINATION (3) ⋮ | NOZZLE COMBINATION (3) ⋮ | NOZZLE COMBINATION (3) ⋮ | REFLOW CONDITIONS (3) ⋮ |
| EQUIPMENT ARRANGEMENT | | | PART SETTING ADDRESS CARTRIDGE TABLE A M1-CTA-001 M1-CTA-002 M1-CTA-003 ⋛ M1-CTA-070 CARTRIDGE TABLE B M1-CTB-001 M1-CTB-002 M1-CTB-003 ⋛ M1-CTB-070 | PART SETTING ADDRESS CARTRIDGE TABLE A I1-CTA-001 I1-CTA-002 I1-CTA-003 ⋛ I1-CTA-035 CARTRIDGE TABLE B I1-CTB-001 I1-CTB-002 I1-CTB-003 ⋛ I1-CTB-035 | TRAY TABLE A I1-TTB-001 I1-TTB-002 I1-TTB-003 ⋛ I1-TTB-010 TRAY TABLE B I1-TTB-001 I1-TTB-002 I1-TTB-003 ⋛ I1-TTB-010 |
| MACHINE SPEED | PRINTING SPEED 45 s/BOARD | BONDING AGENT COATING SPEED CHIP  0.2 s SOP  0.6 s | BONDING AGENT COATING SPEED CHIP  0.3 s SOP  0.5 s | MOUNTING SPEED CHIP  1.5 s SOP  2.5 s QFP  4.0 s | REFLOW SPEED 45 s/BOARD |

FIG. 21

SMT LINE SET-UP CONDITION LIST FILE                                         112

○ ALLOWED    × NOT ALLOWED

| ITEM / CONDITION NO. | PRINTING CONDITION CHANGEOVER | BONDING AGENT COATING NOZZLE CHANGEOVER | SMALL PARTS MOUNTING MACHINE NOZZLE CHANGEOVER | ODD PARTS MOUNTING MACHINE NOZZLE CHANGEOVER | REFLOW CONDITION CHANGEOVER | MAXIMUM NUMBER OF MANUAL MOUNTINGS/BOARDS | FIXED CARTRIDGE RELEASE | MIXING WITH INITIAL PRODUCTS |
|---|---|---|---|---|---|---|---|---|
| SET-UP CONDITION 1 | × | × | × | × | × | 0 | × | × |
| SET-UP CONDITION 2 | ○ | × | × | × | × | 5 | × | ○ |
| SET-UP CONDITION 3 | ○ | × | × | × | ○ | 5 | ○ | ○ |
| SET-UP CONDITION 4 | ○ | ○ | × | × | ○ | 10 | ○ | ○ |
| SET-UP CONDITION 5 | ○ | ○ | ○ | ○ | ○ | 10 | ○ | ○ |

FIG.23A

| TAPE WIDTH | STARTING SET POSITION | 8mm | 12mm | 16mm | 24mm | 32mm | END SET POSITION |
|---|---|---|---|---|---|---|---|
| 8 mm | 1 | 1 | 2 | 2 | 2 | 2 | 70 |
| 12 mm | 1 | 2 | 2 | 2 | 2 | 2 | 70 |
| 16 mm | 1 | 2 | 2 | 2 | 2 | 2 | 70 |
| 24 mm | 2 | 2 | 2 | 2 | 2 | 2 | 69 |
| 32 mm | 2 | 2 | 2 | 2 | 2 | 3 | 69 |

| TAPE WIDTH | STARTING SET POSITION | 8mm | 12mm | 16mm | 24mm | 32mm | 44mm | END SET POSITION |
|---|---|---|---|---|---|---|---|---|
| 8 mm | 1 | 1 | 1 | 1 | 2 | 2 | 2 | 35 |
| 12 mm | 1 | 1 | 1 | 1 | 2 | 2 | 2 | 35 |
| 16 mm | 1 | 1 | 1 | 2 | 2 | 2 | 3 | 35 |
| 24 mm | 1 | 2 | 2 | 1 | 2 | 2 | 3 | 35 |
| 32 mm | 2 | 2 | 2 | 2 | 2 | 3 | 3 | 34 |
| 44 mm | 2 | 2 | 2 | 2 | 2 | 3 | 3 | 34 |

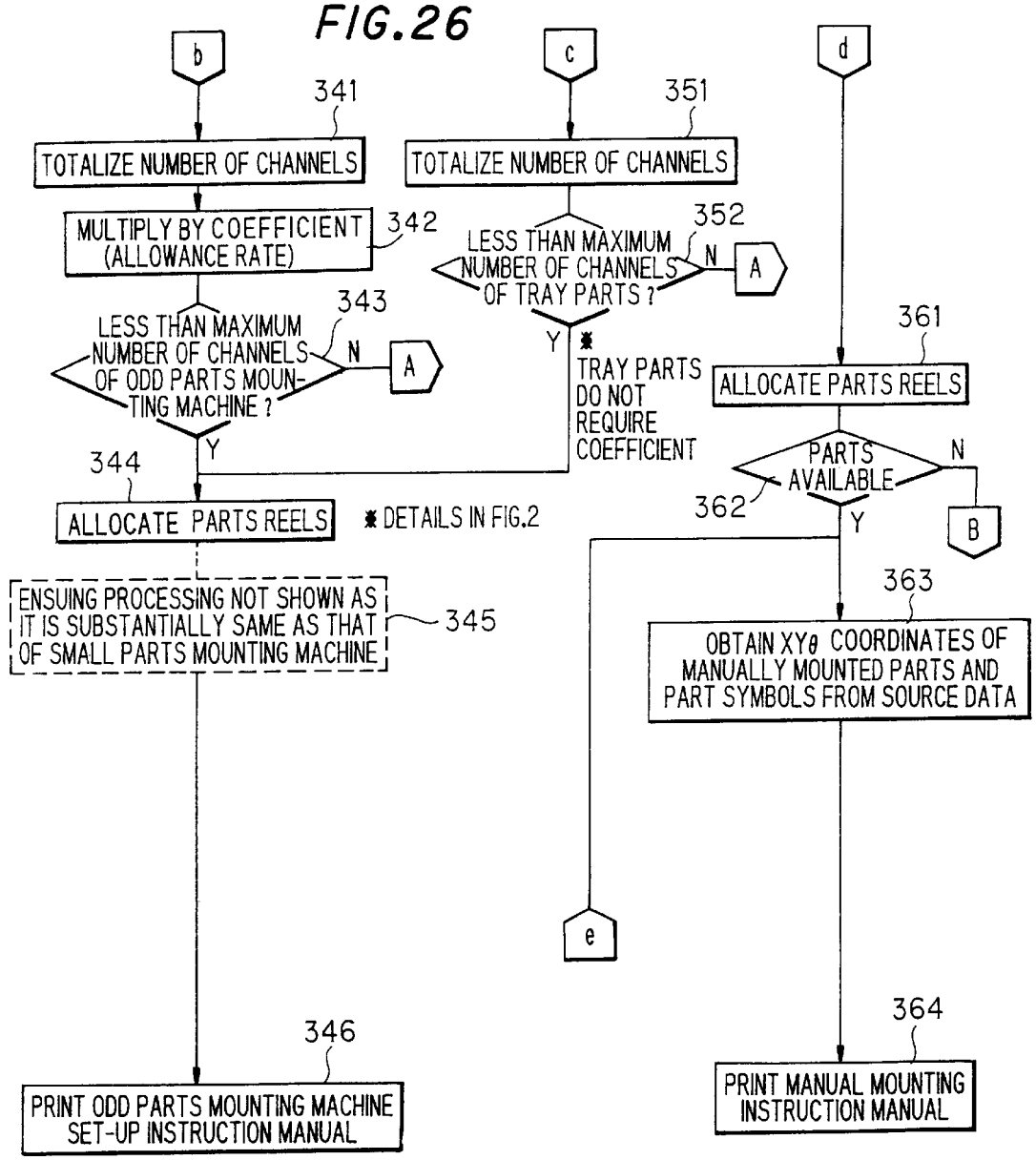

FIG. 27A

EQUIPMENT CONDITIONS OF PRECEDING SET-UP (GROUP ID A0006)

| SERIAL NO. | DIAGRAM NO. | PERFOR-MANCE | PRINTING MACHINE | SMALL PARTS MO-UNTING MACHINE 1 | ODD PARTS MOUN-TING MACHINE 1 | REFLOW OVEN |
|---|---|---|---|---|---|---|
| DS5464 HG 662103 | H16B-1001-J100 01A | ○ | PRINTING CONDITIONS ① | NOZZLE CONDITIONS ① | NOZZLE CONDITIONS ① | REFLOW CONDITIONS ① |
| DS5464 HG 662103 | H16B-1001-J110 01A | ○ | PRINTING CONDITIONS ① | NOZZLE CONDITIONS ① | NOZZLE CONDITIONS ① | REFLOW CONDITIONS ① |
| DS5464 HG 662103 | H16B-1001-J120 02B | ○ | PRINTING CONDITIONS ① | NOZZLE CONDITIONS ① | NOZZLE CONDITIONS ① | REFLOW CONDITIONS ① |

FIG. 27B

EQUIPMENT CONDITIONS OF CURRENT SET-UP (GROUP ID A0007)

| SERIAL NO. | DIAGRAM NO. | PERFOR-MANCE | PRINTING MACHINE | SMALL PARTS MO-UNTING MACHINE 1 | ODD PARTS MOUN-TING MACHINE 1 | REFLOW OVEN |
|---|---|---|---|---|---|---|
| DS7625 HG 554834 | H16B-2H16B-2505-J100 | ○ | PRINTING CONDITIONS ① | NOZZLE CONDITIONS ① | NOZZLE CONDITIONS ① | REFLOW CONDITIONS ① |
| DS8964 HG 824703 | H16B-4H16B-4027-J220 | ○ | PRINTING CONDITIONS ② | NOZZLE CONDITIONS ② | NOZZLE CONDITIONS ② | REFLOW CONDITIONS ② |
| DS2840 HG 110842 | H16B-1H16B-1608-K020 | × | UNDECIDED | UNDECIDED | UNDECIDED | UNDECIDED |
| DETAILS OF EQUIPMENT CONDITIONS | | | PRINTING CONDITION ① <br> SQUEEGEE SPEED 25mm <br> PRINTING PRESSURE 2kg <br> GAP 0.2mm <br> PLATE SEPARATION 0.5mm <br> MASK CLEANING EVERY 10 BOARDS <br><br> PRINTING CONDITION ② <br> SQUEEGEE SPEED 15mm <br> PRINTING PRESSURE 1.0kg <br> GAP 0.1mm <br> PLATE SEPARATION 0.2mm <br> MASK CLEANING EVERY 5 BOARDS | NOZZLE COMBINATION ① <br> NOZZLE 1  0.7 mm <br> NOZZLE 2  1.3 mm <br> NOZZLE 3  2.5 mm | NOZZLE COMBINATION ① <br> NOZZLE 1   3.5 <br> NOZZLE 2   5.0 mm <br> NOZZLE 3  10.0 mm <br> NOZZLE 4  20.0 mm <br> NOZZLE 5  30.0 mm <br><br> NOZZLE COMBINATION ② <br> NOZZLE 1   2.5 mm <br> NOZZLE 2   3.5 mm <br> NOZZLE 3   7.0 mm <br> NOZZLE 4  15.0 mm <br> NOZZLE 5  20.0 mm | REFLOW CONDITION ① <br> PH1 TEMPERATURE 180° <br> PH2 TEMPERATURE 150° <br> PH3 TEMPERATURE 170° <br> REFLOW TEMPERATURE 250° <br> CONVEYOR SPEED 0.7m <br><br> REFLOW CONDITION ② <br> PH1 TEMPERATURE 180° <br> PH2 TEMPERATURE 150° <br> PH3 TEMPERATURE 170° <br> REFLOW TEMPERATURE 250° <br> CONVEYOR SPEED 0.9m |

FIG.28

SET-UP INSTRUCTIONS FOR SMALL PARTS MOUNTING MACHINE 1

| NEW ADDRESS | SMD DIAGRAM NO. | PART NICKNAME | PD NAME | REEL ID | CARTRIDGE ID | OLD LOCATION VALUE | NUMBER OF REMAINING PARTS | NUMBER OF PARTS USED |
|---|---|---|---|---|---|---|---|---|
| M1-CTA-001 | TAA33-1C1001FX | 2125 CE-1C1001FX | C 2125 CE | ER3610019 | C01101 | M1-CTB-006 | 136 | 136 |
| M1-CTA-002 | | | | ER1CA0068 | C08213 | C08213 | 1342 | 1342 |
| M1-CTA-003 | TA46001-6065 | TE016 SE-T1AS158 | IC TE016 SE | ER1CA0069 | C03107 | RS02-4-026 | 5000 | 1522 |
| M1-CTA-004 | | | | ER1CA0030 | C06307 | M1-CTB-058 | 120 | 60 |
| M1-CTA-005 | E76L-0024-0440#LS74 | M0020 SE-LS74A | IC M0020 SE | ER1CA0042 | C08112 | M1-CTB-024 | 110 | 30 |
| M1-CTA-046 | TA46005-3001 | TE024 SE-CS440 | IC TE024 SE | ER1CA0094 | C07232 | C07232 | 30 | 30 |

SET-UP INSTRUCTIONS FOR ODD PARTS MOUNTING MACHINE 1

| NEW ADDRESS | SMD DIAGRAM NO. | PART NICKNAME | PD NAME | REEL ID | CARTRIDGE ID | OLD LOCATION VALUE | NUMBER OF REMAINING PARTS AT TIME OF ALLOCATION | NUMBER OF PARTS USED |
|---|---|---|---|---|---|---|---|---|
| I1-CTA-001 | TA46001-6065 | TE024 SE-T1AS158 | IC TE024 SE | ER1CA0042 | C08208 | C08208 | 122 | 100 |
| I1-CTA-002 | | | | | | | | |
| I1-CTA-003 | TA46002-1002 | TE024 PE-TIPLC18 | IC TE024 PE | | C03107 | FREE | 100 | 50 |
| I1-CTA-004 | | | | | | | | |
| I1-CTA-005 | TA46004-1009 | FJ028 SE-MB3867GC | IC FJ028 SE | | C06307 | FREE | 25 | 25 |
| I1-CTA-006 | | | | | | | | |
| I1-CTA-007 | E76L-0024-0440#LS74 | M0028 SE-LS74A | IC M0028 SE | | C08112 | I1-CTB-024 | 110 | 25 |
| I1-CTA-046 | TA46005-3001 | TE024 SE-CS440 | IC TE024 SE | ER1CA0094 | C07232 | C07232 | 500 | 25 |
| I1-TTA-100 | TA56001-2005 | FJ3202QH-CG607 | QFP FJ3202QH | TRAY | | FREE | 25 | 25 |
| I1-TTA-101 | TA56002-3002 | FJ3202QH-CG608 | QFP FJ3202QH | TRAY | | FREE | 25 | 25 |

FIG. 29

| MANUAL MOUNTING INSTRUCTION MANUAL | | UNIT DIAGRAM NO. (HI6B-2831-J210) | NUMBER OF VERSIONS SAVED(01) | TOTAL NUMBER OF VERSIONS (02A) | NUMBER OF Z VERSIONS (02-04) | | | | | | | |
|---|---|---|---|---|---|---|---|---|---|---|---|---|
| NO. | PART SYMBOL | SMD DIAGRAM NO. | REEL ID | NICKNAME | PD NAME | X | Y | θ | SIDE | BLOCK NO. | NUMBER OF REMAINING PARTS | NUMBER OF PARTS USED |
| 1 | R0001 | TAA33-1C1002JXAT | ... | FJ024 | SE-2B103JT | −23.45 | 15.63 | 90.00 | LN | 1 | 1 | 1 |
| 2 | R0002 | E76L-0302-0001##E1V1R0MT | ... | TE020 | SE-E1V1R0MT | −23.45 | 18.17 | 90.00 | LN | 1 | 2 | 2 |
| 2 | R0003 | E76L-0302-0001##E1V1R0MT | ... | TE020 | SE-E1V1R0MT | −23.45 | 28.24 | 90.00 | LN | 1 | − | − |
| 3 | 1C001 | TA46005-3064F1 | ... | FJ256 | QT-MB86402F | −90.00 | 90.00 | 180.00 | LN | 1 | 1 | 1 |

122

MANUFACTURING MANAGEMENT SYSTEM HAVING SMT LINE

BACKGROUND OF THE INVENTION

This invention relates to a manufacturing management system for manufacturing a printing circuit board by an SMT line. More particularly, the invention relates to a manufacturing management system having a set-up support unit for performing set-up in a highly efficient manner.

In a manufacturing management system, a manufacturing order is prepared to accommodate the delivery time of the manufactured article, a delivery order and an assembly order are prepared in accordance with the manufacturing order, parts are delivered from an automated warehouse in accordance with the delivery order and the delivered parts are conveyed to an assembly line that makes use of SMT (surface mount technology). The parts are assembled on this assembly line in accordance with the assembly order.

FIG. 37 is a diagram for describing the general features of an example of an assembly line (namely an SMT line). FIG. 37 illustrates the principal portion of an assembly line for manufacturing printed circuit boards. A printed circuit board 200 prior to the mounting of parts undergoes warehousing management by a board warehousing management unit 202 and is then accommodated on a storage shelf 204a. Parts such as semiconductor integrated circuits and various electronic circuit components to be mounted on the board are of, e.g., 20 to 50 types, and there are about 100 to 300 of these parts per printed board, though this differs depending upon such factors as the scale of the circuitry.

These parts are attached to a tape at equal intervals according to each type, after which the tape is wound upon a reel 201. The parts are eventually supplied from the tape to a small parts mounting machine. A reel ID (identification information) is assigned to the reel 201, the reel ID is printed in the form of a bar code that is then affixed to the reel and the reel is accommodated in a reel stocker 204b. The warehousing and delivery of the reel are managed by a warehousing management unit 203.

The parts are supplied from the reel 201 to the small parts mounting machine by manually loading the reel 201 in a cartridge 205 and placing the cartridge in a prescribed channel of a cartridge table 208. A cartridge ID (identification information) is assigned to the cartridge 205, the cartridge ID is printed in the form of a bar code that is then affixed to the cartridge and the cartridge is accommodated in a cartridge stocker 204c. The warehousing and delivery of the cartridge are managed by the warehousing management unit 203.

The operator has the reel 201 conforming to the printed board to be assembled delivered from the reel stocker 204b, extracts an empty cartridge from the cartridge stocker 204c (there are also cases where the desired reel has already been mounted in the cartridge) and mounts the reel in the cartridge. A correlating unit 206 establishes correspondence between the reel ID and the cartridge ID and enters the correspondence into an automatic organizing unit 211. The automatic organizing unit 211 decides the mounting channel of each cartridge 205 and the operator places the cartridge in this mounting channel. Meanwhile, the printed circuit boards 200 are supplied from a board supply unit 210 to the assembly line and are successively conveyed thereby.

Following the board supply unit 210 and the automatic organizing unit 211, the assembly line has, in the order mentioned, a screen printer 212, a bonding agent coating machine 213, small parts mounting machines 214, 215, a mounting machine 216 for oddly shaped parts, a reflow oven 217, a washing machine 218, a curing oven 219, external appearance inspection units 220, 221 and a manual correction station 222. The printed circuit board 200 is conveyed by a self-propelled vehicle 209 controlled by a conveyance controller 223.

Accordingly, solder paste is printed on the printed circuit board 200 by the screen printer 212 at portions that are to be soldered, after which small parts such as standardized surface mounted parts are mounted on the printed circuit board 200 at predetermined positions by the small parts mounting machines 214, 215. Large parts are mounted on the printed circuit board 200 at predetermined positions by means of the mounting machine 216 for oddly shaped parts. Heating is applied by infrared heating or by high-temperature inert gas at the reflow oven 217, where reflow soldering is performed in one batch. After a curing treatment is carried out, the external appearance inspection units 220, 221 perform an inspection to determine whether the parts have been mounted normally and whether the parts have been soldered normally. Any faulty locations are corrected by the operator at the manual correction station 222.

When the scheduled delivery date based upon the manufacturing order arrives in the assembling of the printed circuit board, it is inventoried that there are sufficient parts used for manufacturing the printed circuit board ordered by the manufacturing order and if there are, the parts are delivered from the warehouse. Further, in a case where the parts delivered from the warehouse are introduced to the assembly line, grouping is carried out so as to reduce the number of set-up operations with regard to automatic mounting machines such as the small parts mounting machines 214, 215 and the mounting machine 216 for oddly shaped parts.

It goes without saying that the above-mentioned assembly line (SMT mounting line) requires printing condition information for the solder past printer, mounting data for the automatic mounting machines and reflow condition data for the reflow oven. Accordingly, in case of a printed circuit board manufactured for the first time, it is required to create these data before the printed circuit board is manufactured. Furthermore, the various set-up operations for a piece of each equipment constituting the SM line must be prepared in accordance with the data created. For example, in the case of the small part mounting machines, mounting data are interchanged, parts such as tool reels, tray parts and the like are set at the positions (channels) decided for them and nozzles are switched.

(1) Problems in terms of creating NC data

The data necessary for each item of equipment shall be referred to collectively as "NC data." Though such NC data usually are created from CAD data, certain problems are arise. The CAD data contains only part symbols, part diagram numbers, the X and Y coordinates of part mounting position, mounting angles and mounting surfaces (i.e., whether parts are to be mounted on the top or bottom side of a printed circuit board). Accordingly, printing conditions, reflow conditions, the distribution of parts to the small part mounting machines and the machine for mounting odd parts and the deciding of part setting positions at the small part mounting machines and the machine for mounting odd parts must be performed manually. In addition, since part mounting angle in the CAD data (i.e., the angle through which a part registered in a parts library is rotated to dispose the part on the board) and the mounting angle in the NC data (the angle through which the nozzle of a mounting machine rotates a part to place the part on the board after the nozzle has attracted the part) differ, a correction is required. The angle correcting value also differs depending upon the equipment, the part setting direction and the directions of the parts on the tape. Furthermore, in a case where parts are mounted upon performing image processing, image processing data regarding the parts must be created separately of the NC data.

The above-mentioned manual creation of NC data is extremely complicated and can tax one's nerves especially when mistakes are made. Moreover, the NC data so painstakingly created has the following drawbacks:

1) The part setting positions are not ideal.
2) Whether there will be enough parts to manufacture a predetermined number of circuit boards is not known.
3) The NC data are created only in units of boards of a single type, and simultaneous set-up manufacturing (grouping manufacture) of a plurality of boards cannot be carried out.
4) Mounting time associated with the small parts mounting machines and mounting time associated with the machine for mounting odd parts are not in balance.

(2) Problems in terms of set-up operation

When the NC data have been created, the actual mounting operation is next but is preceded by the need for a set-up operation. This involves the following problems:

1) Parts are collected from a parts setting table but where the parts are located and the numbers thereof are unknown. The number necessary is determined by calculation from the number of boards manufactured.
2) It is not known in which cartridges the collected parts (parts reels) are to be mounted nor where the cartridges are located. Whether there are enough cartridges also is unknown.
3) The information affixed to a part or part reel does not contain the part diagram number in the parts setting table.
4) In a case where an empty cartridge, namely a cartridge in which a parts reel has not been mounted, does not exist, it is necessary to exchange the parts reel loaded in a cartridge with a required parts reel. But, it is difficult to determine a cartridge of which parts reel is exchanged.
5) After a cartridge in which a parts reel has been mounted is set on a cartridge table in the manner prescribed by the parts setting table, the parts reel is verified by reading reel ID visually. However, since the reel ID cannot be seen when the cartridge is in the set state, the cartridge must be detached to confirm the ID. In addition, it goes without saying that printing conditions and reflow conditions must be determined anew for a board that is being fabricated for the first time (referred to below as an "initial product"). However, board size, pattern pitch and the like are decided based upon past experience.

(3) Problems encountered after start of mounting

The following problems arise after the start of the mounting operation:

1) Parts run out during the mounting operation. At such time parts are searched for and replaced. In a case where one goes to the warehouse to acquire the parts cannot find them anywhere, there are occasions where the manufacturing operation is suspended.
2) Upon completion of the mounting of parts on one board, whether the mounting has been performed correctly is checked based on a parts mounting diagram and parts list. To accomplish this, the line is stopped for about 0.5–1.5 hr.
3) If the mounting data and image processing data are erroneous, mounting is started after performing a manual correction.
4) Parts placed by hand are placed while observing a parts mounting diagram and parts list.

(4) Problems encountered after mounting is completed

The operator sets down a manufacturing performance report on paper every day and totalizes these reports. The performance information includes manufacturing orders, manufactured board diagram numbers, manufactured board type, number of manufactured boards, number of mountings classified by mounting machine, set-up time, mounting time and facility activity rate, etc.

Thus, the conventional assembly line (SMT mounting line) involves a series of operations that wears down one's nerves from creation of the NC data to totalization of the manufacturing performance reports. If the line were merely a mass production line the problems would be manageable. However, when production is small-lot, large-variety production in which the average number of boards manufactured is 10 to 30 and the articles to be fabricated for the first time make up one-third of the total, the line activity rate is on the order of 10–30%. As a result, the costly line is not used efficiently and the operator is incapable of raising output.

SUMMARY OF THE INVENTION

Accordingly, an object of the present invention is to make it possible to create NC data and set-up information automatically, even with an SMT mounting line in which equipment specifications and arrangements differ, by putting various information relating to the SMT mounting line in the form of a database.

Another object of the present invention is to automatically create NC data and set-up information, classified by type of equipment, from database information while taking into account the number of parts in inventory and the location of the parts, thereby making it possible to perform set-up efficiently.

Still another object of the present invention is to perform set-up without an interruption in the availability of parts.

A further object of the present invention is to create a manual mounting instruction manual (reel IDs, part symbols, part diagram numbers, mounting positions, etc.), thereby making it possible to perform manual mounting in an efficient manner.

A further object of the present invention is to reduce the number of set-up operations and raise the activity rate of the SMT mounting line by grouping manufactured circuit boards.

A further object of the present invention is to make it possible to automatically totalize production performance.

A further object of the present invention is to raise the activity rate of an SMT line and achieve small-lot, large-variety production in an effective manner.

According to the present invention, the foregoing objects are attained by providing a manufacturing management system for controlling an SMT line to manufacture printed circuit boards the manufacture of which has been designated, the system comprising an SMT line composed of a group of SMT manufacturing equipment such as a screen printer, an automatic mounting machine for automatically mounting parts on printed circuit boards and a reflow oven, a reel stocker for storing parts reels, a cartridge stocker for storing cartridges, a database for storing a source data management file created by CAD data for a printed circuit board, an inventory parts management file, a cartridge management file and an SMT line information file which includes manufacturing conditions of the SMT manufacturing equipment and equipment arrangement, an SMT set-up support unit for creating a set-up instruction manual, which specifies set-up for manufacturing printed circuit boards on the SMT line, by referring to the SMT line information file that has been stored in the database, and a mounting data creating unit for creating mounting data, which are for allowing the mounting machine to mount parts on printed circuit boards, using part setting position addresses of the mounting machine contained in set-up information and part mounting position coordinates contained in the source data management file.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 3 is a diagram illustrating the principles of a screen printer;

FIG. 4 is a diagram illustrating the principles of a bonding agent coating machine;

FIG. 11 is a diagram for describing a data file registered in a database;

FIG. 15 is a diagram for describing an SMD list file classified by unit diagram number;

FIG. 16 is an example of order management file;

FIG. 19 is a diagram for describing cartridge type;

FIG. 20 is a diagram for describing an SMT line information file;

FIG. 21 is a diagram for describing an SMT line set-up condition list file;

FIG. 23A is a diagram for describing a cartridge adjacency condition file of a small parts mounting machine, and FIG. 23B is a diagram for describing a cartridge adjacency condition file of an odd parts mounting machine;

FIG. 26 is a third flowchart of processing for creating a set-up instruction manual by a set-up support unit;

FIGS. 27A and 27B are diagrams for describing an SMT line set-up instruction manual;

FIG. 28 is a diagram for describing a set-up instruction manual classified by mounting machine;

FIG. 29 is a diagram for describing an instruction manual for manual mounting;

DESCRIPTION OF THE PREFERRED EMBODIMENTS (A) Overview of invention (a) General configuration of manufacturing management system FIG. 1 is a diagram illustrating the general configuration of the inventive manufacturing management system for manufacturing printed circuit boards the manufacture of which is instructed by controlling an SMT line. Numeral 1 denotes the SMT line, which is composed of a group of SMT manufacturing equipment such as a screen printer 12, automatic mounting machines 14, 15 for automatically mounting parts on printed circuit boards, and a reflow oven 16. The system further includes a reel stocker 2 for storing parts reels, a cartridge stocker 3 for storing cartridges, and a server 31 equipped with a database 31a. The database 31a is for storing various files such as database source data management file 106 created by CAD data for a printed circuit board, an inventory parts management file 102, a cartridge management file 104 and an SMT line information file 111 which includes manufacturing conditions of the SMT manufacturing equipment and equipment construction. A set-up support unit 38a creates a set-up instruction manual 121 and a manual mounting instruction manual 122. Shown at 38b is a mounting data creating unit.

Figure 1:
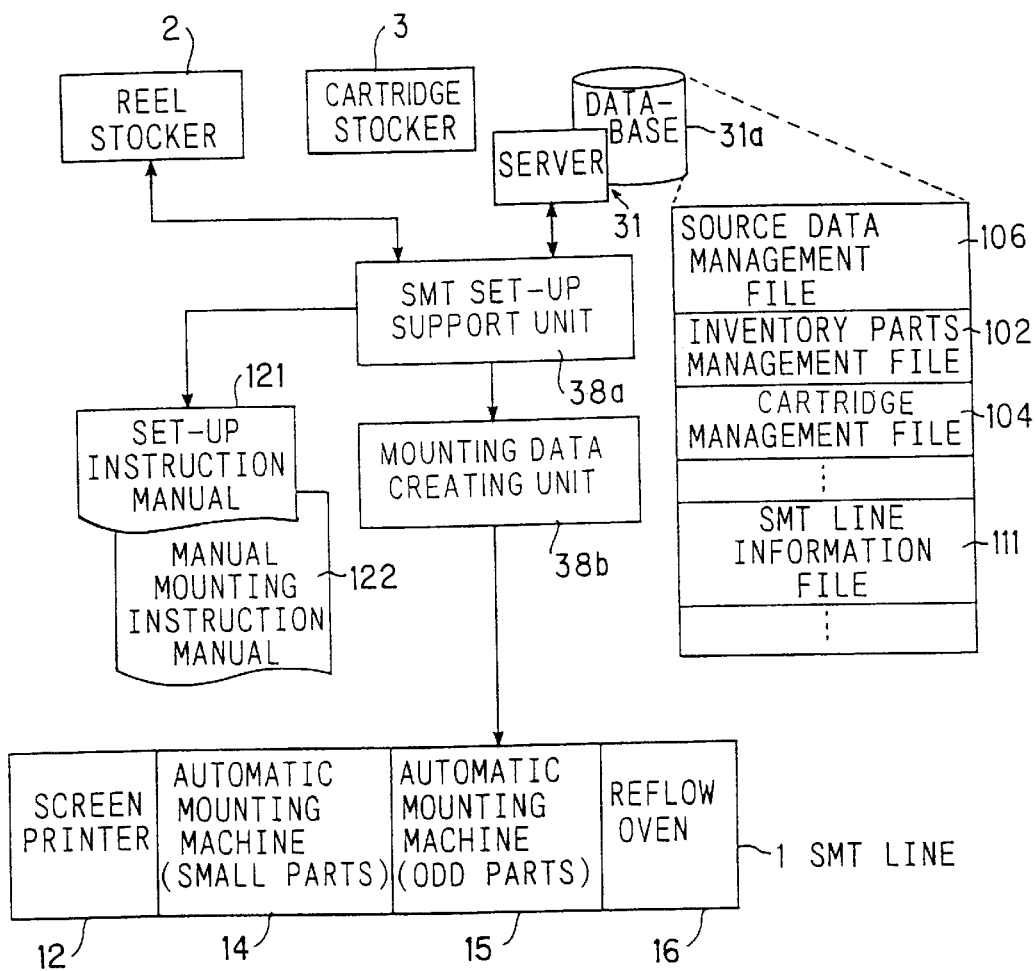
FIG. 1 is an explanatory view giving an overview of the present invention.

The set-up support unit 38a creates the set-up instruction manual 121 by referring to the files stored in the database 31a, and the mounting data creating unit 38b creates mounting data (NC data), which are for allowing the mounting machine to mount parts on printed circuit boards, using part setting position addresses in the mounting machine contained in set-up information and part mounting position coordinates contained in the source data management file 106. This makes it possible to create NC data and set-up information automatically, even with an SMT mounting line in which equipment specifications and arrangements differ, by putting various information relating to the SMT mounting line in the form of a database. Set-up can be performed efficiently and mounting data conforming to the set-up information can be created.

Parts data are registered in the database 31a for each type of part. The parts data include mounting machine demarcations indicating which mounting machines are to mount the parts, cartridge-type information specifying the number-of channels occupied by parts reels at a mounting machine, the type of cartridge on which a parts reel is mounted and the tape width of the parts reel, and sorting information used when deciding the order in which parts are placed at a mounting machine. The set-up support unit 38a (1) obtains the part diagram numbers of parts necessary for manufacturing a printed circuit board whose manufacture has been specified, as well as the number of parts required, by referring to the source data management file 106; (2) distributes the parts according to mounting machine by referring to the mounting machine demarcations in the parts data; (3) checks to see whether a mounting machine has the channels necessary for the setting of parts reels of all types of distributed parts, this being performed by taking into account the total number of channels specified by the equipment arrangement contained in the SMT line information file 111 as well as the number of channels occupied by each type of part distributed to the mounting machine, and checks to determine whether there are more parts than necessary for each type of part by referring to the inventory parts management file 102; (4) searches parts reels on which parts have been mounted if the mounting machine has the channels necessary for setting the parts reels of all types of distributed parts and the number of parts is greater than that necessary for each type of part; (5) decides the order of placement of parts reels mounted on the mounting machine by referring to the sorting information of each type of part included in the above-mentioned parts data; (6) then decides the placement positions (channels) of cartridges in which parts reels are loaded in the order of placement; and (7) creates the set-up instruction manual 121, classified by mounting machine, that includes the cartridge placement position information, part-type identification information, reel ID and cartridge ID.

By adopting the approach described above, NC data (mounting data) and set-up information can be created automatically from the database information by taking the number of parts in inventory and their locations into consideration, and set-up can be performed efficiently. In addition, set-up can be performed without an interruption in the flow of parts.

When batch manufacture of printed circuit boards of a plurality of types has been specified by grouping, the SMT set-up support unit 38a creates the set-up instruction manual 121 in such a manner that the specified plural types of printed circuit boards can be manufactured by a single set-up operation, and the mounting data creating unit 38b creates the mounting data (NC data), which allow the mounting machines to mount the parts on each printed circuit board, using the part setting position addresses contained in the set-up information and part mounting position coordinates on each printed circuit board. By thus grouping the manufactured boards, the number of set-up operations is reduced and the activity rate of the SMT mounting line can be improved.

Further, the set-up support unit 38a creates the manual mounting instruction manual 122 with regard to parts for which manual mounting has been specified by the mounting machine demarcations. The instruction manual 122 includes, for each part, the part diagram number, part symbol, part mounting position coordinates on the printed circuit board, part mounting orientation and the side of the board on which the part is to be mounted. Accordingly, even if mounting is performed manually, the manual operation can be performed correctly by referring to the manual mounting instruction manual 122. This makes it possible to perform the operation efficiently.

Further, the set-up support unit 38a registers manufacturing performance, such as the number of parts mounted by each mounting machine, the number of manual mountings, the time required for set-up and the time required for mounting, in a manufacturing order file when printed circuit boards are manufactured, totalizes the recorded contents and outputs the manufacturing performance. As a result, production performance can be totalized automatically and the totalization data can be acquired with ease.

Thus, it is possible to raise the activity rate of the SMT line and to achieve small-lot, large-variety production in an effective manner.

(b) Overview of procedure for automatically creating NC data and set-up information In this invention, NC data and set-up information are automatically created for each item of equipment by managing (1) parts in inventory, (2) parts reels and cartridges, and (3) SMT line configuration and equipment conditions.

[First Stage]

(1) Data necessary for mounting a surface mount device (referred to as an "SMD" below), such as all SMD diagram numbers, part symbols, X and Y coordinates and part orientations θ, are extracted from CAD information of a predetermined unit diagram number, and these data are adopted as "source data." The unit diagram number is a number which specifies the printed circuit board.

(2) The source data are subdivided according to mounting surface (top or bottom side of the board).

(3) All parts included in the source data are distributed according to mounting machine in conformity with the equipment arrangement of the SMT line, and an SMD list file is created classified by unit diagram number. This SMD list file is created classified by unit diagram number includes the SMD diagram number, nickname, mounting surface, number used (number of parts), cartridge type, necessary number of channels, etc., for each part distributed according to mounting machine.

(4) Part setting positions (channels in a cartridge table) are decided according to mounting machine in conformity with mounting machine characteristics (such as maximum number of part setting channels of the cartridge table) and part specifications (such as the tape width of the taped parts).

(5) Mounting angle is corrected upon taking into account the mounting machine characteristics, part setting position and part characteristics (such as the orientation of a taped part).

The above-described operation is executed for all printed circuit boards to be manufactured.

[Second Stage]

(1) Boards to be manufactured are grouped from the manufacturing order and a plurality of boards (or a single board) constituting each group are selected. Each group is assigned a group ID number.

(2) The SMD diagram numbers of parts mounted in an entire group and the number of mountings per SMD diagram number are totalized according to mounting machine using the source data.

(3) A provisional check is made to determine whether all parts to be mounted can be set per each mounting machine. If setting is not possible, then grouping is performed again.

(4) A check is made to see whether there are enough parts in inventory. If there are not enough parts, the SMD diagram number and the number of inadequate parts are displayed.

(5) A check is made to see whether there are enough cartridges for attaching parts. If there are not enough cartridges, the cartridge type and the number of inadequate cartridges are displayed.

(6) If the results of the checks made at (3)–(5) are acceptable, then a set-up designation list (part setting positions, parts reels used, cartridges, etc.) for each group is created.

[Third Stage]

(1) NC data according to mounting machine are created from the part setting information (part setting channels, etc.), which has been created in the second stage, and from the source data, etc.

[Fourth Stage]

(1) Actual set-up is carried out based upon the set-up designation list.

(2) Confirmation of mounting of a cartridge at a part setting position is performed by reading the cartridge ID affixed to the cartridge.

(3) The NC data created in the third stage are transmitted to each item of equipment on the SMT line.

After set-up is completed in the manner described above, the printed circuit boards introduced to the SMT line undergo solder printing, application of bonding agent, mounting of chips, mounting of oddly shaped parts, reflow, manual mounting and inspection, etc.

(B) SMT mounting line and manufacturing management system

Figure 2:
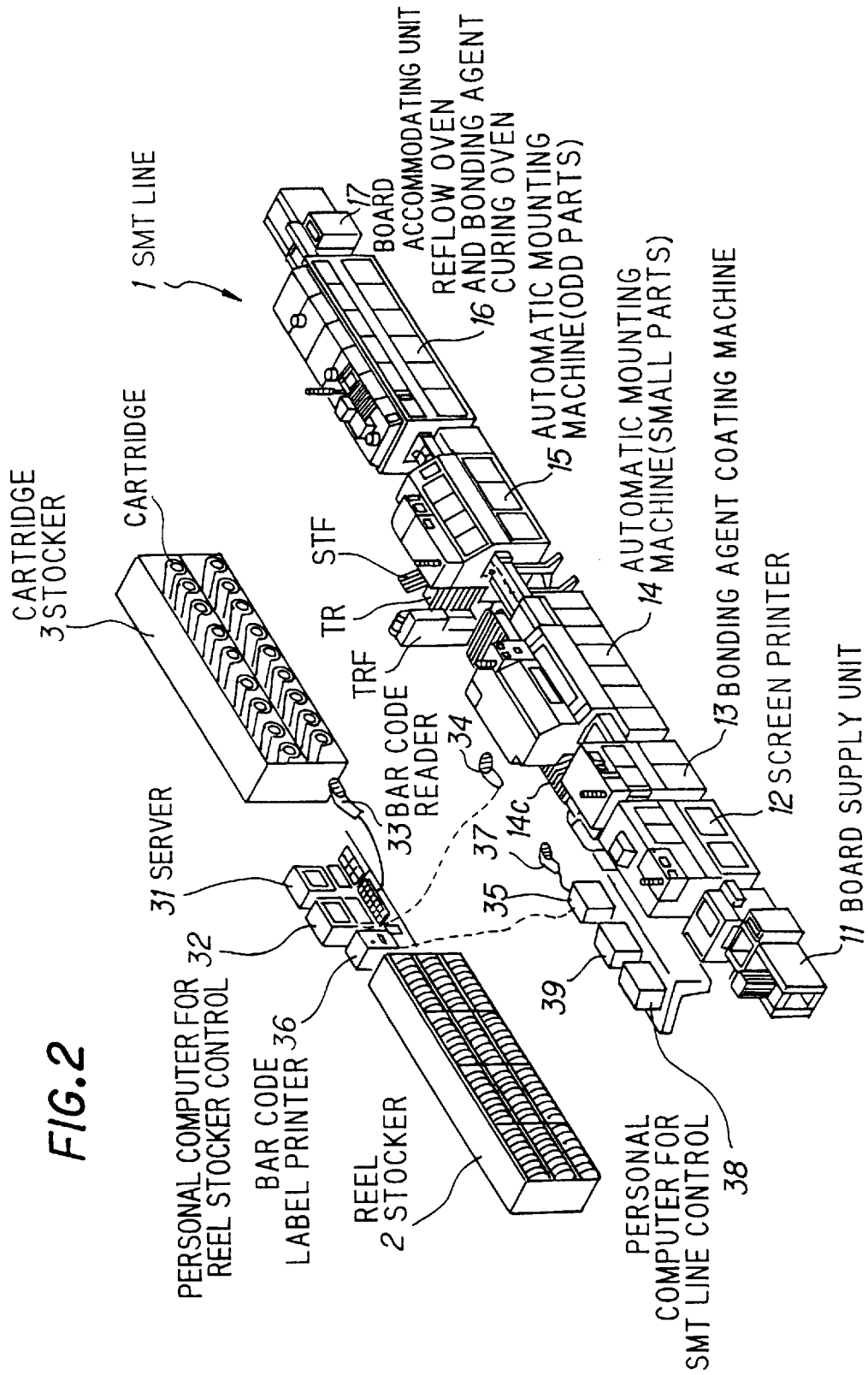
FIG. 2 is a perspective view illustrating the overall configuration of an SMT line and manufacturing management system.

FIG. 2 is a diagram showing the overall configuration of an SMT mounting line and manufacturing management system. Shown in FIG. 2 are the SMT mounting line 1, the reel stocker 2, the cartridge stocker 3 and such components as a server, personal computers and bar code readers 31–39 constructing the manufacturing management system.

(a) SMT mounting line (a-1) Overall configuration

The SMT mounting line 1 includes a board supply unit 11 for supplying printed circuit boards, a screen printer 12 for printing solder paste on soldering positions of the printed circuit boards, a bonding agent coating machine 13 for applying bonding agent to part mounting positions on the printed circuit boards, a small parts mounting machine 14 for mounting chips on the printed circuit boards, an odd parts mounting machine 15 for mounting non-standardized parts, e.g., semiconductor mounted devices of packing attitude such as SOPs (small outline packages) and QFPs (quad flat packages), on the printed circuit boards, a reflow oven 16 and a board accommodating unit 17. The small parts mounting machine 14 has a cartridge table 14c, and the odd parts mounting machine 15 has trays TR, a tray feeder TRF and a stick feeder STF. Depending upon the SMT mounting line, there may be two or more small parts mounting machines and odd parts mounting machines and there may be no bonding agent coating machine.

(a-2) Screen printer

As shown in FIG. 3 illustrating its operating principle, the screen printer 12 has an exchangeable screen mask 12a and a squeegee head 12b. When printing is carried out, a printed circuit board 21 is affixed and positioned beneath the screen mask 12a and the squeegee head 12b containing solder paste is moved across the screen mask 12a while being pressed down with a predetermined printing force. This causes the solder paste to be exuded from a pattern 12c on the screen mask 12a and to be printed on the printed circuit board 21. The squeegeeing speed and plate separation speed have an effect upon solder paste printing precision.

(a-3) Bonding agent coating machine

As shown in FIG. 4 illustrating its operating principle, the bonding agent coating machine 13 includes dispenser 13b the distal end of which is provided with a nozzle 13a, a mounting nut 13c and a head holder 13d. The dispenser 13b, which supplies bonding agent to the printed circuit board and applies the bonding agent to the board, is equipped with a dispenser 13b-1 for large-size chips and a dispenser 13b-2 for small-size chips. The dispensers 13b-1, 13b-2 may be rotated about a point C so that the dispenser suited to the part to be mounted may be selected automatically. The tip of dispenser 13b-1 has two nozzles 13a1, 13a2 and the tip of dispenser 13b-1 has two nozzles 13a1', 13a2'. Bonding agent is applied to the board from two nozzles simultaneously. The nozzles are rotated at the position of application to apply the bonding agent for mountings of 0° and 90° in conformity with the orientation in which the particular chip is bonded.

(a-4) Small parts mounting machine

Figure 5:
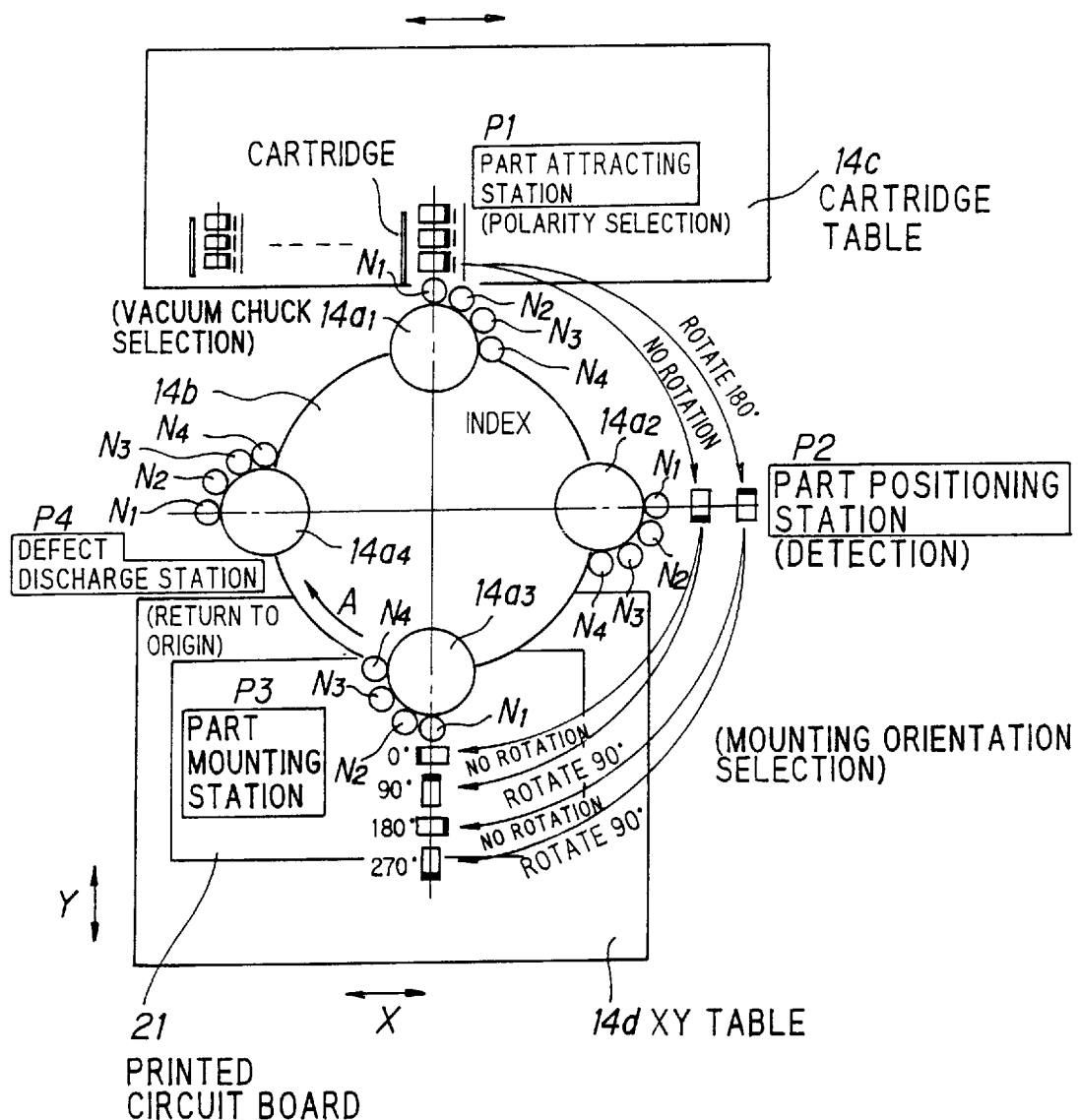
FIG. 5 is a diagram for describing a small parts mounting machine.

As shown in FIG. 5, the small parts mounting machine 13 has n-number (four in FIG. 5) of mounting heads 14a1–14a4 for attracting chips and mounting the chips on a printed circuit board at the predetermined positions, an indexing table 14b to which the mounting head is attached and which is rotated in the direction of arrow A, a cartridge table 14c on which cartridges for supplying parts are placed, and an XY table 14d for moving the printed circuit board 21 in X and Y directions. Nozzles N1–N4 having different dimensions are attached to each of the mounting heads 14a1–14a4, the appropriate nozzle is selected in accordance with the shape and dimensions of the part to be mounted and the selected nozzle attracts the part. A part attracted at a part attracting station P1 undergoes 0° or 180° of rotation, depending upon the mounting orientation, by the time it is moved to a part positioning station P2, and undergoes a further 0° or 180° of rotation by the time it is moved to a part mounting station P3, thus making possible mounting in any of four orientations.

Figure 6:
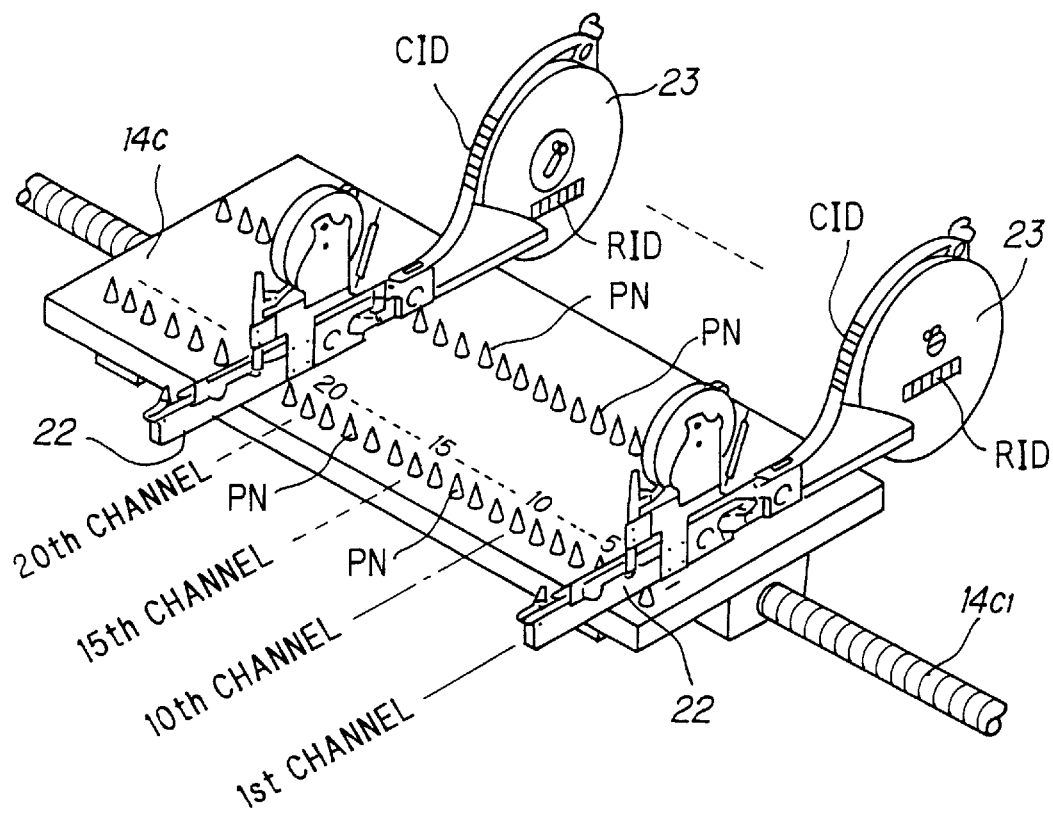
FIG. 6 is a diagram for describing a cartridge table.

As shown in FIG. 6, the cartridge table 14c has cartridge setting positions for N channels for the purpose of setting cartridges 22. Each channel has projecting positioning pins PN so that the cartridges can be fixed in the predetermined channels. The cartridge table 14c is fitted on a ball screw 14c1 so that the table can be transported by rotating the screw. Each cartridge 22 is fitted with a reel 23 on which a tape has been wound, the tape having equally spaced parts affixed thereto. RID and CID represent the reel ID and cartridge ID, respectively.

By successively situating prescribed cartridges (parts reels) at the part attracting station P1 (see FIG. 5) in the order in which parts are mounted, the nozzles mounted on the heads 14a1–14a4 successively attract parts at the part attracting station P1 and place the parts on the printed circuit board 21, which has been positioned by the XY table 14d, at the predetermined positions and in the predetermined orientations.

(a-5) Odd parts mounting machine 15

Figure 7:
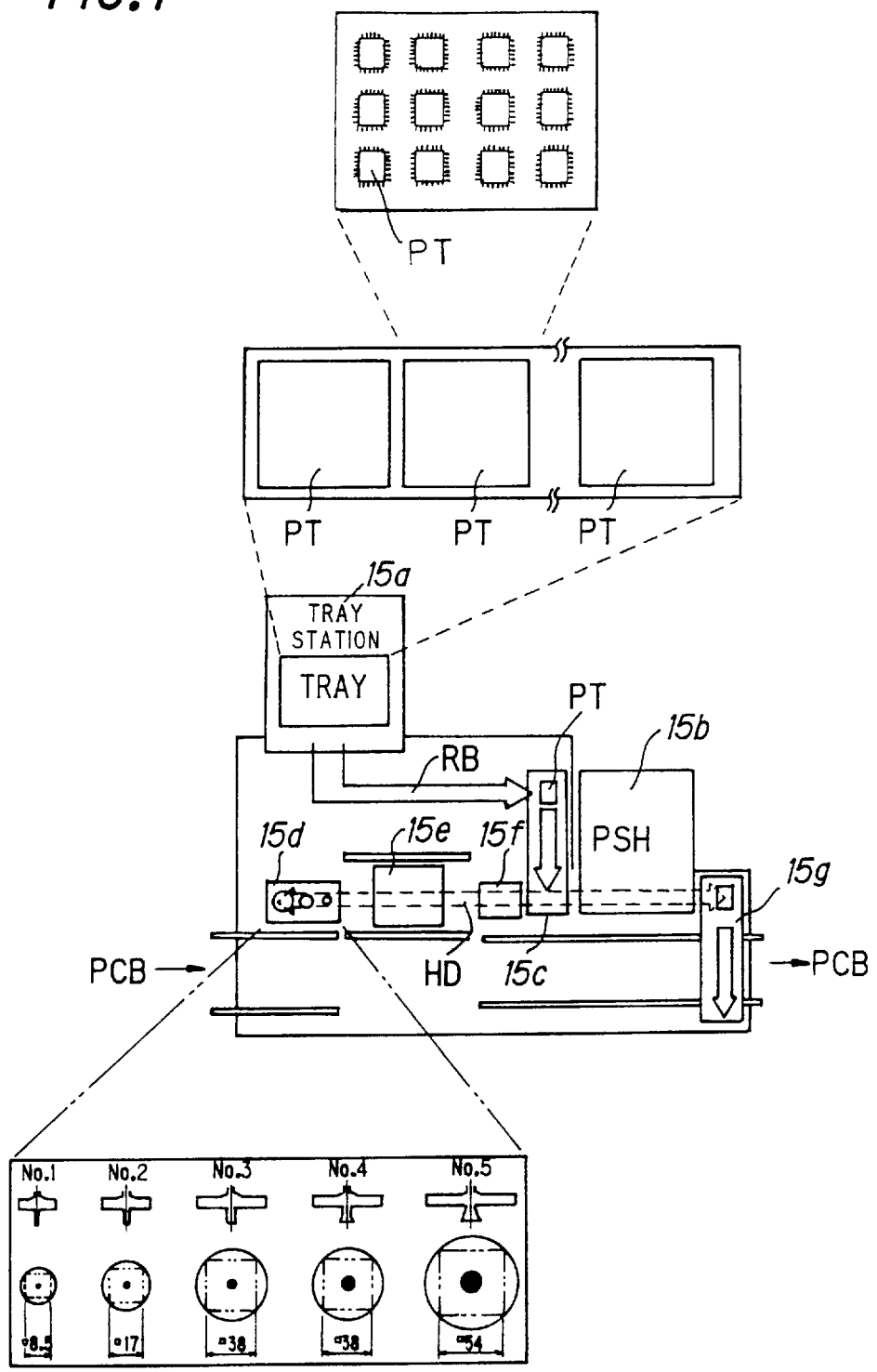
FIG. 7 is a diagram for describing an odd parts mounting machine.

As shown in FIG. 7, the odd parts mounting machine 15 has a first station (tray station) 15a on which a part PT such as a semiconductor package is placed in order to be supplied, a second station 15b for supplying parts from a cartridge and mounting the parts on a printed circuit board by a stick feeder, a part attracting section 15c at which a part transported from the first station by a subrobot RB and parts shuttle PSH is attracted by a head HD (only the range of movement of which is indicated by the dashed line), a nozzle changer 15d for selecting a prescribed nozzle, which conforms to the size of the part, and mounting the nozzle on the head, a part mounting section 15e for mounting a part on a printed circuit board PCB, an image sensor 15f for accurately ascertaining and correcting a mounting pattern position on the printed circuit board by means of a CCD camera, thereby making possible highly precise mounting of parts, and a part discharge section 15g. The tray station 15a has an N stage multiple-tray construction. One tray is disposed at each stage, a plurality of parts are placed upon each tray and the parts are transported to the parts attracting section 15c by the subrobot RB and part shuttle PSH.

(a-6) Reel stocker

Figure 8:
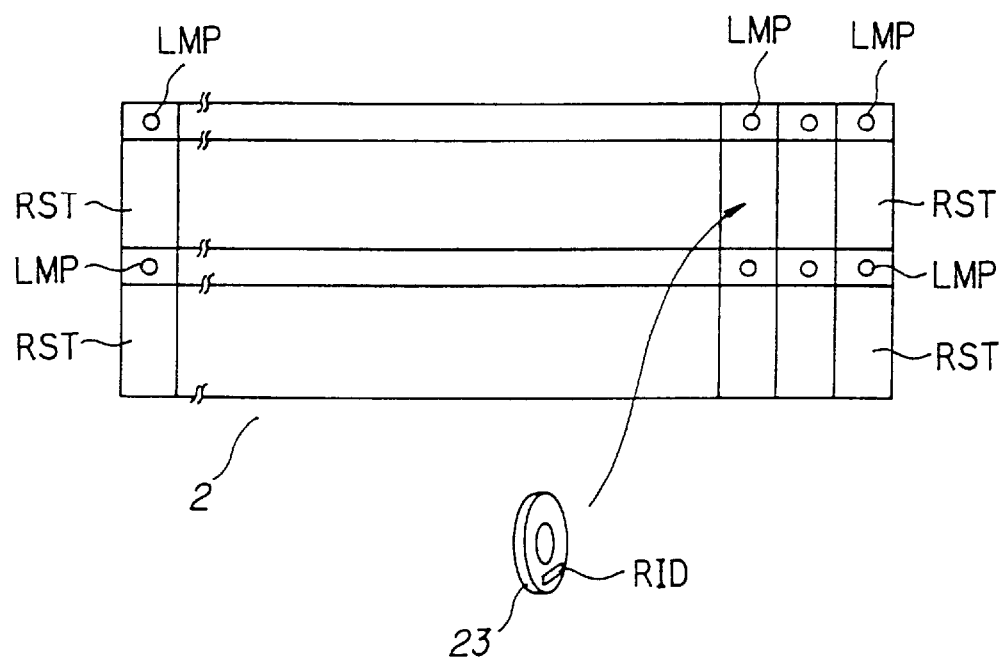
FIG. 8 is a diagram for describing a reel stocker.

The reel stocker 2 is a rack which accommodates the reels. There are two types of stockers, one for reel diameters of 178 mm and one for reel diameters of 350 mm. FIG. 8 is a diagram for describing the reel stocker 2. The reel stocker is provided with a storage rack RST for each reel 23, each storage rack RST is assigned an address and one LED (display lamp) LMP is provided to correspond to each storage rack. A tape to which parts have been attached at equal intervals is wound upon the reel 23. Each reel is assigned identification information (a reel ID) RID. The reel ID is printed in the form of a bar code, the bar code is affixed to the reel 23, the reel is accommodated in the reel stocker 2 and delivery to and from storage is managed by a personal computer. More specifically, the personal computer manages the inventory parts management file, namely the reel ID, the location of the reel and the number of parts remaining, in conformity with the part diagram numbers (SMD diagram numbers) of the parts attached to the reel 23. When a prescribed reel is placed in storage, the operator reads and enters the reel ID by a bar code reader, whereupon the personal computer searches for an empty storage rack and lights the corresponding lamp so that the operator may manually store the reel in the storage rack indicated by the lamp. When a reel is manually delivered from storage, the operator enters the prescribed reel ID or SMD diagram number, whereupon the personal computer lights the lamp LMP of the storage rack RST storing the reel so that the operator may deliver the reel from this storage rack.

(a-7) Cartridge stocker

Figure 9:
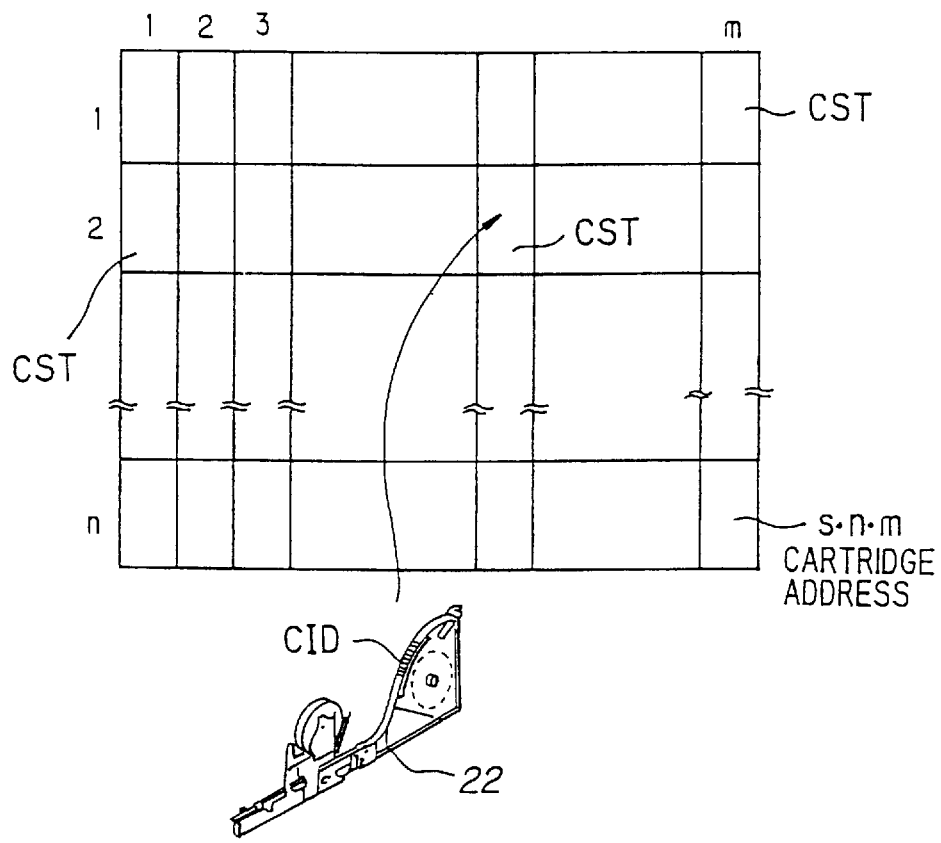
FIG. 9 is a diagram for describing a cartridge stocker.

The cartridge stocker 3 is a rack for accommodating the cartridges. FIG. 9 is a diagram for describing the cartridge stocker 3. The cartridge stocker 3 is provided with a storage rack CST for each cartridge 22, and the cartridge 22 is capable of being placed in and withdrawn from its storage rack. Each storage rack CST is assigned an address and the address serves as cartridge identification information (cartridge ID) CID. More specifically, the ID of the cartridge stored in the storage rack (whose address is snm) that is the mth storage rack from the left of the racks of the nth stage of the sth stocker is snm. The cartridge ID is printed in the form of a bar code, the bar code is affixed to the cartridge 22, the cartridge 22 is accommodated in the cartridge stocker 3 and the cartridges are managed by a personal computer.

More specifically, the personal computer manages a cartridge file, namely the cartridge type, the reel ID of the mounted reel and the last date of movement, in conformity with the cartridge ID.

Figure 10:
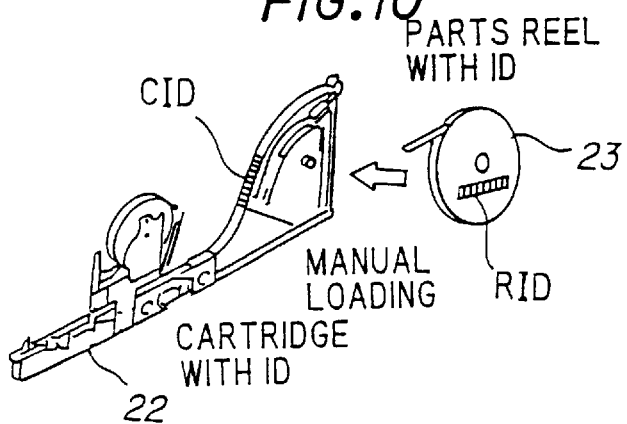
FIG. 10 is a diagram for describing a cartridge and reel mounting.

The operator goes to the reel stocker 2 to obtain the parts reel 23 that conforms to the printed circuit board to be assembled and extracts an empty cartridge 22 from the cartridge stocker 3 (there are also cases where the desired reel has already been mounted in the cartridge). The operator manually loads the reel 23 into the cartridge 22, as shown in FIG. 10, after which the reel ID and cartridge ID are read and entered into a personal computer by a bar code reader. As a result, the personal computer changes the information indicative of the location of the reel in the inventory parts management file to the cartridge ID and enters the ID of the mounted reel in a mounted reel information column contained in the cartridge file. Next, the cartridge 22 with its mounted reel is mounted in the prescribed channel of the cartridge table 14c (see FIG. 6) that has been decided by set-up processing (described later).

(b) Manufacturing management system

The manufacturing management system includes a server 31 for registering each type of file, which is used when deciding set-up, in the database, and for managing the files. There are files that are added on an updated, and there are files that are registered in advance. Examples of files added on and updated are as follows (see FIG. 11 as well):

an SMD diagram number management file 101 for each part;

an SMD inventory parts file 102;

a part data (PD) management file 103;

a cartridge management file 104;

a unit diagram number management file 105 for each; printed circuit board;

a source data management file 106;

an SMD list file 107 classified by unit diagram number; and an order management file 108.

Examples of files registered in advance are as follows:

an SMT line information file 111;

an SMT line set-up condition list file 112; and a cartridge adjacency condition file 113 classified by equipment.

These files will be described in successive fashion.

Numeral 32 denotes a first personal computer (a personal computer for controlling the reel stocker) for performing reel stocker management, reel address management and cartridge address management, etc. Numeral 33 denotes a bar code reader for reading reel ID and cartridge ID when delivery of a reel and cartridge to storage and delivery from storage are confirmed. Numeral 34 denotes a POS terminal used to verify whether a cartridge has been set on the cartridge table correctly in accordance with the set-up instruction manual. The bar code reader 33 is connected to the first personal computer 32 in accordance with a keyboard interface, and the reel stocker 2 and POS terminal 34 are connected to the first personal computer 32 in accordance with an RS232c interface.

Numeral 35 denotes a second personal computer for managing reel registration, issuance of labels, uniting/separation of cartridges and reels, exchange of cartridges, exchange of reels and reel disposal. Numeral 36 denotes a bar code label printer for printing out bar code labels. Numeral 37 denotes a bar code reader for reading reel ID and cartridge ID when labels are issued and when cartridges and reels are united/separated. A bar code printer 36 is connected to the second personal computer 35 in accordance with an RS232c interface, and the bar code reader 37 is connected to the second personal computer 35 in accordance with a keyboard interface.

Numeral 38 denotes a third personal computer (personal computer for controlling the SMT line) for controlling database management, creation of mounting data, creation of set-up data and designation of reflow conditions. Numeral 39 denotes a mounting machine control computer for controlling each item of SMT mounting equipment in accordance with NC data. The server and personal computers are connected by a LAN and are capable of exchanging data with one another.

Figure 12:
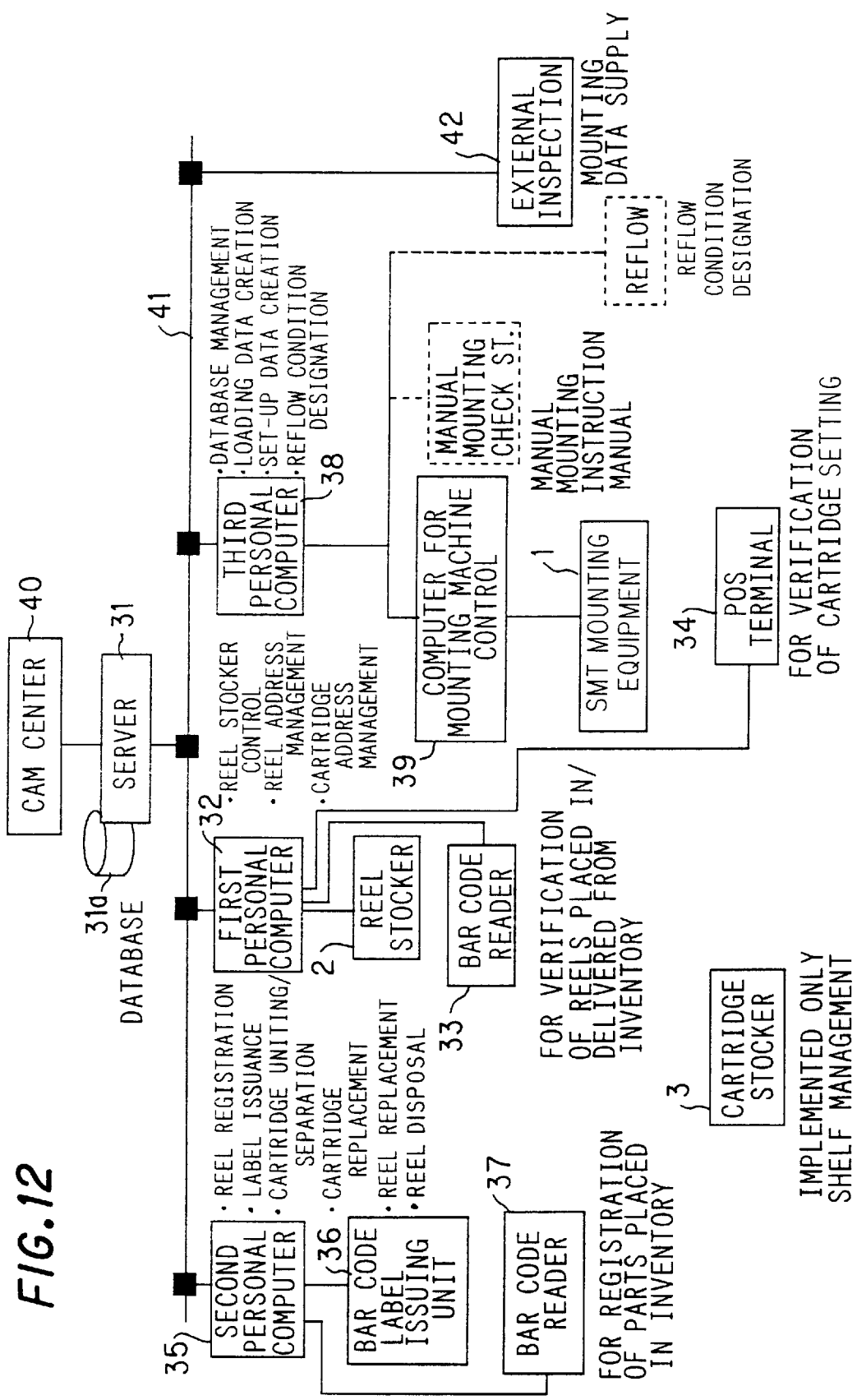
FIG. 12 is a diagram showing the configuration of a manufacturing management system.

FIG. 12 illustrates the manufacturing management system of FIG. 2 in the form of a block diagram. Components in FIG. 12 identical with those shown in FIG. 2 are designated by like reference characters. Numeral 40 denotes a CAM center which enters CAD data representing a printed circuit board into the server 31. A LAN is shown at 41 and an external appearance inspection unit at 42. Each personal computer is provided with a keyboard and a display unit, which are not shown.

(C) Preparation of database

Figure 13:
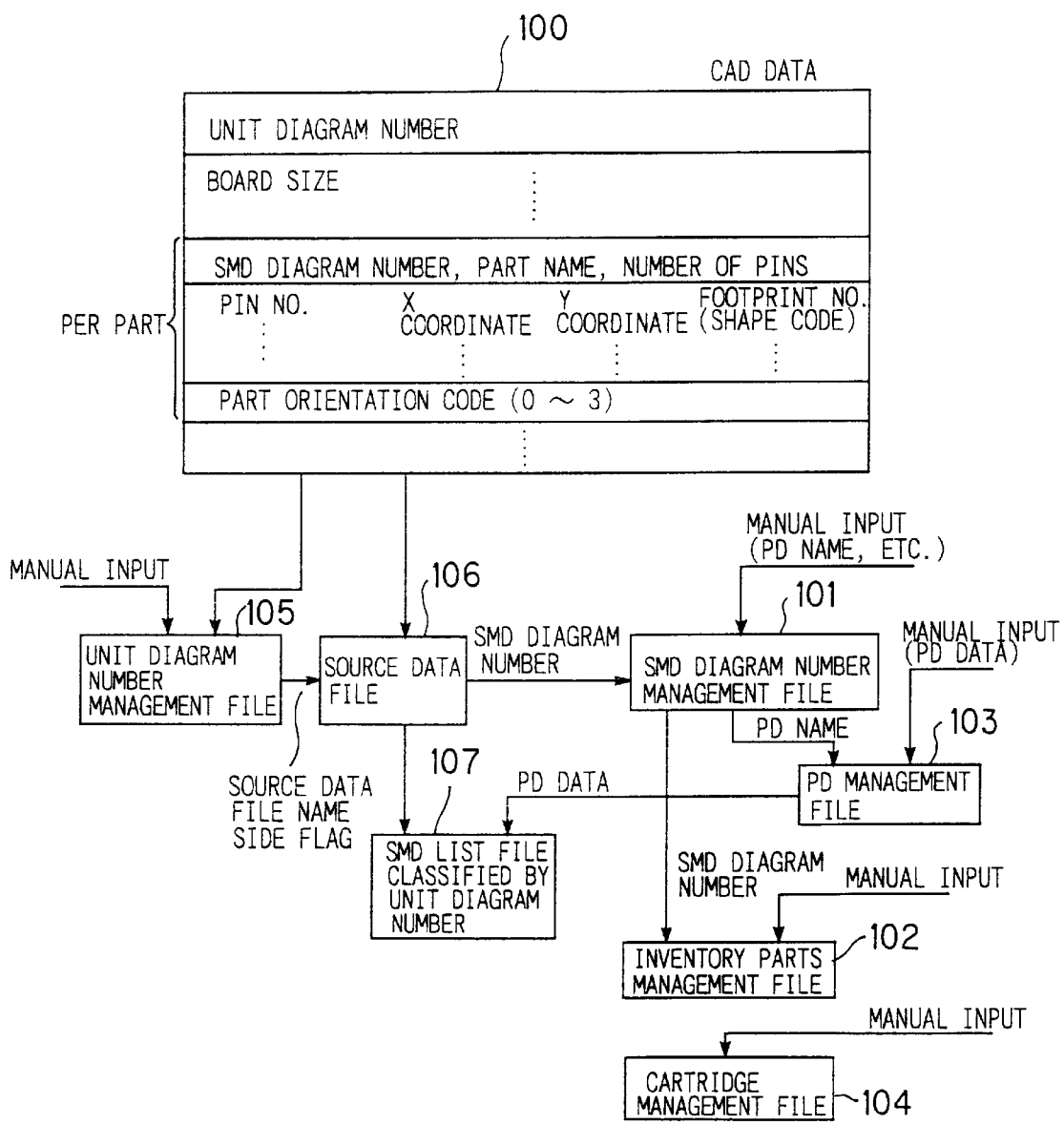
FIG. 13 is a diagram for describing various data files registered in a database.

If CAD data 100 representing a predetermined printed circuit board are received, the server 31 combines the CAD data and manual input data, as shown in FIG. 13, creates (1) the unit diagram number management file 105, (2) the source data file 106, (3) the SMD diagram number management file 101, (4) the part data (PD) management file 103, (5) the SMD list file 107 classified by unit diagram number, (6) the inventory parts management file 102 and (7) the cartridge management file 104, and registers these files in the database. The details of each of these files will be described with reference to FIGS. 14 and 15.

(a) Unit part management file (a-1) The CAD data 100 includes the unit diagram number of a printed circuit board, all SMD diagram numbers, part names, pin numbers, X, Y coordinates of each pin, shape codes of footprints (landmarks), part orientation codes and other information. Accordingly, the server 31 extracts the necessary information from these CAD data and automatically registers the following items in the database 31*a* as the unit diagram number management file 105 (see FIG. 14):

(1) unit diagram number, (2) number of versions stored, (3) total number of versions, (4) number of data versions, (5) unit number indicating how many units (manufactured articles) have been arranged among the boards, (6) board size X/Y, (7) side flag (whether mounting is double- or single-sided), (8) total number of parts, (9) total number of part types, (10) total number of soldered points and (11) source data file name.

(a-2) Next, the printing condition number (NO.) of a printed circuit board, a bonding agent coating condition number, a reflow condition number and a performance flag (the flag is raised if the printed circuit board is problem-free after manufacture) are registered manually. The operator decides the printing condition, bonding agent coating condition and reflow condition based upon the actual operation and past performance/experience and registers only the condition numbers. The actual information giving the details of the conditions is entered into the SMT line information file 111 (see FIG. 16) and the information giving the details of the conditions is printed out and indicated to the operator when set-up is designated.

(b) Source data management file

After the unit diagram number management file 105 is created, the server 31 refers to this file, automatically creates a top-side and bottom-side source data management file 106 in case of double-sided mounting, automatically creates a single-side source data management file 106 in case of single-sided mounting and registers the file in the database 31*a*. More specifically, in case of single-sided mounting, the server 31 extracts or computes, from the CAD data, (1) part symbols, (2) SMD diagram numbers, (3) X, Y coordinates of part center positions, (4), part orientations θ and (5) block numbers for all parts mounted on the printed circuit board and creates the source data management file 106. In case of double-sided mounting, the server 31 creates the data (1)–(5) separately for each mounting side and creates the source data management file 106 for each side.

(c) SMD diagram number management file (c-1) After it creates the source data management file 106, the server 31 refers to the file 106 and to the already existing SMT number management file 101 to determine whether there is a new top-side surface mount device (SMD). If there is, then the server 31 automatically registers the SMD diagram number, part name and number of pins of this SMD in the SMD diagram number management file 101.

(c-2) Next, a new SMD diagram number is printed and a manual input designation of necessary items other than automatic registration items is issued.

(c-3) The operator manually enters items for which inputs have not yet been made with regard to the number SMD diagram number that has been printed. Examples of the manually entered items are (1) part data name (PD name), (2) unit price, (3) packing attitude of mounting, (4) packing attitude of purchase, (5) number of parts/packing attitude, (6) set-up premium rate and (7) nickname (part maker code, etc.).

Figure 17:
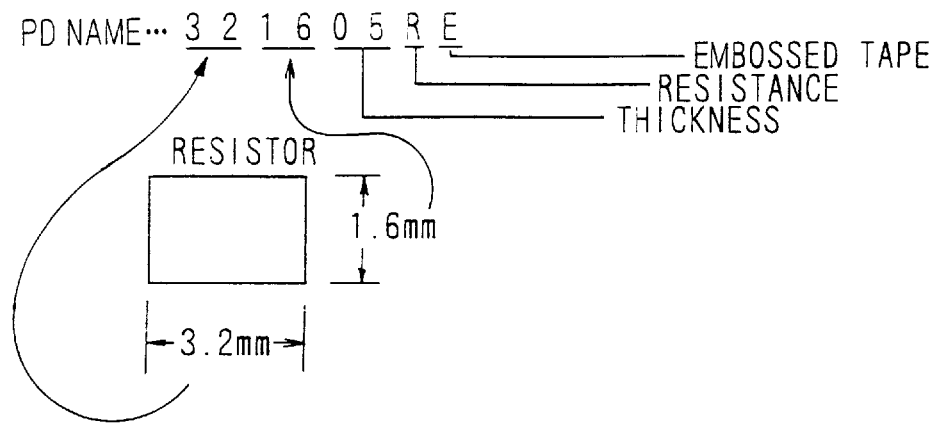
FIG. 17 is a diagram for describing a part data name (PD name)

The part data PD specifies (1) type of part, (2) the mounting machine demarcation (which indicates which mounting machine mounts the parts), (3) the number of channels used by cartridge table, (4) cartridge type, (5) angle correction data, (6) PD performance flag, (7) nozzle diameter, (8) indexing speed and (9) XY table speed. There are instances where part data are identical even if the part is different. For example, even if there are parts having different resistance values, those having the same external shape have the same part data. Further, even if top-mounted parts of packing attitude (QFP) have different circuit architectures, those having the same external shape and tray shape, etc., have the same part data. FIG. 17 is a diagram for describing a part data name. The part data name of a resistor whose external shape is defined by a length, width and thickness of 1.6 mm, 3.2 mm and 0.5 mm, respectively, and which is attached to an embossed tape, is "321605RE." The part name of a 40-pin QFP part manufactured by Fujitsu is "FJ40QFP."

Accordingly, even in case of a new SMD, there are instances where the entered part data name will already have been registered in the part data management file 103. In such instances it is unnecessary to enter the part data anew. However, if the entered part data name has not been registered in the part data management file 103, it is necessary to enters the part data and register the data in the part data management file 103 in a manner described later.

(d) Inventory parts management file (d-1) A part necessary for manufacturing a printed circuit board is entered in inventory in the reel stocker and the parts in inventory are managed by the inventory parts management file 102.

(d-2) When a part is placed in inventory, the inventory registration of the part is selected by a personal computer and the operator number is entered (in order to clarify who made the registration).

(d-3) The part diagram number (SMD diagram number) is entered from a keyboard or read from a bar code. Alternatively, the SMD diagram number management file is displayed on a display screen and the SMD diagram number is entered by selecting the predetermined SMD diagram number.

In this case, if the actual number of parts differs from the number of parts in the SMD diagram number management file, then the number of parts is revised. That is, in case of taped parts, the number of parts per tape is the number of parts in the SMD diagram number management file. However, in a case where this differs from the actual number of parts, as when re-registering a reel some of whose parts have already been used, the number of parts is revised.

(d-4) Thereafter, a bar code label is printed and the label is affixed to the reel. The content of the printed bar code is the part diagram number, nickname and reel ID. A label is affixed also in the case of a stick part and tray part.

Figure 14:
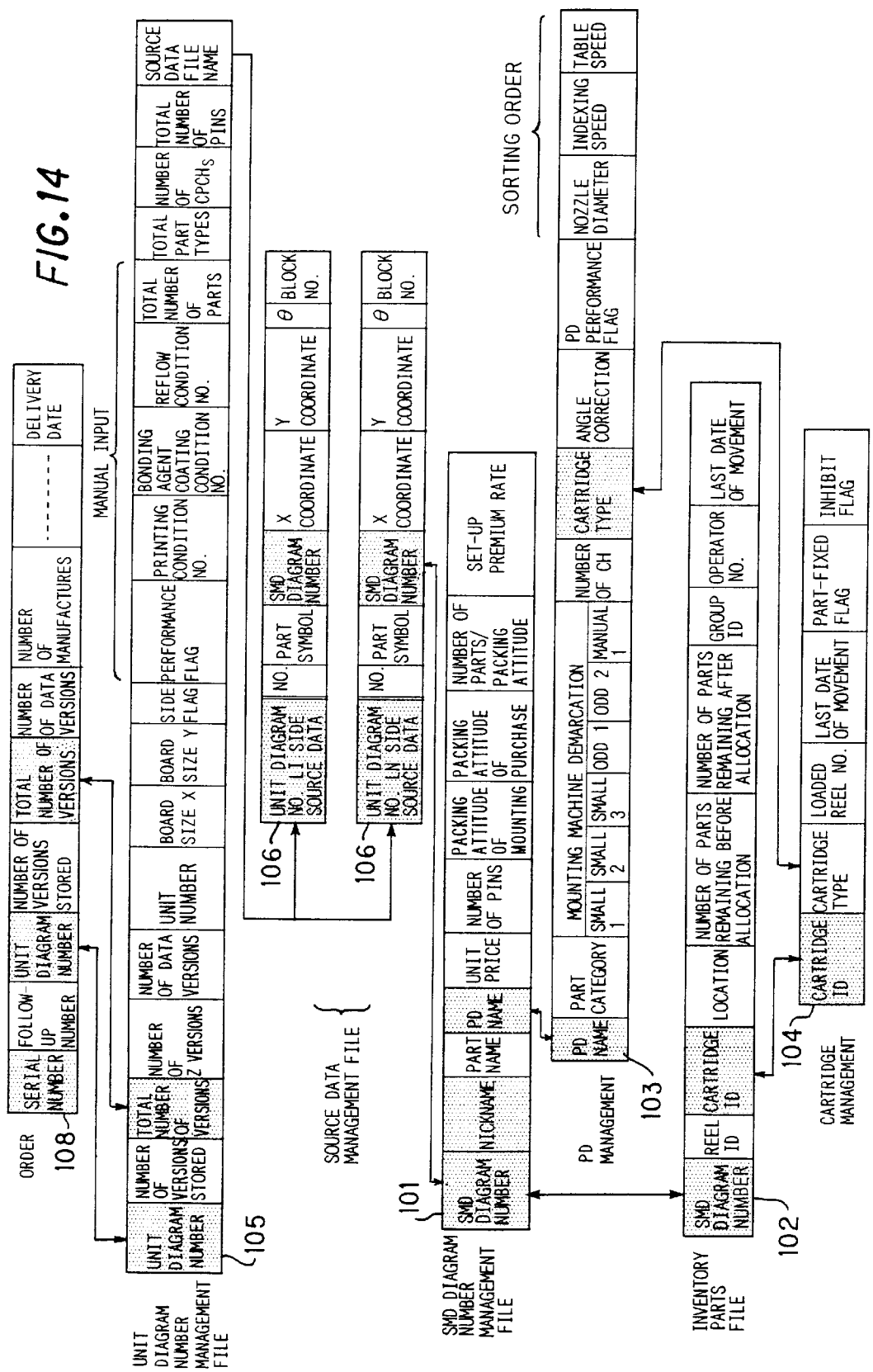
FIG. 14 is a diagram for describing the content of various data files.

Thus, a reel ID, operator number and reel location are registered in the inventory parts management file 102 in correspondence with each diagram number in inventory, as shown in FIG. 14. It should be noted that the "location" of a part is registered as "free." "Free" means that the location is undecided.

The items of the inventory parts management file 102 are (1) reel ID, (2) cartridge ID, (3) location, (4) number of parts remaining before allocation, (5) number of parts after completion, (6) group ID, (7) operator number and (8) last date of movement.

The reel ID is registered in the inventory parts management file 102 at the time of registration, and the cartridge ID is registered when the reel is mounted on the cartridge. The location is "free" at the time of reel registration. However, in a case where the reel is accommodated in the reel stocker, the location becomes the address within the reel stocker. In a case where the reel is mounted on the cartridge, the location becomes the cartridge address (=cartridge ID). If the reel is set on the mounting machine, the location becomes the part setting position number (channel No.) of the mounting machine. The number of parts remaining before allocation is the number of remaining parts at the time of reel registration. The number is decremented at completion of mounting. The number of parts after completion is the planned number of parts remaining upon completion of mounting. The group ID is the name of the group in which the part is planned to be used. The operator number is the number of the person who first registered the part. The last date of movement is the last date on which the location of the part changed.

Once a part is registered in the inventory parts management file 102, it is used any number of times. Each time it is used, the number of parts remaining, the location, the group ID and the last date of movement, etc., are updated successively.

(e) PD management file

A part data name (PD name) is entered when a new SND diagram number is registered in the SMD diagram number management file 101. In a case where this part data name has not been registered in the PD management file 103, it is required that the part data be registered.

(e-1) First, registration of the PD is selected by a personal computer.

(e-2) Next, the following items are entered manually (see FIG. 14): (1) part type, (2) mounting machine demarcation, (3) number of channels occupied in cartridge table, (4) cartridge type, (5) angle correction data, (6) PD performance flag, (7) nozzle diameter, (8) indexing speed and (9) XY table speed.

The part type indicates whether a part is a chip, an SOP or a QFP, etc. The mounting machine demarcation specifies whether a part is mounted by the small parts mounting machines 1, 2 or the odd parts mounting machine 1, 2 or whether mounting is performed manually. Though a plurality of mounting machines can also be designated, in this case ranking is assigned in the following order: small parts mounting machine→odd parts mounting machine→manual mounting, and set-up is performed on the assumption that mounting is performed by the mounting machine having the highest rank. When the result of set-up is that all parts cannot be mounted on the first-ranked mounting machine (i.e., when the channels are full) or that an imbalance in mounting time between mounting machines cannot be eliminated, set-up is performed on the assumption that mounting is performed by the mounting machine having the next highest rank. Cartridge type, which is described in detail in the section on the cartridge management file, indicates the type of cartridge. In a case where part orientation specified by the CAD data and part orientation on the mounting machine differ, the angle correction data are used to correct the part orientation and NC data are created.

Figure 18:
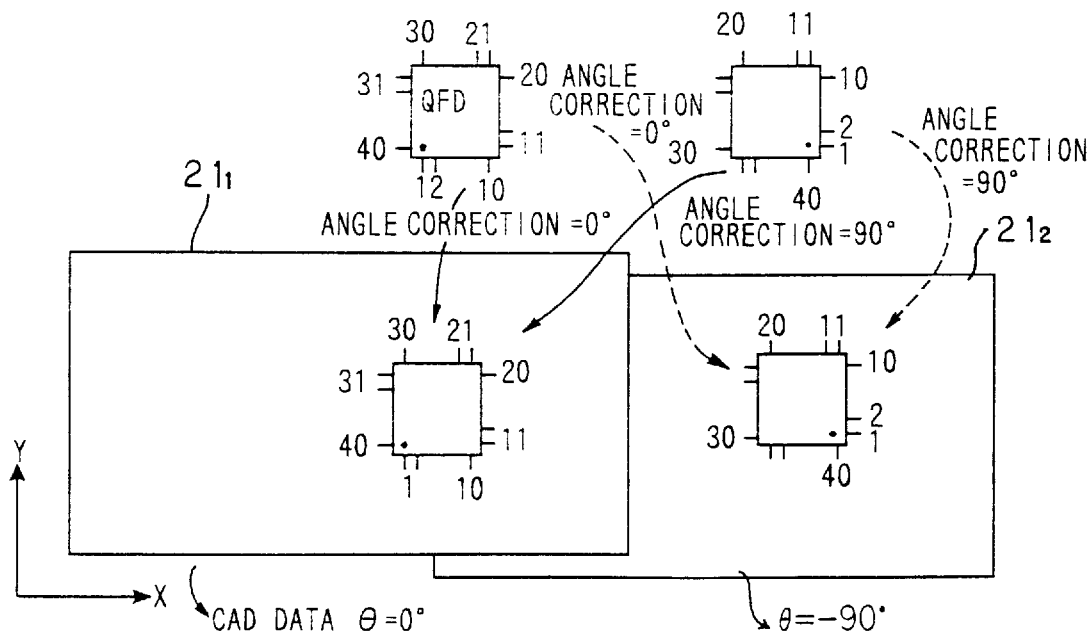
FIG. 18 is a diagram for describing angle correction data.

This will be described with reference to FIG. 18. The part orientation of a QFP mounted on a printed circuit board $21_1$ is given as $\theta=0°$ based upon the CAD data. If the QFP is introduced to the mounting machine in the state shown at (a) in this case, the mounting machine need only mount the QFP on the printed circuit board in the orientation indicated by the CAD data. The angle correction data is 0°. If the QFP is introduced to the mounting machine in the manner shown at (b), however, the mounting machine must mount the QFP on the printed circuit board upon rotating the QFP by 90°. The angle correction data is 90°. Similarly, the part orientation of the QFP mounted on a printed circuit board 212 is given as $\theta=-90°$ based upon the CAD data. If the QFP is introduced to the mounting machine in the state shown at (a) in this case, the mounting machine need only mount the QFP on the printed circuit board upon rotating the QFP by -90°. Accordingly, the angle correction data is 0°. If the QFP is introduced to the mounting machine in the manner shown at (b), however, the mounting machine need only mount the QFP on the printed circuit board as is without rotating it. The angle correction data is 90°. More specifically, a value obtained by adding the correction angle to the angle of the CAD data becomes the angle of the NC data. In case of an angle greater than 360°, however, the value obtained by subtracting 360° is adopted.

The PD performance flag is made "0" at the time of registration and is made "1" if some problem arises after a part is mounted. Nozzle diameter, indexing speed and table speed indicate the diameter of the mounting machine nozzle, the rotating speed of the index table and the traveling speed of the XY table. The larger the size of a part, the larger the size of the nozzle used to attract the part. If the rotating speed of the indexing table is made high for a part of large size, the part may fall from the nozzle or a shift in position may occur. Accordingly, the larger the size of the part, the lower the indexing speed should be made. Further, if the traveling speed of the XY table is made high for a part of large size, the part may shift in position. Accordingly, the larger the size of the part, the lower the speed of the XY table should be made. The nozzle diameter, indexing speed and table speed are used when the part setting position (channel position) on the mounting machine is decided in set-up. For example, if the mounting machine is the small parts mounting machine, then (1) parts reels (cartridges) are arranged in order of decreasing XY table speed, (2) parts. reels are arranged in order of indexing speed in a case where XY table speed is the same, (3) parts reels are arranged in order starting from nozzles of small diameter in a case where indexing speed is the same, and cartridges are mounted in the channels of the cartridge table in this order. By performing sorting in this manner, parts can be mounted at high speed while reducing variations in the speeds of the XY table and indexing table.

(f) Cartridge management file

A new cartridge is registered in the cartridge management file 104 (see FIG. 14) in the following order:

(f-1) Cartridge registration is selected by the personal computer.

(f-2) Next, the following items are entered manually: (1) cartridge ID, (2) cartridge type, (3) part-fixed flag and (4) inhibit flag (use of cartridge forbidden).

Cartridge type is decided in accordance with the rules shown in FIG. 19. Specifically, in case of a cartridge for a tape part, cartridge type is decided so as to specify-cartridge category (according to whether it is for a small parts mounting machine or odd parts mounting machine), tape category (embossed tape, paper tape or paper with adhesive), tape width (mm), part pitch (mm) on tape, standard or non-standard cartridge and reel diameter (mm). In case of a cartridge for a stick part, cartridge type is decided so as to specify that it is for a stick feeder, the number of channels occupied in the odd parts mounting machine and stick feeder number or stick feeder name. Further, in case of a cartridge for a tray part, cartridge type is entered so as to specify whether it is for a tray as well as the tray number or tray name.

The part-fixed flag is made "1" in a case where the part to be attached has been fixed. The inhibit flag is made "1" in a case where use of the cartridge is forbidden.

Retrieval of the necessary cartridge is performed based upon the cartridge type, and the set channel of the cartridge (described later) is decided based upon the tape width.

(f-3) Next, in which storage rack CST (see FIG. 9) of the cartridge stocker 3 the cartridge is to be accommodated is decided and this is adopted as the cartridge ID (because the cartridge address is the cartridge ID).

(f-4) If the cartridge ID has been decided, a bar code label is printed, the label is affixed to the cartridge and the cartridge is stored in the storage rack.

(f-5) If a reel is attached to a cartridge, the reel ID of this mounted reel is entered into the cartridge management file 104. Conversely, if a reel is taken out of a cartridge, the reel ID is deleted from the file. If a cartridge is moved (e.g., delivered from the storage rack), the last date of movement is entered into the file.

(g) SMT list file by unit diagram number

The server 31 refers to the source data management file 106 and PD management file 103 to automatically create the SMD list file 107 classified by unit diagram umber. The server 31 stores the created file in the ata base 31a.

The SMD list file 107 classified by unit diagram number manages, for each unit diagram number, (1) the number of an SMD part mounted on a printed circuit board, (2) mounting side, (3) number of mountings, (4) cartridge type, (5) number of occupied channels, (6) mounting machine demarcation, (7) table speed, (8) indexing speed and (9) nozzle diameter, and manages each mounting machine (small parts mounting machines, odd parts mounting machine, manual mounting), the total number of parts placed on a tray, the type of part types and the total number of occupied channels.

(h) Order management file (h-1) When a manufacturing order is entered, the following items are registered automatically (see FIG. 14): (1) serial number, (2) unit diagram number, (3) number of stored versions, (4) total number of versions, (5) number of data versions, (6) number of manufacturing commands, and (7) delivery date. However, in case of a board to undergo double-sided mounting, an order is automatically divided for each side and the board is distinguished by unit diagram number. The order can be corrected manually. In a case where the number of part channels classified by mounting machine exceeds the maximum number of channels of the mounting machine owing to set-up, the unit diagram number is split into two portions and set-up is performed again. In this case, it is so arranged that manufacturing of the split portions is performed continuously, and it is necessary that an alarm be issued to the effect that the board will not be passed through the reflow oven at the time of the first mounting operation. In a case where no unit diagram number has been registered in the unit diagram number management file 105 or in a case where there is no manufacturing performance, an alarm is issued to call attention to this fact when a printed circuit board is manufactured.

(h-2) Set-up for manufacturing a printed circuit board of a predetermined unit diagram number is started, starting date and time, completion date and time and time required are entered manually and these are registered in the order management file (FIG. 16).

Set-up is of two types, namely one (external set-up) in which an assembly line is set up without being stopped, and one (internal set-up) in which the assembly line is set up upon being stopped. A starting date and time and a completion date and time are entered for each type of set-up. Accordingly, manual entry items relating to set-up are external set-up starting date and time, external set-up completion date and time, internal set-up starting date and time, internal set-up completion date and time, mounting starting date and time, and mounting completion date and time. The respective times requires are computed automatically. These manual registration items are utilized in manufacturing performance control and progress control.

(h-3) If creation of NC data for a printed circuit board of a predetermined unit diagram number, the following items are registered automatically (see FIG. 16): (1) number of parts mounted/part types classified by mounting machine (inclusive of manual mounting), (2) number of part channels classified by mounting machine, (3) total number of solder points, and (4) group ID. The group ID is the identifying name of a group when unit diagram numbers (printed circuit boards) are grouped. Unit diagram numbers (printed circuit boards) manufactured by a single set-up are grouped and all printed circuit boards constituting a group are manufactured continuously after set-up, thereby making it possible to raise the activity rate of the assembly line. The grouping method can be decided by the operator or it can be decided automatically.

FIG. 16 illustrates an example of the order management file 108 in a case where items relating to manufacturing performance control have been extracted.

(i) SMT line information file

As shown in FIG. 20, the SMT line information file 11, which indicates the manufacturing conditions of each item of equipment constituting the assembly line, part setting information per equipment arrangement and machine speed, is registered in the database 31a of the server 31 in advance.

The manufacturing conditions are printing conditions in case of the screen printer, nozzle combination conditions in case of the bonding agent coating machine, nozzle combination in case of the small parts mounting machine and odd parts mounting machine, and details of reflow conditions in case of the reflow furnace, with these conditions being registered to correspond to respective condition numbers [(1), (2), (3) . . . ]. The equipment conditions (part setting information) concerns the small parts mounting machines and the odd parts mounting machine. In case of the small parts mounting machines, the address of each channel is registered for every cartridge type. The number of cartridge tables possessed by the small parts mounting machines and the number of channels of each cartridge table can be recognized from the part setting information. In case of the odd parts mounting machine, the address of each channel is registered for every cartridge table and every tray table. Accordingly, the number of cartridge tables and the number of tray tables possessed by the odd parts mounting machine as well as the number of channels of each cartridge table and tray table can be recognized from the part setting information.

(j) SMT set-up condition list file

As shown in FIG. 21, the SMT set-up condition list file 112 specifies, at the time of set-up, (1) whether changeover of the printing conditions of the screen printer is allowed, (2) whether nozzle changeover of the bonding agent coating machine is allowed, (3) whether nozzle changeover of the small parts mounting machine is allowed, (4) whether nozzle changeover of the odd parts mounting machine is allowed and (5) whether changeover of the reflow conditions of the reflow oven is allowed, and specifies (6) the maximum number of parts mounted manually, (7) whether changeover of the part-fixed flag from "1" to "0" is allowed when there are no longer not enough cartridges, and (8) whether mixing of a printed circuit board which is an initial product is allowed within a group. Several set-up conditions (set-up conditions 1–5 in FIG. 21) have been set in dependence upon allowed/forbidden combinations with regard to the items (1)–(8) mentioned above.

For example, when set-up condition 3 is selected, boards for which the screen printing conditions and reflow conditions are identical are grouped. Further, it is necessary to perform grouping in such a manner that the number of parts mounted manually will not exceed ten.

(k) Cartridge adjacency condition file classified by equipment

Figure 22:
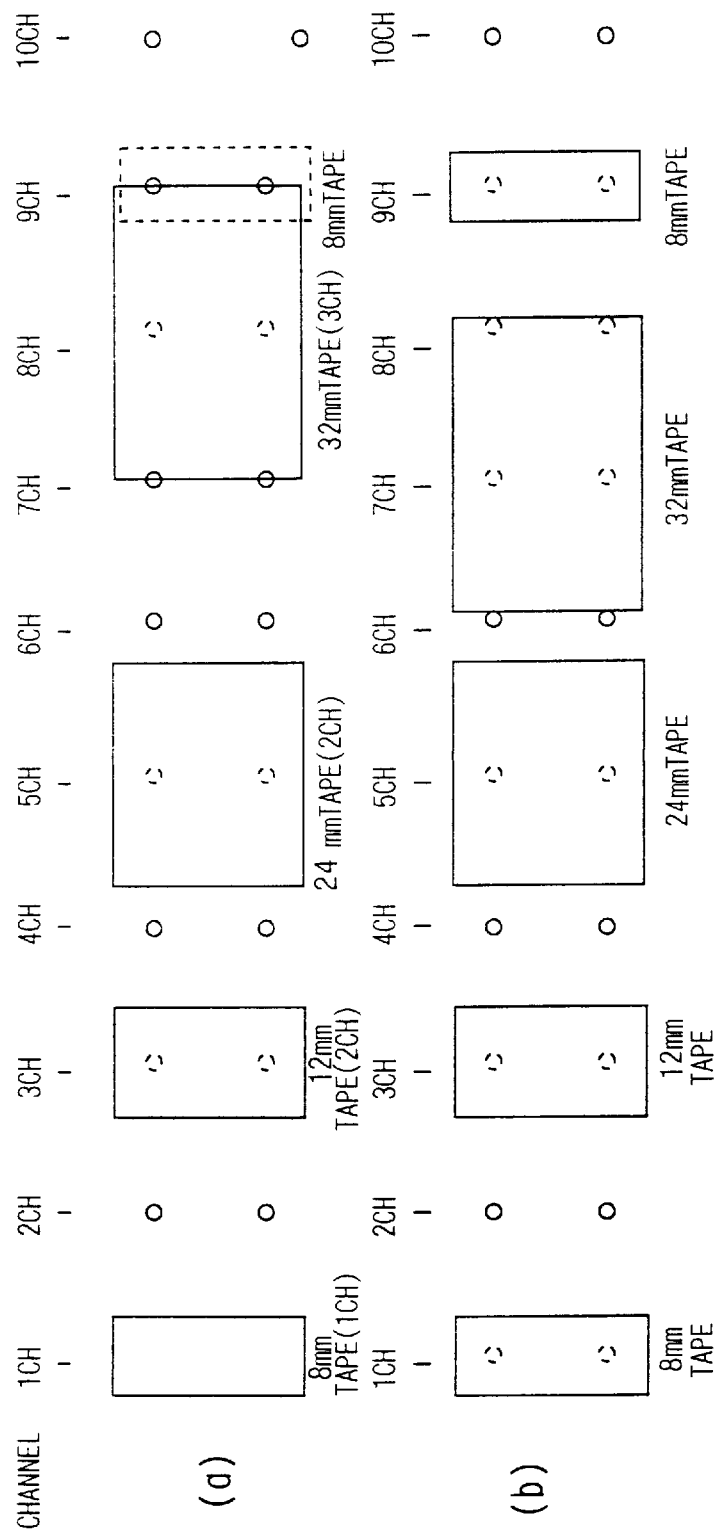
FIG. 22 is a diagram for describing cartridge adjacency conditions.

Five types of tape widths, namely 8 mm, 12 mm, 16 mm, 24 mm and 32 mm, are available for the cartridges, and the channel interval of the cartridge table is 16 mm. Accordingly, cartridges cannot be mounted consecutively from the first channel in simply determined order without taking cartridge type (tape width) into account. Conventionally, therefore, cartridge mounting channel positions are decided by allocating one channel to the tape width of 8 mm, two channels to the tape widths of 12 mm, 16 mm and 24 mm, and three channels to the tape width 32 m. With this tape channel allocation method, however, there are instances where cartridges overlap, thereby making it impossible to insert a cartridge in its specified channel. For example, in a case where first through fifth cartridges are placed on the cartridge table in the order (1) 8 mm tape→(2) 12 mm tape→(3) 24 mm tape→(4) 32 mm tape→(5) 8 mm tape . . . , the conventional method is such that (1) first channel→(2) third channel (1+2=3)→(3) fifth channel (3+2=5)→(4) eighth channel (5+3=8)→(5) ninth channel (8+1=9) →. . . are decided as the set channels of the first through fifth cartridges, as shown at (a) in FIG. 22. With this method, however, the ninth channel is covered by the fourth cartridge and the fifth cartridge cannot be inserted. When such a situation arises, set-up must be performed again, set-up time and line down time are lengthened and the activity rate of the assembly line declines.

Accordingly, the cartridge adjacency condition file 113 classified by equipment shown in FIGS. 23A, 23B is registered in the database in advance so that the above-mentioned situation will not arise. FIG. 23A shows cartridge adjacency conditions of a small parts mounting machine, and FIG. 23B shows cartridge adjacency conditions of an odd parts mounting machine. In a case where (1) tape widths of 8 mm, 12 mm and 16 mm are initially set from the cartridge adjacency condition file at the small parts mounting machine, the setting is made to the first channel. In a case where cartridges of tape widths of 24 mm and 32 mm are initially set, the setting is made to the second channel. Further, (2) in a case where cartridges of tape widths of 8 mm, 12 mm, 16 mm, 24 mm and 32 mm are arrayed next to a cartridge (arranged in the nth channel) having a tape width of 8 mm, channels obtained by adding 1, 2, 2, 2, 2 to n are adopted as the cartridge mounting channels. (3) In a case where cartridges of tape widths of 8 mm, 12 mm, 16 mm, 24 mm and 32 mm are arrayed next to a cartridge (arranged in the nth channel) having a tape width of 12 mm, channels obtained by adding 2, 2, 2, 2, 2 to n are adopted as the cartridge mounting channels. Cartridge mounting channels are decided in similar fashion for other cases as well. (4) The final set channels of tape widths of 8 mm, 12 mm, 16 mm, 24 mm and 32 mm are made channels 70, 70, 70, 69, 69.

If, in accordance with this method of deciding channels, the first through fifth cartridges are placed on the cartridge table in the order (1) 8 mm tape→(2) 12 mm tape→(3) 24 mm tape→(4) 32 mm tape→(5) 8 mm tape . . . , the arrangement will be (1) first channel, (2) third channel (1+2), (3) fifth channel (3+2), (4) seventh channel (5+2) and (5) ninth channel (7+2), and the cartridges can be inserted in the specified channels in reliable fashion.

Figure 24:
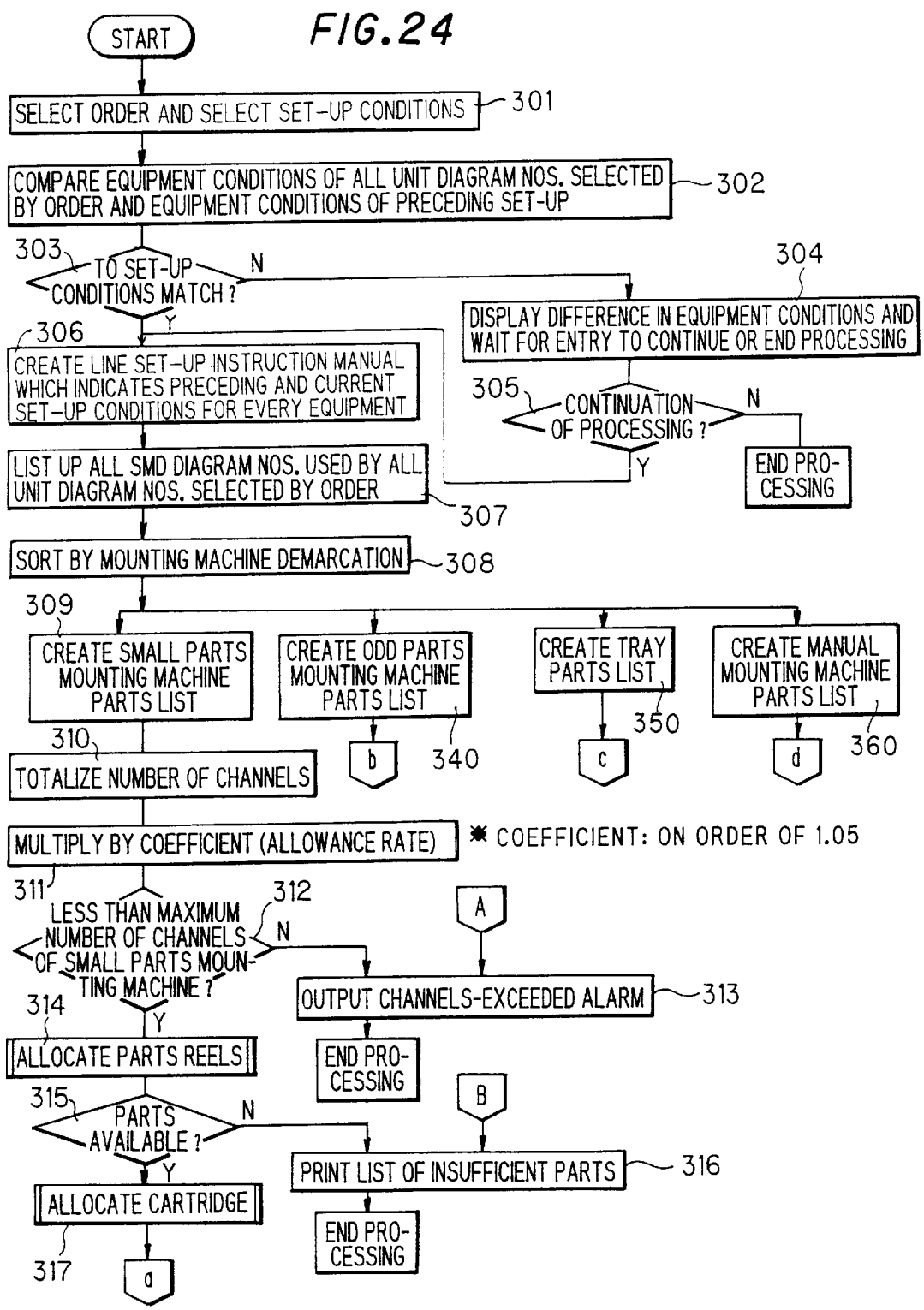
FIG. 24 is a first flowchart of processing for creating a set-up instruction manual by a set-up support unit.
Figure 25:
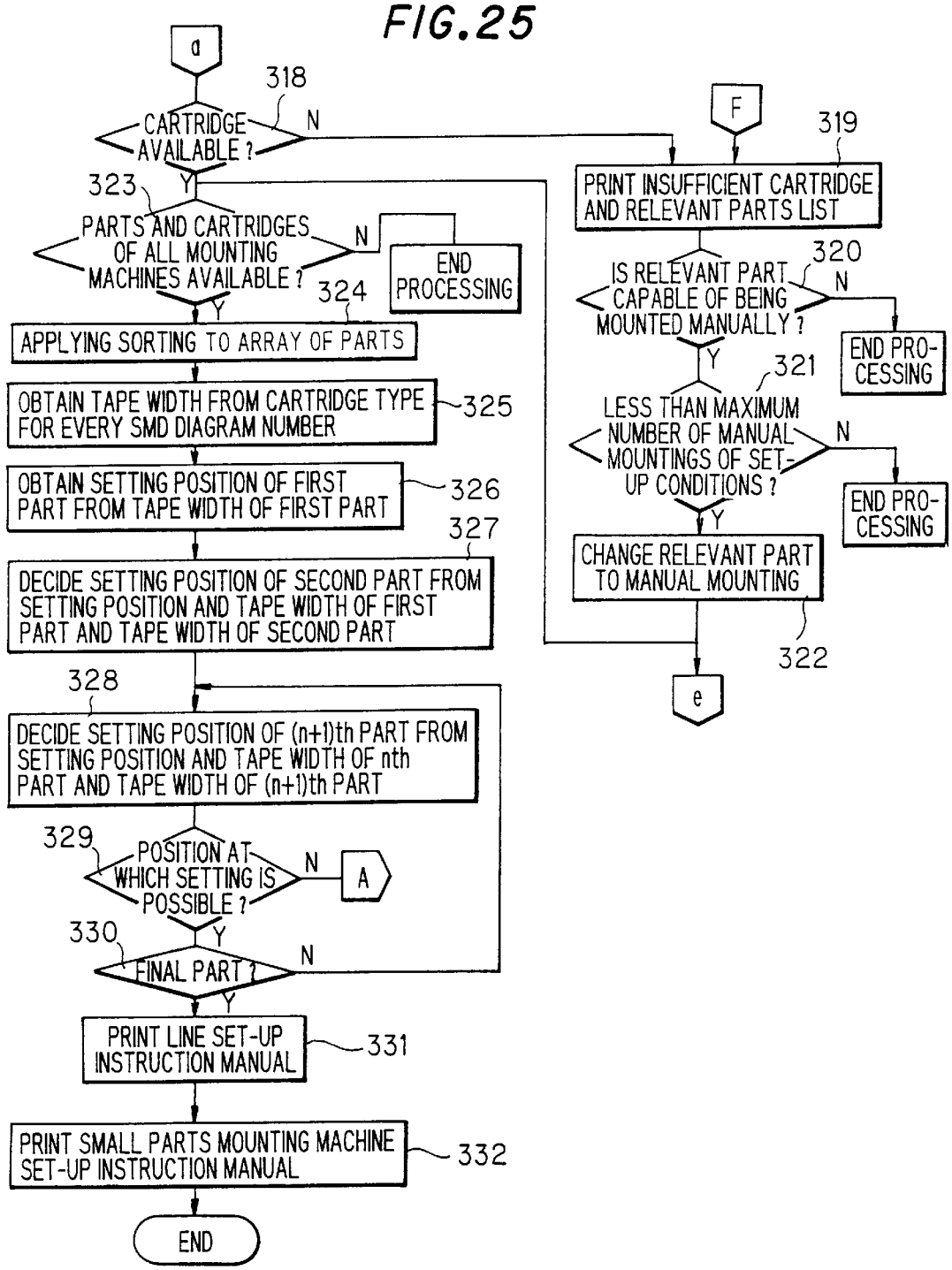
FIG. 25 is a second flowchart of processing for creating a set-up instruction manual by a set-up support unit.

(D) Creation of set-up instruction manual (a) Processing for creating set-up instruction manual If the preparation of the various files is completed, then a set-up instruction manual is created. FIGS. 24 through 26 are flowcharts of processing for creating a set-up instruction manual of an SMT set-up support system.

First, the operator selects and enters set-up conditions by referring to the SMT set-up condition list file 112 (FIG. 21) and selects the unit diagram number for grouping manufacture from the order management file 108 (step 301). For example, if set-up condition 3 is selected, boards for which the screen printing conditions and reflow conditions are identical are grouped. Grouping is performed in such a manner that the number of parts mounted manually will not exceed ten.

Next, the equipment conditions (printing conditions, bonding agent coating conditions and reflow conditions, etc.) of all unit diagram numbers selected by the order are compared with the final equipment conditions of the preceding set-up and it is determined (steps 302, 303) whether the set-up conditions selected at step 301 are satisfied. If the conditions are not satisfied, the difference in the equipment conditions is displayed, an alarm is issued and the system waits for an input as to whether processing is to be ended or continued (step 304, 305). If end of processing is designated, then processing for creating the set-up instruction manual is terminated and the operator performs grouping again. If continuation of processing is designated, processing is continued from step 306 onward.

If the set-up conditions are found to match at step 303 or if it is decided to continue processing at step 305, an "SMT line set-up instruction manual", which indicates the equipment conditions of the preceding set-up as well as the equipment conditions of the current set-up, is created for every piece of equipment (step 306).

FIG. 27 shows an example of an SMT line set-up instruction manual, in which (a) illustrates the equipment conditions of the preceding set-up (Group ID A0006) and (b) the equipment conditions of the current set-up (Group ID A0007). In (a), the conditions of each piece of equipment are the same even if the unit diagram number changes. Therefore, it will be understood that if equipment conditions are initially set one time only in the preceding set-up, then the equipment conditions need not be changed until the manufacture of all printed circuit boards of group A0006 is completed. In the current set-up in (b), it will be understood that at manufacture of the initial unit diagram number (printed circuit board), there is no need to alter the equipment conditions from preceding equipment conditions. However, it will also be understood that when the next unit diagram number is manufactured, the line must be stopped and the equipment conditions of the screen printer, odd parts mounting machine and reflow oven must be modified. Since the details of each of the equipment conditions are printed simultaneously, the equipment conditions of each piece of equipment are set upon referring to the conditions at the time of set-up.

If creation of the line set-up instruction manual is finished, then all SMD diagram numbers used in all unit diagram numbers in the group selected by the order are listed up using the SMD list file 107 classified by unit diagram number (step 307). All SMD diagram numbers distributed to each mounting machine based upon the mounting machine demarcations (sorting; step 308). Thus, all parts are distributed according to mounting machine.

In this case, if a plurality of mounting machines have been designated by the mounting machine demarcations, ranking is assigned in the order small parts mounting machine→odd parts mounting machine→manual mounting, and distribution is performed on the assumption that mounting is performed by the mounting machine having the highest rank. When the result of distribution is that all parts cannot be mounted on the first-ranked mounting machine (i.e., when the channels are full) or that an imbalance in mounting time between mounting machines cannot be eliminated, distribution of unit diagram numbers is performed on the assumption that mounting is performed by the mounting machine having the next highest rank. In a case where an SMT line includes two or more identical types of mounting machines, a plurality of mounting machines of the same type can be designated. In such case distribution is performed in such a manner that the mounting times of the mounting machines, inclusive of the odd parts mounting machine, are uniformed, or in such a manner that the numbers of part setting channels are uniformed. By uniforming the numbers of channels, a larger number of printed circuit boards can be manufactured by a single set-up.

Next, a parts list of the small parts mounting machine is created. That is, for a category of parts mounted by a small parts mounting machine, a parts list containing the following is created (step 309): (1) SMD diagram number, (2) number used, (3) cartridge type, (4) number of occupied channels, (5) table speed, (6) indexing speed and (7) nozzle diameter, etc. After the parts list is created, the numbers of occupied channels for each of the categories of parts are totaled to obtain the necessary number of channels and a correction is applied by multiplying this number of channels by a preset coefficient (e.g., 1.05) (steps 310, 311).

Next, the corrected number of channels is compared with the maximum number of channels of the small parts mounting machine obtained from the SMT line information file 111 (FIG. 20) (step 312). If the necessary number of channels is greater than the maximum number of channels, an alarm to the effect that the number of channels has been exceeded is issued and processing is terminated. The operator thenceforth performs grouping again and repeats processing from the beginning. In a case where the number of part channels classified by mounting machine exceeds the maximum number of channels of the mounting machine with regard to one unit diagram number, the unit diagram number is divided into two and set-up is performed again.

If the necessary number of channels is less than the maximum number of channels, then parts reels to which the parts indicated by each SMD diagram number of the parts list are attached are allocated (step 314). In a case where there are many parts reels, they are allocated by the following order of priority: The first order of priority is to a parts reel mounted in a cartridge and located in the cartridge stocker. The second order of priority is to a parts reel used in the preceding set-up and placed at the part setting position of the current mounting machine. The third order of priority is to a parts reel in the reel stocker or a parts reel whose address is free. In a case where a plurality of parts reels are required, use always starts from the parts reel having the smallest number of parts and the reel is emptied following the end of mounting to reduce the number of reels. Processing for allocating parts reels will be described later.

Next, it is determined whether the necessary number of parts are located in the parts reel (step 315). If the answer is "NO", then a list of the insufficient parts is printed out (step 316), operation is halted and grouping is performed again or the parts that are insufficient are registered.

If there are no insufficient parts with regard to all SMD diagram numbers, then cartridge allocation processing is executed (step 317). Cartridge allocation processing is the processing of step 314 for allocation parts reels and is executed in a case where a parts reel that has not been mounted in a cartridge is allocated. A cartridge is allocated through the following procedure:

(1) The cartridges are extracted from the cartridge management file 104 based upon the cartridge type of the part (it should be noted that the inhibit flag is not set).

(2) Next, a cartridge which is an empty cartridge (the mounted reel ID is a blank field) and for which the part-fixed flag is "0" is selected from among these cartridges. The cartridge thus selected can have its parts reel mounted immediately; reel removal and release of a fixed part are unnecessary. In a case where such a cartridge is not found, a cartridge in which a reel has been mounted and for which the part-fixed flag is "0" is selected. In this case, the system judges from which cartridge removal of the parts reel would be most rational. The details of processing for cartridge allocation will be described later.

A check is made to determine whether the cartridge has been found (step 318). If the cartridge has not been found, an alarm is issued and "Insufficient Cartridge and Relevant Parts List" is printed out at the same time (step 319). Next, with regard to a relevant part for which there is no cartridge, reference is made to the mounting machine demarcation field in the parts data PD to determine whether the part is capable of being mounted manually (step 320). If manual mounting is not possible, then processing is terminated owing to cartridge inadequacy and the system waits for grouping to be performed again. If manual mounting is possible, it is determined whether the number of manual mountings is less than a maximum number of manual mountings by referring to the maximum number of manual mountings in the set-up conditions (step 321). If the number of manual mountings is greater than the maximum number of manual mountings, processing is terminated by reason of insufficiency of cartridges and the system waits for grouping to be performed again. If the number of manual mountings is less than the maximum number of manual mounting, however, the relevant part is changed to manual mounting (step 322), after which processing from steps 323 and 363 onward is executed.

If the relevant cartridge is available, or after the relevant part is changed to manual mounting, it is determined whether the parts and cartridges of all mounting machines are present (step 323). If they are not present, processing is terminated and the system waits for grouping to be performed again. If parts and cartridges of all mounting machines are present, then parts are rearranged in the following order of priority for every mounting machine: XY table speed, indexing speed, nozzle diameter (step 324). The parts (cartridges, etc.) are set on the mounting machines in the sorted order.

Next, tape width is obtained from the cartridge type of the cartridge in which each part has been loaded (step 325). The channel in which the part (cartridge) is mounted is decided in accordance with the method described in conjunction with FIGS. 22 and 23 (steps 326–330). When a mounting channel is decided, it is determined at step 329 whether a cartridge is capable of being mounted in the channel. If mounting is impossible, an alarm to the effect that the channels have been exceeded is issued and processing is terminated at step 313. The system waits for grouping to be performed again.

If mounting channels for all parts have been decided, the line set-up instruction manual (FIG. 27) is printed out (step 331). The line set-up instruction manual is not necessarily designated in group units but may be designated in units of unit diagram numbers.

The optimum values of the printing conditions of the screen printer, the nozzle setting conditions of the bonding agent coating machine, the nozzle setting conditions of the small parts and odd parts mounting machine and the reflow conditions are obtained at the time of the preceding manufacture, these are registered in the unit diagram number management file 105 and they are printed out. Accordingly, in case of an initial printed circuit board (unit diagram number), the fact that the board is an initial product is printed and setting of conditions is prompted.

Next, the set-up instruction manual of the small parts mounting machine is printed out (step 332). FIG. 28 shows an example of the set-up instruction manual 121 classified by mounting machine. A set-up instruction manual for the small parts mounting machines is indicated at 121a, and a set-up instruction manual for the odd parts mounting machines is indicated at 121b. The set-up instruction manual 121a for the small parts mounting machines specifies (1) the parts setting channel (new address) in the cartridge 1, (2) the SMD diagram number, (3) the nickname, (4) the part name, (5) the part data name, (6) the reel ID, (7) the cartridge ID, (8) the old cartridge address/old reel address, (9) the remaining number of parts and (10) the number of parts used. Thereafter, the necessary parts reels and cartridges are prepared in accordance with the set-up instruction manual, an operation for loading/unloading parts reels and cartridges is performed as necessary and a cartridges with their parts reels are set in the designated channels of the cartridge table.

The steps from step 309 onward represent processing for creating the set-up instruction manual of the small parts mounting machines. Creation of set-up instruction manuals for the odd parts mounting machine and for manual mounting is carried out from steps 340, 360 onward, respectively.

After sorting based upon the mounting machine demarcation at step 308 is completed, a parts list is created for the category of parts mounted by the odd parts mounting machine using the cartridges (step 340). The parts list includes: (1) SMD diagram number, (2) number used, (3) cartridge type, (4) number of occupied channels, (5) table speed, (6) indexing speed and (7) nozzle diameter, etc. After the parts list is created, the numbers of occupied channels for each of the parts are totaled to obtain the number of channels necessary for the odd parts mounting machine and a correction is applied by multiplying this number of channels by a preset coefficient (e.g., 1.05) (steps 340, 342). Next, the corrected number of channels is compared with the maximum number of channels of the odd parts mounting machine obtained from the SMT line information file 111 (FIG. 20) (step 343). If the necessary number of channels is greater than the maximum number of channels, an alarm to the effect that the number of channels has been exceeded is issued (step 313) and processing is terminated. The operator thenceforth performs grouping again and repeats processing from the beginning.

In concurrence with the foregoing, a parts list which includes (1) SMD diagram number, (2) number used and (3) number of occupied channels (=1) is created for every part placed on the tray (step 350). Next, the numbers of occupied channels for each tray part are totaled (step 351) and the value of the total is compared with the maximum number of channels of the tray table obtained from the SMT line information file 111 (FIG. 20) (step 352). Tf the value of the total is greater than the maximum number of channels, an alarm to the effect that the number of channels has been exceeded is issued (step 313) and processing is terminated. The operator thenceforth performs grouping again and repeats processing from the beginning.

If the necessary number of channels is found to be less than the maximum number of channels at steps 343 and 352, then parts reels are allocated (step 344). Thereafter, processing similar to that from step 315 onward in the small parts mounting machine is executed (step 345) and the set-up instruction manual 121b for the odd parts mounting machine is printed out (step 346).

Thereafter, the cartridges with their parts reels and the trays are prepared in accordance with the set-up instruction manuals 121 classified by mounting machine, the cartridges are set in the designated channels of the cartridge table and the trays carrying the parts are set in the designated channels of the tray table.

Upon completion of sorting (step 308) based upon the mounting machine demarcations, a parts list which includes (1) SMD diagram number and (2) number of manual mountings) is created for every part loaded manually (step 360). Next, parts reels to which the parts indicated by each SMD diagram number of the parts list are attached are allocated (step 361). It is then determined whether the required parts are on the part reels (step 362). If the answer is "NO", then a list of the insufficient parts is printed out (step 316), operation is halted and grouping is performed again or the parts that are insufficient are registered. If there are no insufficient parts with regard to all SMD diagram numbers, then the X, Y coordinates of manually mounted parts, the part orientations θ and the part symbols are obtained from the source data management file 106 (step 363) and the instruction manual for the manual mounting is printed out (step 364).

FIG. 29 shows an example of the manual mounting instruction manual 122. This instruction manual specifies (1) part symbol, (2) SMD diagram number, (3) reel ID, (4) nickname, (5) PD name, (6) mounting coordinates X, Y, θ, (7) mounting side, (8) block number, (9) number of remaining parts and (10) number of parts used. Whereas the set-up instruction manual 121 (FIG. 28) for mounting machines is information for setting parts, the manual mounting instruction manual 122 indicates where individual parts are to be placed one by one and resembles mounting machine NC data (mounting data).

After the required parts are prepared and the mounting thereof by the mounting machines is completed, the parts that are to be mounted manually are mounted manually by the operator at the designated positions X, Y on the printed circuit boards and at the designated inclination θ in accordance with the above-described manual mounting instruction manual 122.

(b) Parts reel allocation processing

Figure 30:
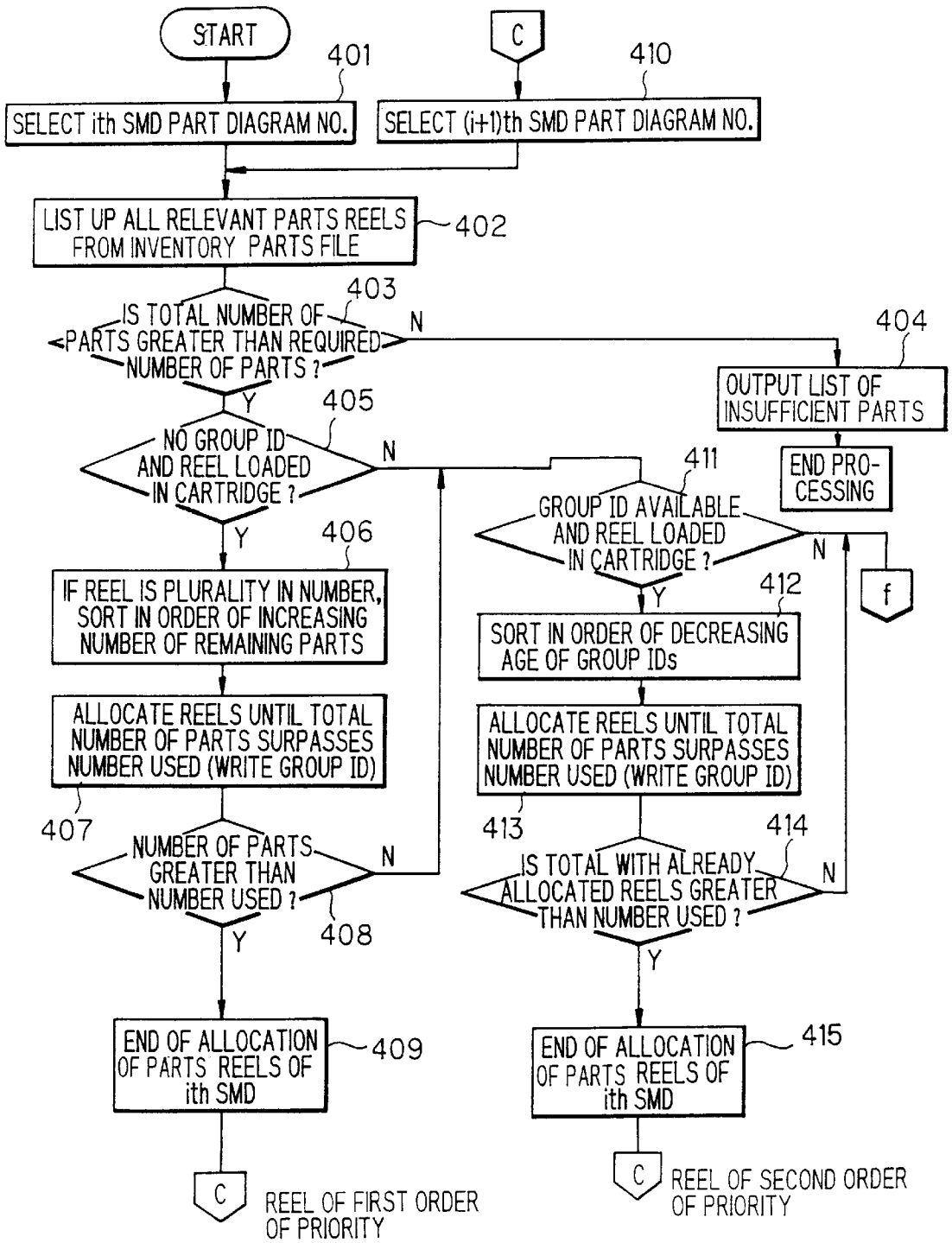
FIG. 30 is a first flowchart for searching reel.
Figure 31:
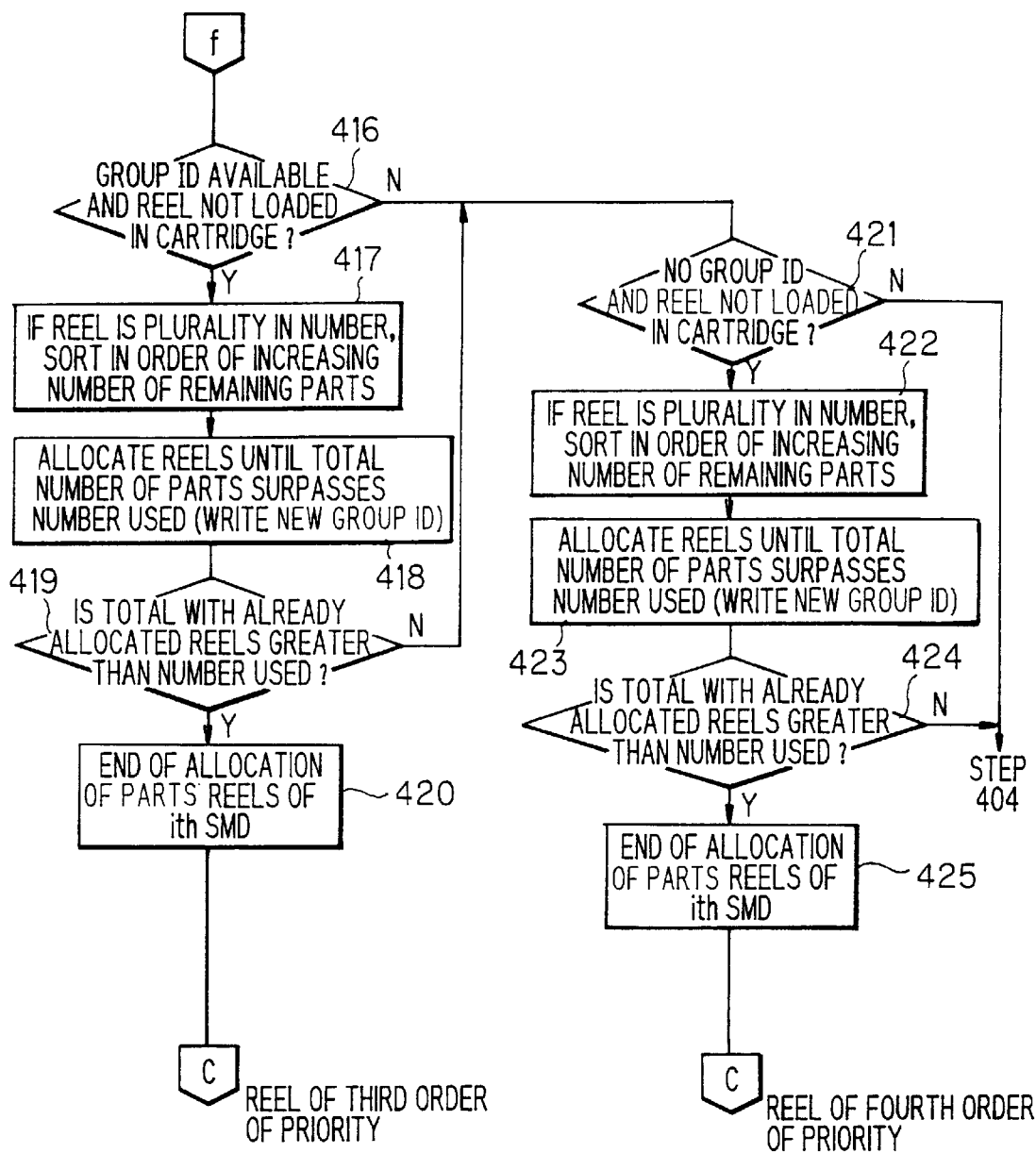
FIG. 31 is a second flowchart for searching reel.

FIGS. 30 and 31 are detailed processing flowcharts of the parts allocation step included in step 314, which is the processing for creating the set-up instruction manual.

When parts reels are allocated, the following is carried out:

(1) A parts reel that has not yet been allocated (one to which a group ID has not been assigned) and that has been mounted in a cartridge is selected at a first priority.
(2) A parts reel that has already been allocated (one to which a group ID has been assigned) and that has been mounted in a cartridge is selected at a second priority.
(3) A parts reel to which a group ID has been assigned and that has not been mounted in a cartridge is selected at a third priority.
(4) A parts reel to which a group ID has not been assigned and that has not been mounted in a cartridge is selected at a fourth priority.

If a parts reel is selected in the order of priority set forth above, the number of parts reels set up can be reduced and operations for loading the parts reels can be reduced as well, thereby making it possible to lighten the burden imposed by the set-up operation.

First, the SMD diagram number of an ith (where the initial value of i is 1) SMD part is selected (step 401) and reference is made to the inventory parts management file 102 (see FIG. 14) to list up all parts reels to which the above-mentioned SMD part has been attached (step 402). Next, it is determined whether the total number of parts in inventory is greater than the number required (step 403). If the total number is less than the number required, a list of the insufficient parts is outputted (step 404) and processing is terminated.

If the total number of parts is greater than the number required, it is determined whether a parts reel having the first order of priority is available (step 405). If a parts reel having the first order of priority exists, it is determined whether there are a plurality of such reels. If a plurality of these reels exist, they are sorted in order of increasing number of remaining parts (step 406). The parts reels are allocated, until the total number of parts surpasses the required number of parts, and the group ID is written on each reel (step 407). Next, it is determined whether parts reels in excess of the required number have been allocated (step 408). If the answer is "YES", then processing for allocating the parts reels of the ith SMD is terminated, after which the next SMD diagram number is selected (steps 409, 410). Processing from step 402 onward is then repeated.

If it is found at step 405 that a parts reel having the first order of priority does not exist, or if it is found at step 408 that parts reels in excess of the required number cannot be allocated, then it is determined whether parts reels having the second order of priority exists (step 411). If these parts reels exist, then they are sorted in order of decreasing age of the group IDs (step 412). Reels are allocated in the sorted order, until the total number of reels surpasses the required number, and the group ID is written on each reel (step 413). Next, it is determined whether the total number of parts combined with the total number of parts of reels already allocated is greater than the required number of parts (step 414). If the answer is "YES", then processing for allocating parts reels of the ith SMD is terminated, after which the next SMD diagram number is selected (steps 415, 410). Processing from step 402 onward is then repeated.

If it is found at step 411 that a parts reel having the second order of priority does not exist, or if it is found at step 414 that parts reels in excess of the required number cannot be allocated, then it is determined whether parts reels having the third order of priority exists (step 416). If the answer is "YES", then they are sorted in order of increasing number of remaining parts (step 417). The parts reels are allocated, until the total number of parts surpasses the required number of parts, and the group ID is written on each reel (step 418). Next, it is determined whether the total number of parts of reels already allocated is greater than the required number of parts (step 419). If the answer is "YES", then processing for allocating the parts reels of the ith SMD is terminated, after which the next SMD diagram number is selected (steps 420, 410). Processing from step 402 onward is then repeated.

If it is found at step 416 that a parts reel having the third order of priority does not exist, or if it is found at step 419 that parts reels in excess of the required number cannot be allocated, then it is determined whether parts reels having the fourth order of priority exists (step 421). If the answer is "YES", then they are sorted in order of decreasing number of remaining parts (step 422). The parts reels are allocated in the sorted order, until the total number of parts surpasses the required number, and the group ID is written on each reel (step 423). Next, it is determined whether the total number of parts of parts of reels already allocated is greater than the required number of parts (step 424). If the answer is "YES", then processing for allocating parts reels of the ith SMD is terminated, after which the next SMD diagram number is selected (steps 425, 410). Processing from step 402 onward is then repeated. If there are no parts having the fourth order of priority or if parts reels in excess of the required number of parts cannot be allocated, the list of insufficient parts is outputted and processing is terminated.

(c) Cartridge allocation processing

Figure 32:
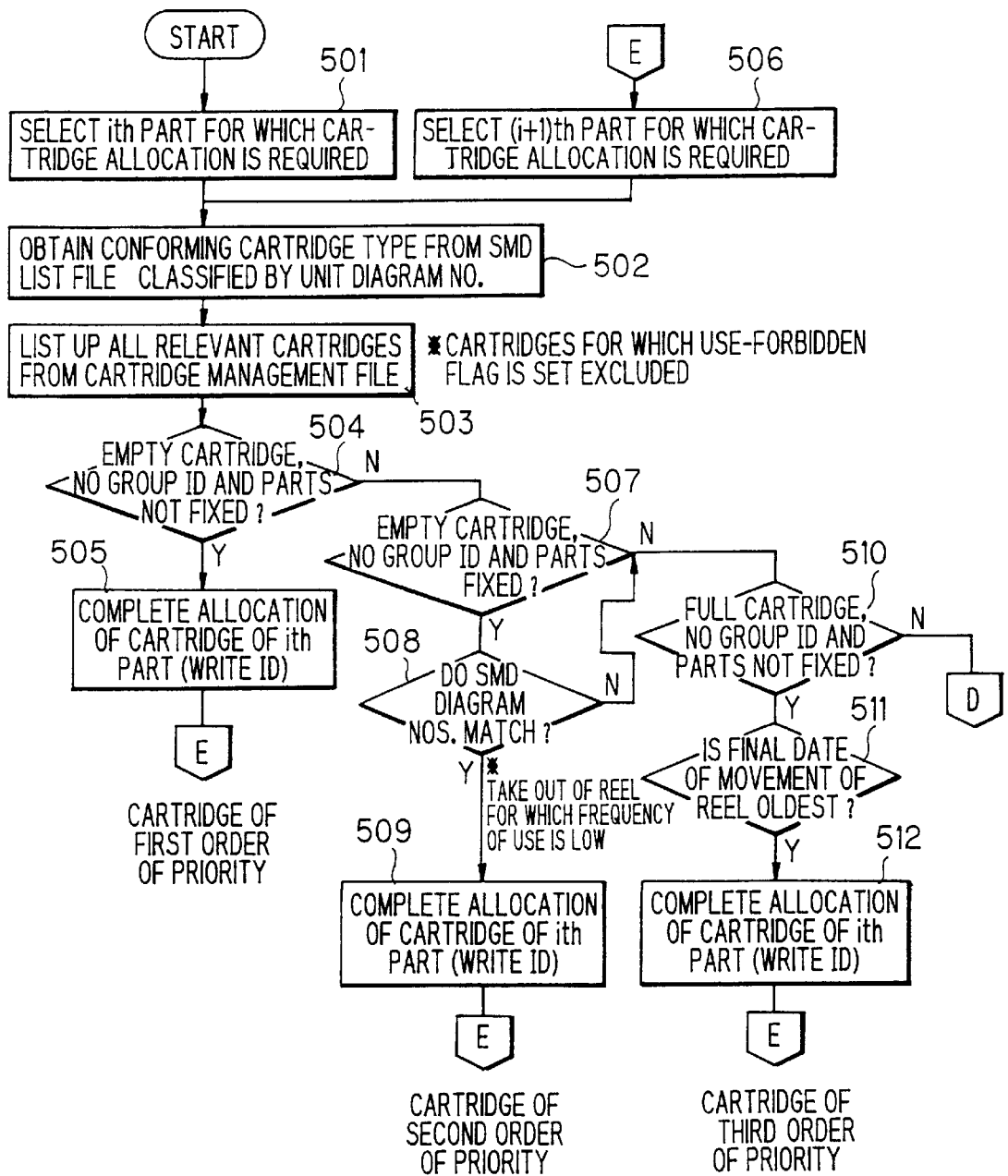
FIG. 32 is a first flowchart for searching cartridge.
Figure 33:
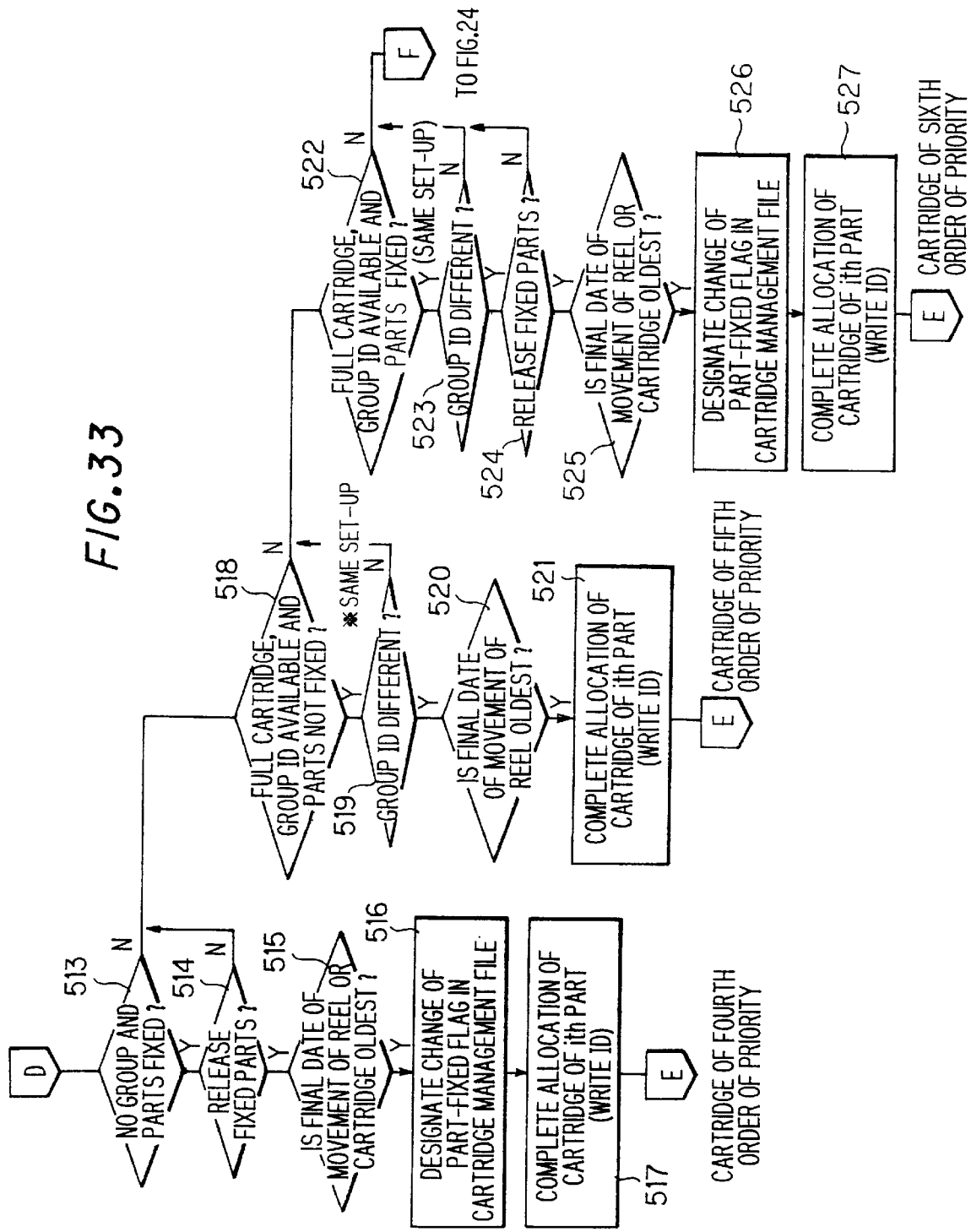
FIG. 33 is a second flowchart for searching cartridge.

FIGS. 32 and 33 are detailed processing flowcharts of cartridge allocation included in step 317, which is the processing for creating the set-up instruction manual. When cartridges are allocated, the following is carried out:

(1) A cartridge that is empty, has not yet been allocated (no group ID) and has a part-fixed flag of "0" is selected at a first priority.
(2) A cartridge that is empty, has no group ID and has a part-fixed flag of "1" is selected at a second priority.
(3) A cartridge that is not empty (a full cartridge), has no group ID and has a part-fixed flag of "0" is selected at a third priority.
(4) A cartridge that is a full cartridge, has no group ID and has a part-fixed flag of "1" is selected at a fourth priority.
(5) A cartridge that is a full cartridge, has a group ID and has a part-fixed flag of "0" is selected at a fifth priority.

(6) A cartridge that is a full cartridge, has a group ID and has a part-fixed flag of "1" is selected at a sixth priority.

If a cartridge is selected in the order of priority set forth above, the set-up operations can be reduced. That is, reel removal operations can be reduced and so can operations for canceling the part-fixed flag.

First, an ith (where the initial value of i is 1) SMD part (SMD diagram number) is selected (step 501) and a conforming cartridge type is selected from the SMD list file 107 classified by unit diagram number (step 502).

Next, all relevant cartridges are listed up while referring to the cartridge management file 104 (see FIG. 15) (step 503). However, a cartridge for which the use-forbidden flag is "1" is excluded.

It is then determined whether a cartridge having the first order of priority is available (step 504). If the answer is "YES", then the cartridge is allocated, the group ID is written and processing for allocating the cartridge of the ith part is terminated (step 505). Thereafter, the next part for which cartridge allocation is required is selected (step 506) and processing from step 502 onward is repeated.

If it is found at step 504 that a cartridge having the first order of priority does not exist, then it is determined whether a cartridge having the second order of priority exists (step 507). If the answer is "YES", the SMD diagram number of a part whose loading in the cartridge has been decided is obtained and it is determined whether this SMD diagram number matches the SMD diagram number of the ith part requiring cartridge allocation (step 508). If the two match, then this cartridge is allocated, the group ID is written and processing for allocating the cartridge of the ith part is terminated (step 509). Thereafter, the next part for which cartridge allocation is required is selected (step 506) and processing from step 502 onward is repeated.

If it is found at step 507 that a cartridge having the second order of priority does not exist, or if the SMD diagram number is found to be different at step 508, then it is determined whether a cartridge having the third order of priority exists (step 510). If the answer is "YES", then the cartridge for which the final date of reel movement is oldest is found. That is, the cartridge for which the frequency of use is lowest is obtained, the parts reel is taken out of this cartridge and this cartridge is adopted as the target cartridge (step 511). The group ID is then written and processing for allocating the cartridge of the ith part is terminated (step 512). Thereafter, the next part for which cartridge allocation is required is selected (step 506) and processing from step 502 onward is repeated.

If it is found at step 510 that a cartridge having the third order of priority does not exist, then it is determined whether a cartridge having the fourth order of priority exists (step 513). If the answer is "YES", then reference is made to the SMT line set-up condition list file 112 (FIG. 21) to determine whether it is possible to release the fixed part (step 514). If this is possible, the cartridge for which the final date of movement of the reel or cartridge is oldest is found. That is, the cartridge for which the frequency of use is lowest is obtained (step 515) and the part-fixed flag in the cartridge management file 104 is made "0" (step 516). The group ID is then written and processing for allocating the cartridge of the ith part is terminated (step 517). Thereafter, the next part for which cartridge allocation is required is selected (step 506) and processing from step 502 onward is repeated.

If it is found at step 513 that a cartridge having the fourth order of priority does not exist, or if it is found at step 514 that release of the fixed part is forbidden, then it is determined whether a cartridge having the fifth order of priority exists (step 518). If the answer is "YES", it is determined whether the group ID is different (step 519). If the group ID is different, this means that this cartridge overlaps another and will not be used when grouped printed circuit boards are manufactured. Accordingly, if the group ID is different, the cartridge for which the final date of movement of the reel is oldest is obtained (step 520). Next, the group ID is written, processing for cartridge allocation of the ith part is terminated (step 521), the next part for which cartridge allocation is required is selected (step 506) and processing from step 502 onward is repeated.

If it is found at step 518 that a cartridge having the fifth order of priority does not exist, or if it is found at step 519 that the group IDs are the same, then it is determined whether a cartridge having the sixth order of priority exists (step 522). If the answer is "YES", then reference is made to the SMT line set-up condition list file 112 (FIG. 21) to determine whether it is possible to release the fixed part (step 524). If this is possible, the cartridge for which the final date of movement of the cartridge is oldest is found (step 525). Next, the part-fixed flag in the cartridge management file 104 is made "0" (step 526). The group ID is then written and processing for allocating the cartridge of the ith part is terminated (step 527). Thereafter, the next part for which cartridge allocation is required is selected (step 506) and processing from step 502 onward is repeated.

However, if it is found at step 522 that a cartridge having the sixth order of priority does not exist, or if it is found at step 523 that the group IDs match, or if it is found at step 524 that released of a fixed part is forbidden, then processing is executed from step 319 (FIG. 25) onward.

(E) Processing for creating NC data

Figure 34:
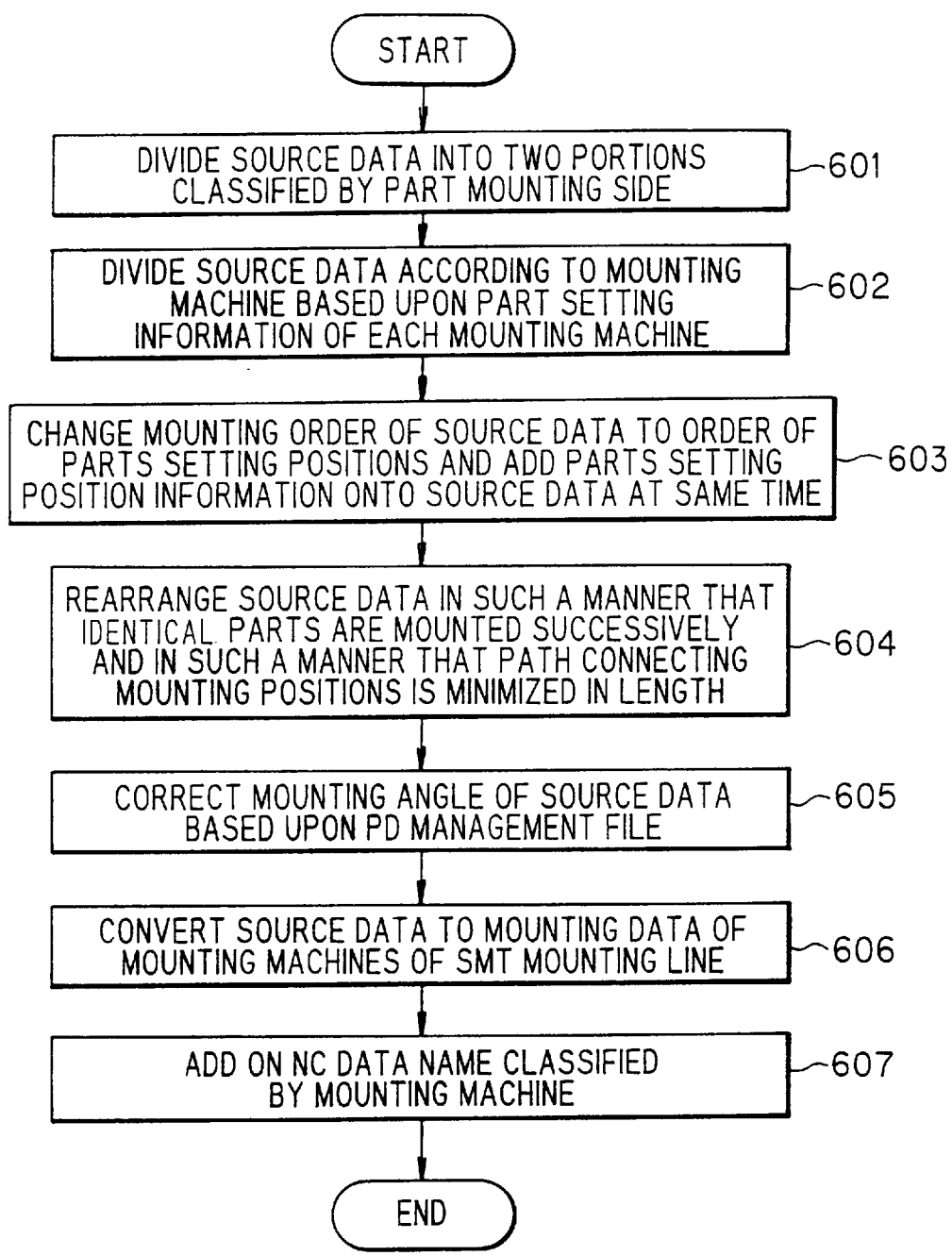
FIG. 34 is a flowchart of processing for creating mounting data.

FIG. 34 is a flowchart of processing for creating NC data (mounting data).

Source data obtained by extracting information relating to mounting of all SMDs from the CAD data are divided into portions, one for each side on which parts are mounted (step 601).

The source data are partitioned by mounting machine based upon the parts setting information, which is classified by mounting machine, in the set-up instruction manual (see FIG. 28) already created (step 602).

The source data of all parts are rearranged in order starting from the first channel based upon the part setting positions (parts mounting channels) already decided. That is, the source data of all parts are arranged in the order of mounting and, at the same time, part position information (X,Y,θ) indicating of position on the printed circuit boards is added onto the source data (step 603).

Next, the source data are rearranged in such a manner that identical parts to be mounted at a number of locations will be mounted consecutively, and such that the path connecting the positions at which the parts are mounted will be the shortest path.

Thereafter, the angle correction value in the angle correction field of the part data management file 103 is added to the mounting angle θ of each item of source data and the result is adopted as the corrected mounting angle (step 605). In case of an angle greater than 360°, however, the value obtained by subtracting 360° is adopted.

After mounting angle is corrected, all source data are converted to NC data for the mounting machines on the SMT line. At this time information necessary for the mounting machines, such as board size information, is added on (step 606).

Finally, NC data names classified by mounting machine are added on (step 607). Usually the result of adding the code of a mounting machine onto the end of the unit diagram number is used as the NC data name.

(F) Actual operation

Before printed circuit boards are actually manufactured on the assembly line, a preparatory operation is required in which parts reels, cartridges and cartridges with reels necessary for manufacturing all printed circuit boards of the group are prepared and parts reels and cartridges are loaded and unloaded as necessary. When the preparation operation is concluded, a set-up operation is carried out based upon the SMT line set-up instruction manual (FIG. 27) and set-up instruction manual (FIG. 28) classified by mounting machine.

(a) Preparatory operation (a-1) Warehousing of parts reels in reel stocker

Parts reels are placed in inventory in the reel stocker through the following procedure:

(1) Reel stocker warehousing is selected using a personal computer. Reel stockers are of two types, namely for reels of diameters 178 mm and 330 mm. Reel diameter is judged based upon cartridge type.

(2) Reel ID is read by the bar code reader.

(3) An empty shelf is found among the stockers by referring to the inventory parts management file 102, and the lamp at this location is lit. The stocker is decided by judging reel diameter based upon cartridge type.

(4) A parts reel is manually placed in inventory on the shelf designated by the lamp. The lamp is extinguished in response to entry of the fact that the storage of this parts reel is completed. The location (reel address) of the relevant SMD diagram number in the inventory parts management file 102 is changed to an address in the reel stocker.

(5). Steps (1)–(4) are repeated for all parts reels placed in inventory.

(a-2) Manual delivery from reel stocker

Manual delivery from a reel stocker is executed through the following procedure:

(1) A part desired to be delivered from inventory is designated. The designation of the part is performed by entering reel ID or part diagram number from a key board or by displaying the inventory parts list on the display screen and selecting the desired SMD diagram number. Delivery from inventory need not be performed one reel at a time; a plurality of reels can be delivered simultaneously.

(2) When a part is designated, the lamp of the shelf having the reel to which this part is attached is lit. In a case where a plurality of parts have been designated, a plurality of lamps are lit.

(3) The reel is extracted manually and the reel ID is read by the bar code reader.

(4) If the reel ID designated for delivery from inventory and the reel ID read by the bar code reader match, the lamp is extinguished. Further, the location (reel address) in the inventory parts management file 102 is changed to "free."

(5) If the reel ID designated for delivery from inventory and the reel ID read by the bar code reader do not match, an alarm is displayed, in response to which the operator searches for the correct file.

(a-3) Automatic delivery from reel stocker

Manual delivery from a reel stocker is executed through the following procedure:

(1) Automatic delivery from inventory is selected and the group ID is entered using a personal computer.

(2) As a response, the lamp of the shelf of the parts reel having the entered ID and which has not been loaded in a cartridge is lit.

(3) Next, the reel is extracted manually and the reel ID is read by the bar code reader.

(4) If the reel ID designated for delivery from inventory and the reel ID read by the bar code reader match, the lamp is extinguished. Further, the location (reel address) in the inventory parts management file 102 is changed to "free."

(a-4) Processing operation for uniting reels and cartridges

Processing for uniting reels and cartridges is executed through the following processing:

(1) The reel is mounted in the cartridge. However, parts other than those specified are not attached to a cartridge (whose part-fixed flag is "1") for which the parts to be fixed to the cartridge have been decided.

(2) Processing for uniting reel and cartridge is selected using a personal computer.

(3) The reel ID and cartridge ID are read by the bar code reader. As a result, the location (reel address) of the reel is changed to the cartridge ID (=cartridge address).

(a-5) Processing for separating reels and cartridges

Processing for separating reels and cartridges is executed through the following processing:

(1) Processing for separating reel and cartridge is selected using a personal computer.

(2) The reel ID and cartridge ID are read by the bar code reader. As a result, the location (reel address) of the reel is changed to the "free."

(3) The reel is taken out of the cartridge. Reels that have been removed are placed in inventory in the reel stocker to the greatest extent possible.

(a-6) Operation for re-registering expended reel

The re-registration of a reel whose remaining number of parts (the remaining number logically speaking) is zero and which has been expended automatically or manually is performed through the procedure set forth below. By way of example, in a case where parts actually remain in a parts reel for which the remaining number of parts is zero and which has been expended automatically, it is so arranged that the expended reel is registered again so that the parts can be utilized.

(1) The reel ID is read. The system responds to reading of the reel ID by judging that registration is to be performed again.

(2) The number of parts is entered and re-registration is completed.

(b) Set-up operation

A set-up operation is performed through the following procedure:

(1) The line set-up instruction manual (FIG. 27) and set-up instruction manual classified by mounting machine (FIG. 28) are printed out.

(2) The necessary reel parts are delivered from inventory automatically.

(3) Parts reels that have been delivered from inventory automatically are mounted in empty cartridges based upon the set-up instruction manual 121 classified according to mounting machine. If a cartridge that has been used in a preceding set-up operation is designated in this case, the parts reel is mounted after manufacture of printed circuit boards based upon the preceding set-up is concluded.

(4) Processing for uniting mounted reels and cartridges is carried out.

(5) Cartridges in which parts have been loaded are set at part setting positions (channel positions) of the cartridge table, these positions being specified by the set-up instruction manual 121 classified by mounting machine.

(6) When the setting of all cartridges is finished, processing for ending set-up is selected using a personal computer.

(7) The cartridge IDs of the cartridges that have been set on the cartridge table are read successively from the starting channel using the bar code reader. If cartridges have been set as specified by the set-up instruction manual 121, then the addresses (cartridge addresses) and reel locations (reel addresses) of the cartridges are changed to part setting positions (channel positions). If a cartridge that has not been set as specified by the set-up instruction manual 121 exists, an alarm is issued.

Conclusion of set-up not requiring cartridges, as in the case of tray parts, is judged to have occurred when the operator enters completion without cartridge IDs having been read.

(8) A change in equipment conditions of each piece of equipment and NC data substitution for each piece of equipment are carried out to complete set-up in accordance with the line set-up instruction manual (FIG. 27).

(c) Operation during mounting

If parts run out during the mounting of parts by a mounting machine, reel replacement processing is executed. At this time a new reel is found and loaded in a cartridge. However, since the remaining number of parts on the new reel will represent a major discrepancy from the former, a correction alarm for correction of the remaining number of parts is printed out.

The remaining number of parts is usually rewritten to the number of parts existing after completion, which is calculated by the following formula: (remaining number of parts before allocation)−[(number planned to be used)×(set-up premium rate)/100].

(d) Operation for performance control

In order to control manufacturing performance, set-up starting date and time and set-up completion date and time are inputted and entered into the corresponding fields of the order management file 108 (see FIG. 16).

(1) The time at which set-up was started is entered into the field "External Set-up Starting Date and Time" based upon the set-up instruction manual.

(2) If, all set-up operations have been finished, "External Set-up Completion Date and Time" is entered.

(3) If manufacture of a group based upon the preceding set-up is finished and set-up when the line is down is started, "Internal Set-up Starting Date and Time" is entered. Further, internal set-up completion date and time is entered when the internal set-up is finished.

(4) If mounting is started, "Mounting Starting Date and Time" is entered. When mounting is finished, "Mounting Completion Date and Time" is entered.

(5) Group ID (a plurality of group IDs is possible) is selected as necessary and performance control information, such as total "External Set-up Time", "Internal Set-up Time" and "Mounting Time", as well as the number of mounted parts, is totalized.

Thus, as set forth above, the operator performs grouping by manually selecting unit diagram numbers from the order management file 108 in such a manner that a predetermined number of printed circuit boards of a plurality of types can be manufactured by a single set-up. However, grouping can also be performed automatically by the method described in the specification of Japanese Patent Application Laid-Open No. 7-256532.

(G) Application of this invention in plurality of SMT lines

The foregoing describes a case in which printed circuit boards are manufactured by a single SMT line. However, the invention can readily be extended to cover a plurality of SMT lines.

(a) First application to a plurality of lines

Figure 35:
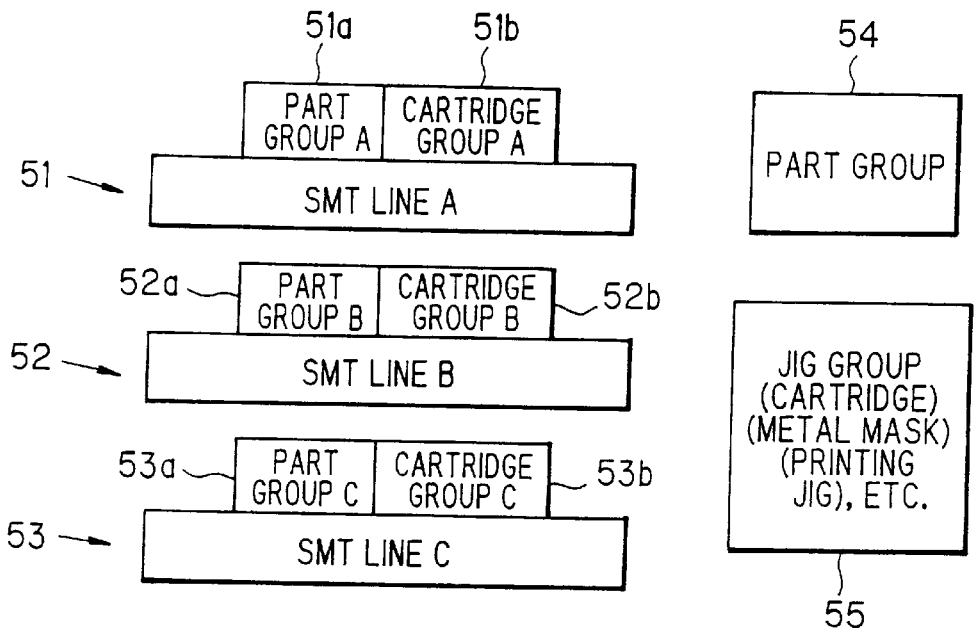
FIG. 35 shows an example of a first application of the invention to a plurality of lines.

FIG. 35 is a diagram for describing application of the invention in a case where three SMT lines are controlled simultaneously. Shown in FIG. 35 are a first SMT line (SMT line A) 51, a second SMT line (SMT line B) 52, a third SMT line (SMT line C) 53, a parts group 54 capable of being shared by each of the SMT lines, and a jig group (cartridges, metal masks, printing jigs, etc.) 55 capable of being shared by each of the SMT lines. It is necessary that required parts groups 51a, 52a, 53a and cartridge groups 51b, 52b, 53b be set on respective ones of the SMT lines.

The NC data (mounting data) can be created by a method similar to that used in the case of the single SMT line if the set-up instruction manuals have been decided, i.e., if allocation of the part setting positions, parts reels and cartridges has been decided. Accordingly, only the method of designating set-up is different from that used with the single SMD line. A method of designating set-up in a case where a plurality of SMT lines are controlled simultaneously will now be described.

(1) The SMT lines 51, 52 and 53 are registered with the system as an A line, a B line and a C line, respectively.

(2) The equipment arrangements and equipment conditions (the SMT line information file 111 of FIG. 20) of each SMT line are registered with regard to each line in the same manner as in the case of the single SMT line.

(3) The manufacturing groups of printed circuit boards manufactured by the respective SMT lines are distinguished from one another by making the first digit of the group ID A in the case of the A line, B in the case of the B line and C in the case of the C line.

(4) In a case where printed circuit boards of a new group are to be manufactured, which SMT line is to be used for manufacture is selected. It will be assumed here that the A line has been selected.

(5) The allocation of parts reels and cartridges at this time is carried out upon assigning orders of priority (described below) to the parts reels and cartridges.

Allocation of parts reels

Parts reels for which parts have not been allocated (parts whose locations of use have not been scheduled) on any on the lines A, B, C, and which have been placed in the cartridge stocker upon being mounted in the cartridges, are made parts reels of the first order of priority. The reason for adopting these parts reels as those of the first order of priority is that these can be prepared immediately because they do not require mounting in the cartridges and currently are not in use. Parts reels for which allocation has been completed (the first digit of the group ID is A in the inventory parts management file 102) for line A, and for which the group ID is a small number, are made parts reels of the second order of priority. However, the group ID is selected in the direction in which the number is increased in the order of grouping. The smaller the group number, the higher the possibility that manufacture is completed. Therefore, rather than parts reels of the preceding set-up, parts reels from the set-up preceding it are given preference in allocation.

Parts reels for which parts have not been allocated (parts whose locations of use have not been scheduled) on any on the lines A, B, C, and which have not been united with cartridges, are made parts reels of the third order of priority. These are allocated in order of increasing number of parts.

Thus, the necessary parts reels are allocated in accordance with the order of priority set forth above.

Cartridge allocation

In a case where parts reels having the third order of priority have been allocated, it is required that the cartridges in which these parts reels are loaded be allocated. Cartridge allocation is performed in accordance with the order of priority set forth below from among a group of cartridges of cartridge type obtained from the parts data PD of the parts.

Empty cartridges that have not been allocated for any of the lines A, B, C are adopted as cartridges of the first order of priority. From among cartridges which have reels but which have not been allocated for any of the lines A, B, C, those having old last dates of movement are adopted as cartridges of the second order of priority. From among cartridges allocated for line A, those having small group IDs are adopted as cartridges of the third order of priority.

If the parts reels and cartridges necessary for group manufacture are thus allocated, the SMT line set-up instruction manual (FIG. 27) and set-up instruction manual (FIG. 28) classified by mounting machine are created and printed out just as in the case of the single SMT line.

(b) Second application to a plurality of lines

If the makers that supply SMT lines differ, the jigs (cartridges, metal masks and printing jigs, etc.) used in each of the SMT lines will also differ. Consequently, it is necessary to select the jigs (cartridges, etc.) of the makers that supply the SMT lines.

Figure 36:
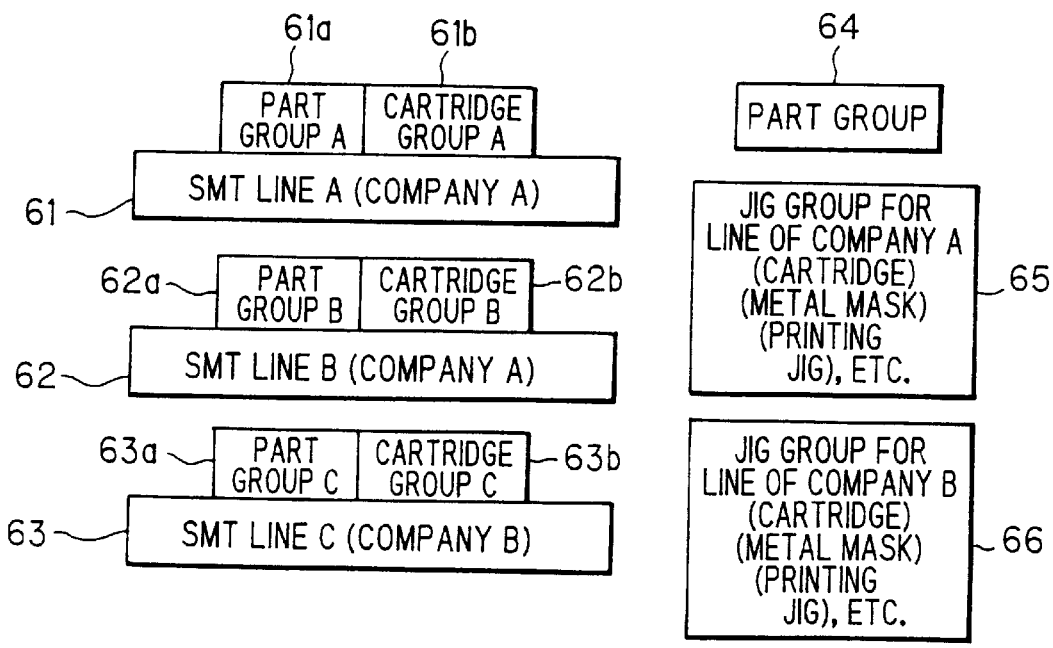
FIG. 36 shows an example of a second application of the invention to a plurality of lines.
Figure 37:
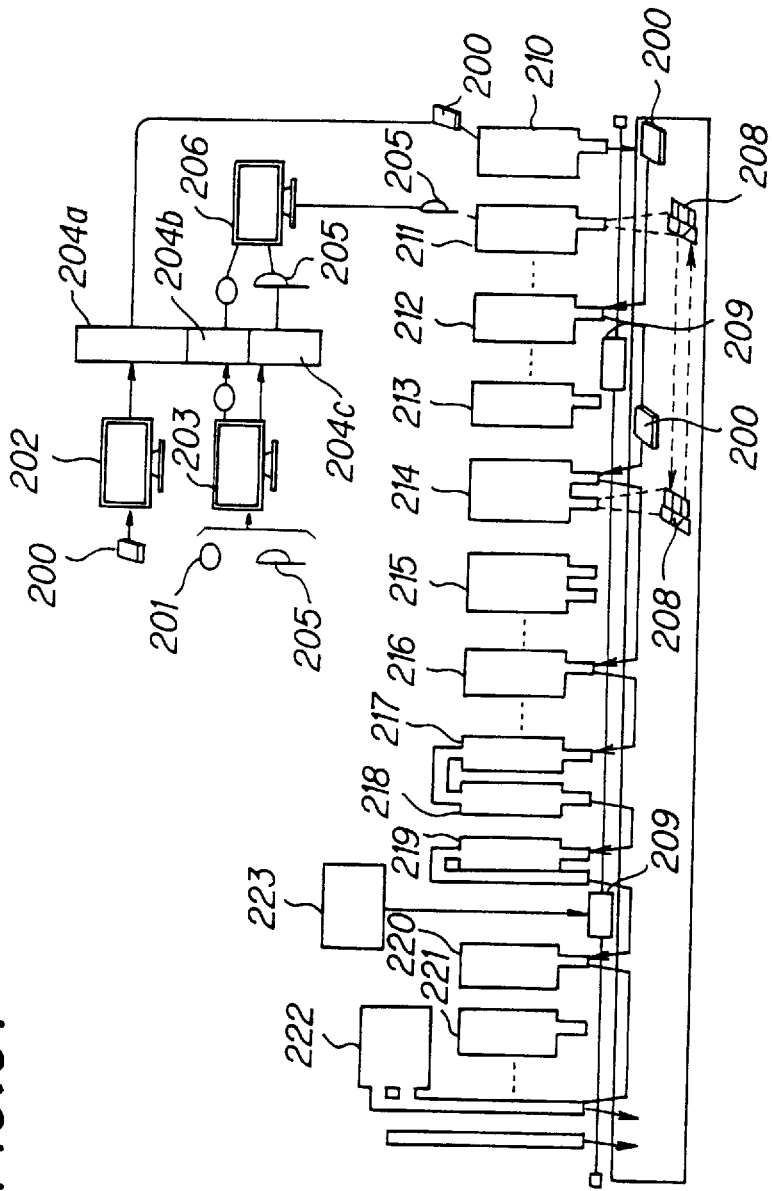
FIG. 37 is a diagram for describing the general features of an example of an assembly line.

FIG. 36 is a diagram for describing application of the invention in a case where three SMT lines are controlled simultaneously, wherein the makers that supply the SMT Lines differ. Shown in FIG. 36 are a first SMT line (SMT line A) 61 of company A, a second SMT line (SMT line B) 62 of company A, a third SMT line (SMT line C) 63 of company B, a parts group 64 capable of being shared by each of the SMT lines, a jig group (cartridges, metal masks, printing jigs, etc.) 65 capable of being shared by the SMT lines of company A, and a jig group 66 capable of being shared by the SMT line of company B. It is necessary that required parts groups 61*a*, 62*a*, 63*a* and cartridge groups 61*b*, 62*b*, 63*b* be set on respective ones of the SMT lines.

The NC data (mounting data) can be created by a method similar to that used in the case of the single SMT line if the set-up instruction manuals have been decided, i.e., if allocation of the part setting positions, parts reels and cartridges has been decided. Accordingly, only the method of designating set-up is different from that used with the single SMD line. A method of designating set-up in a case where a plurality of SMT lines are controlled simultaneously will now be described.

(1) The SMT lines 61, 62 and 63 are registered with the system as an A line, a B line and a C line, respectively. Further, cartridges and printing jigs, etc., are registered in such a manner that they can be identified according to maker.

(2) The equipment arrangements and equipment conditions (the SMT line information file 111 of FIG. 20) of each SMT line are registered with regard to each line in the same manner as in the case of the single SMT line. In addition, maker names are registered line by line.

(3) The manufacturing groups of printed circuit boards manufactured by the respective SMT lines are distinguished from one another by making the first digit of the group ID A in the case of the A line, B in the case of the B line and C in the case of the C line.

(4) In a case where printed circuit boards of a new group are to be manufactured, which SMT line is to be used for manufacture is selected. It will be assumed here that the A line has been selected.

(5) Parts are allocated through a method similar to that used in the first example of application shown in FIG. 35.

(6) Next, cartridges are allocated through a method similar to that used in the first example of application shown in FIG. 35. However, cartridges are selected upon imposing a limitation to the effect that only cartridges manufactured by the maker (company A) of the A line are used.

Thus, in accordance with the present invention as set forth above, a set-up support unit creates a set-up instruction manual by referring to files that have been stored in a database, and a mounting data creating unit creates mounting data using part setting position addresses of mounting machines contained in set-up information and part mounting position coordinates contained in a source data management file. This makes it possible to create NC data and set-up information automatically, even with an SMT mounting line in which equipment specifications and arrangements differ, by putting various information relating to the SMT mounting line in the form of a database. Set-up can be performed efficiently and mounting data conforming to the set-up can be created. Furthermore, not only are NC data (mounting data) simply created and managed but the information required overall is put into the form of a database so that all operations can be designated. The operator need only makes the designations accurately and promptly while following the rules of line operation. The present invention is particularly effective when applied to small-lot, large-variety production and to a line on which many "initial products" such as prototypes are produced.

In accordance with the present invention, it is not only possible to create NC data automatically and to create set-up information fully automatically, but it is also possible to collectively manage manufacturing control assistance information such as number of mountings, set-up time and activity rate.

In accordance with the present invention, the time required for a single set-up can be shortened from the usual 1–2 hrs to 0.5 hrs.

In accordance with the present invention, NC data created fully automatically is subjected to performance management without error and in units of the number of versions of a unit diagram number. As a result, a unit having good performance need not undergo a first parts collation at the start of mounting and a check of the mounting of parts can be simplified, thus making it possible to improve manufacturing efficiency.

When batch manufacturing of printed circuit boards of a plurality of types has been designated by grouping, the present invention is such that the SMT set-up support unit creates a set-up instruction manual in such a manner that the specified plural types of printed circuit boards can be manufactured by a single set-up operation. A mounting data creating unit creates the mounting data using the part setting position addresses contained in the set-up information and part mounting position coordinates on each printed circuit board. By thus grouping the manufactured boards, the number of set-up operations is reduced and the activity rate of the SMT mounting line can be improved.

In accordance with the present invention, the set-up support unit creates a manual mounting instruction manual with regard to part categories for which manual mounting has been specified by the mounting machine demarcations. The instruction manual includes, for each part, the part mounting position coordinates on the printed circuit board, part mounting orientation and the side of the board on which the part is to be mounted. Accordingly, even if mounting is performed manually, the manual operation can be performed efficiently by referring to the manual mounting instruction manual.

In accordance with the present invention, the set-up support unit registers manufacturing performance, such as the number of parts mounted by each mounting machine, the number of manual mountings, the time required for set-up and the time required for mounting, in a manufacturing order file when printed circuit boards are manufactured, totalizes the recorded contents and outputs the manufacturing performance. As a result, production performance can be totalized automatically and the totalization data can be acquired with ease.

In accordance with the present invention, the SMT set-up support unit creates a set-up instruction manual, classified by mounting machine, which indicates the correspondence among part setting position addresses at the mounting machine, parts reel IDs of parts reels set at the part setting positions (channels) indicated by these addresses, and cartridge IDs. As a result, parts can be set on the mounting machines accurately and efficiently by referring to the set-up instruction manual.

In accordance with the present invention, a unit diagram number management file, which indicates unit diagram number, board manufacturing condition codes for each of the pieces of equipment and source data file names of the boards, is registered in the database beforehand for each printed circuit board, and the correspondence between manufacturing condition codes and detailed manufacturing conditions is entered, for each piece of manufacturing equipment, in an SMT line information file. The set-up support unit creates an SMT line set-up instruction manual, which specifies detailed manufacturing conditions of the printed circuit board at each piece of equipment, by referring to the unit diagram number management file and SMT line information file. As a result, manufacturing conditions at each piece of equipment can be set with ease by referring to the SMT line set-up instruction manual.

In accordance with the present invention, the SMT line set-up instruction manual is designed to include manufacturing condition codes of each piece of equipment in the preceding set-up and the manufacturing condition codes of each piece of equipment in the current set-up. As a result, the timing of manufacturing condition changeover of each piece of equipment can be recognized with ease and manufacturing conditions can be changed over without error.

The present invention is such that in a case where a plurality of mounting machines have been designated by the mounting machine demarcations, the set-up support unit distributes categories of parts, classified by mounting machine, in such a manner that the part setting channel numbers or mounting times of the mounting machines are uniformed. This makes it possible to raise the production efficiency of the SMT line.

The present invention is such that when the types of parts necessary for a single printed circuit board are so numerous that channels for mounting parts reels for all categories of parts are not available on a mounting machine, the unit diagram numbers are divided into two portions and a set-up instruction manual is created for each portion. This makes it possible to manufacture such circuit boards in reliable fashion.

In accordance with the present invention, the set-up support unit decides mounting order of parts reels by arranging parts reels in order of decreasing XY table speed, arranging parts reels in order of decreasing indexing speed in a case where XY table speeds are the same, and arranging parts reels in order starting from smaller nozzle diameters in a case where indexing speeds the same. As a result, changes in XY table speed and indexing table speed at the time of actual mounting of parts can be reduced, thus making it possible to shorten mounting time.

In accordance with the present invention, cartridge adjacency conditions, which indicate how many channels a second cartridge to be mounted is distant from a mounting channel of a first cartridge in which parts reels are loaded, are decided in advance by the combination of tape widths of parts reels loaded in the first and second cartridges. The set-up support unit obtains tape widths of parts reels from parts data in order of mounting and decides cartridge placement channels by referring to the tape widths and cartridge adjacency conditions. As a result, a set-up instruction manual can be created in such a manner that cartridges are set on mounting machines in a reliable manner.

The present invention is such that when parts reels in which parts of various categories distributed to mounting machines are allocated, the set-up support unit allocates parts reels, which have been loaded in cartridges, at a priority higher than that of parts reels that have not been loaded in cartridges. In a case where a plurality of these reels exist, those parts reels having a small number of remaining parts are allocated preferentially so that the total of the numbers of parts remaining in the allocated parts reels will exceed a required number of parts. As a result, operations for uniting parts reels with cartridges can be reduced and set-up time can be shortened. Moreover, it is possible to eliminate situations in which a large number of parts reels having small numbers of remaining parts are left.

The present invention is such that in a case where a set-up instruction manual for grouped printed circuit boards of a plurality of types is created, group IDs are incorporated in the set-up instruction manual and the group IDs are made to correspond to allocated parts reels. At the time of actual set-up based upon the set-up instruction manual, the set-up support unit, in response to entry of a group ID, uses a lamp to indicate the position of a reel stocker shelf accommodating the parts reel having this group ID. As a result, the location of the required parts reel can be recognized with ease and time for delivers of the parts reel from inventory can be shortened by a wide margin.

The present invention is such that in a case where a parts reel that has not be united with a cartridge is allocated, it is necessary to allocate a cartridge in which this parts reel is to be loaded. In such case the set-up support unit executes cartridge allocation processing by allocating an empty cartridge at a priority higher than that of a reel-united cartridge and allocating an cartridge in which parts reel is not fixed at a priority higher than that of a cartridge in which parts reel is fixed. As a result, operations for taking parts reels out of cartridges can be eliminated. Moreover, the number of times operations for releasing fixed parts can be reduced to shorten set-up time.

In accordance with the present invention, cartridges with reels are set in each channel of a mounting machine based upon instruction manuals classified by mounting machine, after which the cartridge IDs of the set cartridges are read so that it can be confirmed whether the cartridges have been set as specified by the set-up instruction manual. This makes it possible to perform the confirmation operation in simple fashion. In the prior art, a cartridge must be removed from a cartridge table and the parts reel ID must be read to verify whether it has been set in accordance with a set-up instruction manual. As a result, the verification operation is troublesome, a considerable amount of time is needed for verification and set-up time is prolonged.

The present invention is such that when there is a large discrepancy in the number of remaining parts in a predetermined parts reel, the remaining number of parts can be corrected in accordance with a correction command. This makes it possible update the remaining number of parts to a correct value.

In accordance with the present invention, a plurality of conditions including information indicating whether changeover of manufacturing conditions of each piece of equipment constituting the SMT line is allowed or forbidden, as well as the maximum number of manually mounted parts, are registered in the database beforehand as a set-up condition list file, prescribed set-up conditions are designated and grouping is performed so as to satisfy these set-up conditions. This makes it possible to clarify the grouping standard.

The present invention is such that in a case where a plurality of SMT lines are controlled simultaneously, the set-up support unit allocates parts reels of the group manufactured by a prescribed SMT line. Specifically, parts reels which have not been allocated for any of the SMT lines but which have been loaded in cartridges are allocated at a first order of priority, parts reels which have already been allocated for the SMT lines are allocated at a second order of priority, and parts reels which have not been allocated for any of the SMT lines and which have not been loaded in cartridges are allocated at a third order of priority. As a result, operations for loading parts reels in cartridges can be reduced. Moreover, it is possible to minimize situations in which it is necessary to wait for completion of manufacturing at the other lines where parts reels are being used. The result is shortening of set-up time.

The present invention is such that in a case where a plurality of SMT lines are controlled simultaneously and parts reels not yet loaded in cartridges have been allocated by parts reel allocation, the set-up support unit allocates empty cartridges, which have not been allocated for any of the lines, at a first order of priority, allocates cartridges with parts reels, which have not been allocated for any of the lines, at a second order of priority, and allocates cartridges having the smallest group ID, among cartridges allocated for the SMT lines, as a third order of priority. As a result, operations for taking parts reels out of cartridges can be reduced. Moreover, it is possible to minimize situations in which it is necessary to wait for completion of manufacturing at the other lines where cartridges are being used. The result is shortening of set-up time.

The present invention is such that when a plurality of SMT lines supplied by different makers are controlled simultaneously, the set-up support unit allocates cartridges of the makers that supplied the SMT lines at such time that cartridges are allocated for the purpose of receiving parts reels of the group manufactured by a prescribed SMT line. As a result, allocated cartridges can be mounted on the mounting machines of the SMT line in reliable fashion.

In accordance with the present invention, a unit for creating mounting data is so adapted that in a case where the order in which parts are mounted is made the channel order of parts reels to which parts have been attached and parts of the same category are mounted at a number of locations, creates mounting data for rearranging the order in which parts are mounted and for mounting the parts on printed circuit boards in the mounting order are created so as to minimize the length of the path connecting the mounting positions. This makes it possible to shorten mounting time.

Further, angle correction information for correcting part mounting orientation is incorporated in parts data. The unit for creating mounting data uses this angle correction information to correct part orientation θ, which is included in part mounting position coordinates, and creates the mounting data accordingly. As a result, parts can be mounted on printed circuit boards accurately.

As many apparently widely different embodiments of the present invention can be made without departing from the spirit and scope thereof, it is to be understood that the invention is not limited to the specific embodiments thereof except as defined in the appended claims.

What is claimed is:

1. A manufacturing management system for controlling an SMT line to manufacture printed circuit boards the manufacture of which has been designated, said system comprising:

an SMT line composed of a group of SMT manufacturing equipment including a screen printer, an automatic mounting machine for automatically mounting parts on printed circuit boards and a reflow oven;

a reel stocker for storing parts reels;

a cartridge stocker for storing cartridges;

a database for storing a source data management file created by CAD data for a printed circuit board, an inventory parts management file, a cartridge management file and an SMT line information file which includes manufacturing conditions of the SMT manufacturing equipment and equipment arrangement;

an SMT set-up support unit for creating a set-up instruction manual, which specifies set-up for manufacturing printed circuit boards on the SMT line, by referring to the SMT line information file that has been stored in said database; and a mounting data creating unit for creating mounting data, which are for allowing the mounting machine to mount parts on printed circuit boards, using part setting position addresses at the mounting machine contained in said set-up instruction manual and part mounting position coordinates contained in the source data management file.

2. The system according to claim 1, wherein when batch manufacturing of printed circuit boards of a plurality of types has been designated by grouping, said SMT set-up support unit creates a set-up instruction manual in such a manner that the specified plural types of printed circuit boards can be manufactured by a single set-up operation, and said mounting data creating unit creates the mounting data using the part setting position addresses contained in the set-up information and the part mounting position coordinates on each printed circuit board.

3. The system according to claim 1, wherein said SMT set-up support unit creates the set-up instruction manual, classified by mounting machine, which indicates correspondence among said part setting position addresses at the mounting machine, parts reel IDs of parts reels and cartridge IDs of cartridges, the parts reels and cartridges being set at the part setting positions (channels) indicated by these addresses.

4. The system according to claim 3, wherein, for every printed circuit board, a unit diagram number management file, which indicates unit diagram number, manufacturing condition codes of said printed circuit board at each piece of manufacturing equipment and source data management file name of said printed circuit board, is registered in said database beforehand, and correspondence between the manufacturing condition codes and detailed manufacturing conditions is entered, for each piece of manufacturing equipment, in said SMT line information file; and said SMT set-up support unit creates the SMT line set-up instruction manual, which specifies detailed manufacturing conditions of a printed circuit board, designated for manufacture, at each piece of manufacturing equipment, by referring to the unit diagram number management file and SMT line information file.

5. The system according to claim 4, wherein the SMT line set-up instruction manual is adapted to include manufacturing condition codes of each piece of manufacturing equipment in a preceding set-up and manufacturing condition codes of each piece of manufacturing equipment in a current set-up.

6. The system according to claim 3, wherein parts data are registered in said database for every part diagram number, said parts data including mounting machine demarcations indicating which mounting machines are to mount parts, a number of channels occupied by parts reels at a mounting machine, cartridge-type information specifying the type of cartridge on which a parts reel is mounted and tape width of the parts reel, and sorting information used when deciding the order in which the parts reels are deployed at a mounting machine; and said set-up support unit:

obtains part diagram numbers of parts necessary for manufacturing a printed circuit board whose manufacture has been designated, as well as the number of parts required, by referring to the source data management file;

distributes the parts according to mounting machine by referring to the mounting machine demarcations in the parts data;

checks to see whether a mounting machine has the channels necessary for the setting of parts reels of all distributed parts, this being performed by taking into account the total number of channels, of the mounting machine, specified by the equipment arrangement contained in the SMT line information file as well as the number of channels occupied by each part distributed to the mounting machine, and checks to determine whether there are more parts than necessary in regard to each part by referring to the inventory parts management file;

allocates parts reels on which the parts have been mounted if the mounting machine has the channels necessary for setting the parts reels of all distributed parts and the number of parts is greater than that necessary in regard to each part;

decides the order of placement of the parts reels mounted on the mounting machine by referring to the sorting information of each part included in the parts data;

then decides the placement positions (channels) of the cartridges in which the parts reels are loaded in the order of mounting; and creates the set-up instruction manual, classified by mounting machine, that includes placement position information regarding the cartridges, part diagram numbers, reel IDs and cartridge IDs.

7. The system according to claim 6, wherein in a case where a plurality of mounting machines are designated by the mounting machine demarcations, said set-up support unit distributes various types of parts, classified by mounting machine, so as to uniform numbers of part setting channels or mounting times at each of the mounting machines.

8. The system according to claim 6, wherein in a case where a mounting machine does not have channels necessary for setting parts reels of all necessary parts, said set-up support unit outputs an alarm to the effect that the number of channels has been exceeded and, in a case where parts are insufficient, outputs a list of the insufficient parts.

9. The system according to claim 8, wherein in a case where types of parts necessary for a single printed circuit board are so numerous that channels for mounting parts reels for all parts are not available on a mounting machine, unit diagram numbers for the printed circuit board are divided into two portions and a set-up instruction manual is created for each portion.

10. The system according to claim 6, wherein the sorting information is XY table speed, indexing speed and nozzle diameter each prevailing when the parts are mounted by the mounting machine, and said set-up support unit decides the cartridge placement positions by arranging parts reels in order of decreasing XY table speed, arranging parts reels in order of decreasing indexing speed in a case where XY table speeds are the same, and arranging parts reels in order starting from smaller nozzle diameters in a case where indexing speeds the same.

11. The system according to claim 6, wherein cartridge adjacency conditions, which indicate how many channels a second cartridge to be mounted is distant from a mounting channel of a first cartridge in which a parts reel has been loaded, are decided in advance by a combination of tape widths of parts reels that will be loaded in the first and second cartridges; and said set-up support unit obtains tape widths of the parts reels from the parts data in order of placement and decides cartridge placement channel by referring to the tape widths and cartridge adjacency conditions.

12. The system according to claim 6, wherein when parts reels in which the parts that have been distributed to mounting machines are loaded, are allocated, said set-up support unit allocates parts reels, which have been loaded in cartridges, at a priority higher than that of parts reels that have not been loaded in cartridges and, in a case where a plurality of these parts reels exist, preferentially allocates those parts reels having a small number of remaining parts and arranges it so that the total of the numbers of parts remaining in the allocated parts reels will exceed the required number of parts.

13. The system according to claim 12, wherein in a case where a set-up instruction manual, classified by mounting machine, for grouped printed circuit boards of a plurality of types is created, group IDs are incorporated in said set-up instruction manual and the group IDs are made to correspond to the allocated parts reels in advance; and at the time of actual set-up based upon the set-up instruction manual, said set-up support unit, in response to entry of a group ID, displays the position of a reel stocker shelf accommodating the parts reel having this group ID.

14. The system according to claim 12, wherein in a case where a parts reel that has not be united with a cartridge is allocated, said set-up support unit executes cartridge allocation processing for uniting said parts reels with cartridges.

15. The system according to claim 14, wherein the cartridge management file has, for every cartridge, a reel ID of a parts reel which is united with the cartridge and a part-fixed flag which indicates a parts reel to be united with the cartridge has been fixed; and said set-up support unit executes the cartridge allocation processing by allocating an empty cartridge at a priority higher than that of a reel-united cartridge and allocating an cartridge in which parts reel is not fixed at a priority higher than that of a cartridge in which parts reel is fixed.

16. The system according to claim 6, wherein said set-up support unit creates a manual loading instruction manual with regard to part types for which manual mounting has been designated by the mounting machine demarcations, said manual mounting instruction manual including, for each part, the part diagram number, part symbol, part mounting position coordinates on the printed circuit board, part mounting orientation and the side of the board on which the part is to be mounted.

17. The system according to claim 6, wherein after cartridges in which parts reels have been loaded are set in each of the channels of a mounting machine based upon the set-up instruction manual classified by mounting machine, cartridge IDs of the set cartridges are read and it is verified whether the cartridges have been set as specified by the set-up instruction manual.

18. The system according to claim 6, wherein in a case where a plurality of SMT lines are controlled simultaneously, said set-up support unit:

decides group IDs in such a manner that the SMT lines can be identified and increases numerical values, which are included in the group IDs, in an order in which the group IDs are generated;

allocates part reels of the group manufactured by a prescribed SMT line, this being performed by allocating, at a first order of priority, parts reels which have not been allocated for any of the SMT lines but which have been loaded in cartridges, allocating, at a second order of priority, parts reels which have already been allocated for said prescribed SMT line, and allocating, at a third order of priority, parts reels which have not been allocated for any of the SMT lines and which have not been loaded in cartridges; and in a case where parts reels not yet loaded in cartridges have been allocated by parts reel allocation, allocates cartridges, this being performed by allocating, at a first order of priority, empty cartridges which have not been allocated for any of the SMT lines, allocating, at a second order of priority, cartridges, with parts reels, which have not been allocated for any of the SMT lines, and allocating, at a third order of priority, cartridges having the smallest group ID among cartridges allocated for said prescribed SMT lines.

19. The system according to claim 6, wherein in a case where a plurality of SMT lines supplied by different makers are controlled simultaneously, said set-up support unit:

decides group IDs in such a manner that the SMT lines can be identified, increases numerical values, which are included in the group IDs, in an order in which the group IDs are generated, and arranges it so that the maker of a cartridge can be identified;

allocates part reels of the group manufactured by a prescribed SMT line of a certain maker, this being performed by allocating, at a first order of priority, parts reels which have not been allocated for any of the SMT lines but which have been loaded in cartridges of the prescribed SMT line, allocating, at a second order of priority, parts reels which have already been allocated for said prescribed SMT line, and allocating, at a third order of priority, parts reels which have not been allocated for any of the SMT lines and which have not been loaded in cartridges;

in a case where parts reels not yet loaded in cartridges have been allocated by parts reel allocation, allocates cartridges manufactured by the makers that supplied the SMT lines, this being performed by (1) allocating, at a first order of priority, empty cartridges which have not been allocated for any of the SMT lines, (2) allocating, at a second order of priority, cartridges, with parts reels, which have not been allocated for any of the SMT lines, and (3) allocating, at a third order of priority, cartridges having the smallest group ID among cartridges allocated for said prescribed SMT lines.

20. The system according to claim 19, wherein the parts data has angle correction information for correcting part mounting orientation; and said mounting data creating unit uses this angle correction information to correct part orientation, which is included in part mounting position coordinates, and creates the mounting data accordingly.

21. The system according to claim 6, wherein in a case where the order in which parts are mounted is made the channel order of parts reels to which parts have been loaded and same parts are mounted at a number of locations, said mounting data creating unit creates mounting data for rearranging the order in which parts are mounted and for mounting the parts on printed circuit boards in the mounting order so as to minimize the length of a path connecting the mounting positions.

22. The system according to claim 1, wherein the inventory parts management file includes, for every part, reel ID of a parts reel in which the part is loaded and a number of parts that remain in the parts reel; and when a discrepancy develops between a remaining number of parts of a predetermined parts reel and an actual number of remaining parts, the number of parts remaining is corrected in accordance with a correction indication.

23. The system according to claim 1, wherein a plurality of set-up conditions including information indicating whether changeover of manufacturing conditions of each piece of equipment constituting the SMT line is allowed or forbidden, as well as the maximum number of manually mounted parts, are registered in said database beforehand as a set-up condition list file; and prescribed set-up conditions are designated and grouping is performed so as to satisfy these set-up conditions.

24. The system according to claim 1, wherein a manufacturing order file which specifies number of printed circuit boards to be manufactured as well as date of delivery thereof is registered in said database in advance, manufacturing performance, including the number of parts mounted by each mounting machine, the number of manual mountings, the time required for set-up and the time required for mounting, is recorded in the manufacturing order file when the printed circuit boards are manufactured, contents registered are totalized and manufacturing performance is outputted.

25. The system according to claim 24, wherein the time required for set-up is divided into external set-up time needed for set-up without shutting down the SMT line, and internal set-up time needed for set-up with the SMT line being shut down, the external and internal set-up times are recorded in the manufacturing order file and are totalized.

* * * * *